(12) United States Patent
Dokania et al.

(10) Patent No.: US 11,696,450 B1
(45) Date of Patent: *Jul. 4, 2023

(54) COMMON MODE COMPENSATION FOR MULTI-ELEMENT NON-LINEAR POLAR MATERIAL BASED GAIN MEMORY BIT-CELL

(71) Applicant: Kepler Computing Inc., San Francisco, CA (US)

(72) Inventors: Rajeev Kumar Dokania, Beaverton, OR (US); Noriyuki Sato, Hillsboro, OR (US); Tanay Gosavi, Portland, OR (US); Amrita Mathuriya, Portland, OR (US); Sasikanth Manipatruni, Portland, OR (US)

(73) Assignee: Kepler Computing Inc., San Francisco, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/516,577

(22) Filed: Nov. 1, 2021

Related U.S. Application Data

(63) Continuation of application No. 17/516,293, filed on Nov. 1, 2021.

(51) Int. Cl.
| | |
|---|---|
| G11C 16/04 | (2006.01) |
| H10B 53/20 | (2023.01) |
| G11C 11/22 | (2006.01) |
| H01L 49/02 | (2006.01) |
| H01L 21/02 | (2006.01) |
| G11C 11/404 | (2006.01) |
| H10B 12/00 | (2023.01) |

(52) U.S. Cl.
CPC ............ *H10B 53/20* (2023.02); *G11C 11/221* (2013.01); *G11C 11/2255* (2013.01); *G11C 11/2257* (2013.01); *G11C 11/4045* (2013.01); *H01L 21/02197* (2013.01); *H01L 28/56* (2013.01); *H10B 12/056* (2023.02); *H10B 12/36* (2023.02)

(58) Field of Classification Search
CPC ............ G11C 11/2255; G11C 11/2257; G11C 11/4045
See application file for complete search history.

(56) References Cited

U.S. PATENT DOCUMENTS

| | | | |
|---|---|---|---|
| 4,809,225 A | 2/1989 | Dimmler et al. | |
| 4,853,893 A | 8/1989 | Eaton, Jr. et al. | |
| 5,086,412 A | 2/1992 | Jaffe et al. | |
| 5,218,566 A | 6/1993 | Papaliolios | |

(Continued)

FOREIGN PATENT DOCUMENTS

| | | |
|---|---|---|
| EP | 0798736 A2 | 10/1997 |
| JP | 2006164321 A | 6/2006 |
| JP | 3959341 B2 | 8/2007 |

OTHER PUBLICATIONS

U.S. Appl. No. 17/516,293, filed Jan. 2021, Dokania et al.*

(Continued)

*Primary Examiner* — Pho M Luu
(74) *Attorney, Agent, or Firm* — Mughal Gaudry & Franklin PC

(57) ABSTRACT

To compensate switching of a dielectric component of a non-linear polar material based capacitor, an explicit dielectric capacitor is added to a memory bit-cell and controlled by a signal opposite to the signal driven on a plate-line.

20 Claims, 25 Drawing Sheets

(56) References Cited

U.S. PATENT DOCUMENTS

| | | |
|---|---|---|
| 5,270,967 A | 12/1993 | Moazzami et al. |
| 5,381,364 A | 1/1995 | Chern et al. |
| 5,383,150 A * | 1/1995 | Nakamura ............... G11C 11/22 365/226 |
| 5,539,279 A | 7/1996 | Takeuchi et al. |
| 5,541,872 A | 7/1996 | Lowrey et al. |
| 5,638,318 A | 6/1997 | Seyyedy |
| 5,640,030 A | 6/1997 | Kenney |
| 5,917,746 A | 6/1999 | Seyyedy |
| 5,926,413 A | 7/1999 | Yamada et al. |
| 5,969,380 A | 10/1999 | Seyyedy |
| 6,002,608 A | 12/1999 | Tanabe |
| 6,028,784 A | 2/2000 | Mori et al. |
| 6,031,754 A | 2/2000 | Derbenwick et al. |
| 6,147,895 A | 11/2000 | Kamp |
| 6,483,737 B2 | 11/2002 | Takeuchi et al. |
| 6,515,957 B1 | 2/2003 | Newns et al. |
| 6,538,914 B1 | 3/2003 | Chung |
| 6,590,245 B2 | 7/2003 | Ashikaga |
| 6,646,906 B2 | 11/2003 | Sailing |
| 6,795,331 B2 | 9/2004 | Noro |
| 6,798,686 B2 | 9/2004 | Takashima |
| 6,809,949 B2 | 10/2004 | Ho |
| 6,819,584 B2 | 11/2004 | Noh |
| 6,838,718 B2 * | 1/2005 | Nakamura ........ H01L 27/11502 257/305 |
| 6,856,534 B2 | 2/2005 | Rodriguez et al. |
| 6,906,944 B2 | 6/2005 | Takeuchi et al. |
| 6,924,997 B2 | 8/2005 | Chen et al. |
| 7,405,959 B2 | 7/2008 | Koide et al. |
| 7,791,922 B2 | 9/2010 | Doumae et al. |
| 8,129,200 B2 | 3/2012 | Kang |
| 8,300,446 B2 | 10/2012 | Qidwai |
| 8,508,974 B2 | 8/2013 | Clinton et al. |
| 8,717,800 B2 | 5/2014 | Clinton et al. |
| 8,865,628 B2 | 10/2014 | Manabe et al. |
| 9,472,560 B2 | 10/2016 | Ramaswamy et al. |
| 9,812,204 B1 | 11/2017 | Yan et al. |
| 9,818,468 B2 | 11/2017 | Müller |
| 9,830,969 B2 | 11/2017 | Slesazeck et al. |
| 10,043,567 B2 | 8/2018 | Slesazeck et al. |
| 10,354,712 B2 | 7/2019 | Derner et al. |
| 10,600,808 B2 | 3/2020 | Schroder |
| 10,872,905 B2 | 12/2020 | Müller |
| 10,963,776 B2 | 3/2021 | Mulaosmanovic et al. |
| 11,482,270 B1 | 10/2022 | Dokania et al. |
| 11,545,204 B1 * | 1/2023 | Dokania ............... G11C 11/417 |
| 2002/0079520 A1 | 6/2002 | Nishihara et al. |
| 2003/0112650 A1 | 6/2003 | Kang |
| 2003/0141528 A1 | 7/2003 | Ito |
| 2004/0027873 A1 | 2/2004 | Nishihara |
| 2004/0233696 A1 | 11/2004 | Kang |
| 2004/0245547 A1 | 12/2004 | Stipe |
| 2006/0002170 A1 | 1/2006 | Kumura et al. |
| 2008/0101107 A1 | 5/2008 | Shiga et al. |
| 2012/0127776 A1 | 5/2012 | Kawashima |
| 2012/0307545 A1 | 12/2012 | McAdams et al. |
| 2017/0277459 A1 | 9/2017 | Rodriguez et al. |
| 2017/0345831 A1 | 11/2017 | Chavan et al. |
| 2020/0051607 A1 | 2/2020 | Pan et al. |
| 2020/0273867 A1 | 8/2020 | Manipatruni et al. |
| 2021/0090662 A1 | 3/2021 | Mennenga et al. |
| 2021/0111179 A1 | 4/2021 | Shivaraman et al. |
| 2021/0398580 A1 | 12/2021 | Yuh |

OTHER PUBLICATIONS

Non-Final Office Action dated Mar. 7, 2022 for U.S. Appl. No. 17/339,850.
Non-Final Office Action dated Mar. 30, 2022 for U.S. Appl. No. 17/346,083.
Non-Final Office Action dated Mar. 31, 2022 for U.S. Appl. No. 17/346,087.
Notice of Allowance dated Apr. 20, 2022 for U.S. Appl. No. 17/359,311.
Advisory Action dated Jul. 25, 2022 for U.S. Appl. No. 17/339,850.
Final Office Action dated Aug. 15, 2022 for U.S. Appl. No. 17/346,083.
Final Office Action dated Sep. 12, 2022 for U.S. Appl. No. 17/367,217.
Non-Final Office Action dated Aug. 16, 2022 for U.S. Appl. No. 17/367,217.
Non-Final Office Action dated Jun. 15, 2022 for U.S. Appl. No. 17/367,101.
Non-Final Office Action dated Nov. 4, 2022 for U.S. Appl. No. 17/530,362.
Non-Final Office Action dated Sep. 1, 2022 for U.S. Appl. No. 17/339,850.
Notice of Allowance dated Aug. 17, 2022 for U.S. Appl. No. 17/346,087.
Notice of Allowance dated Aug. 22, 2022 for U.S. Appl. No. 7/390,791.
Notice of Allowance dated Aug. 31, 2022 for U.S. Appl. No. 17/359,325.
Notice of Allowance dated Jun. 15, 2022 for U.S. Appl. No. 17/367,083.
Notice of Allowance dated Jun. 23, 2022 for U.S. Appl. No. 17/367,172.
Notice of Allowance dated Jun. 23, 2022 for U.S. Appl. No. 17/367,210.
Notice of Allowance dated Oct. 31, 2022 for U.S. Appl. No. 17/390,796.
Notice of Allowance dated Sep. 23, 2022 for U.S. Appl. No. 17/339,850.
Notice of Allowance dated Sep. 26, 2022 for U.S. Appl. No. 17/367,217.
Notice of Allowance dated Sep. 27, 2022 for U.S. Appl. No. 17/346,083.
Restriction Requirement dated Aug. 5, 2022 for U.S. Appl. No. 17/359,325.
Restriction Requirement dated Aug. 26, 2022 for U.S. Appl. No. 17/390,796.
Notice of Allowance notified Apr. 26, 2023 for U.S. Appl. No. 17/517,345.
Notice of Allowance notified May 16, 2023 for U.S. Appl. No. 17/517,298.
Notice of Allowance notified May 16, 2023 for U.S. Appl. No. 17/517,349.

* cited by examiner

Multi-element FE gain bit-cell

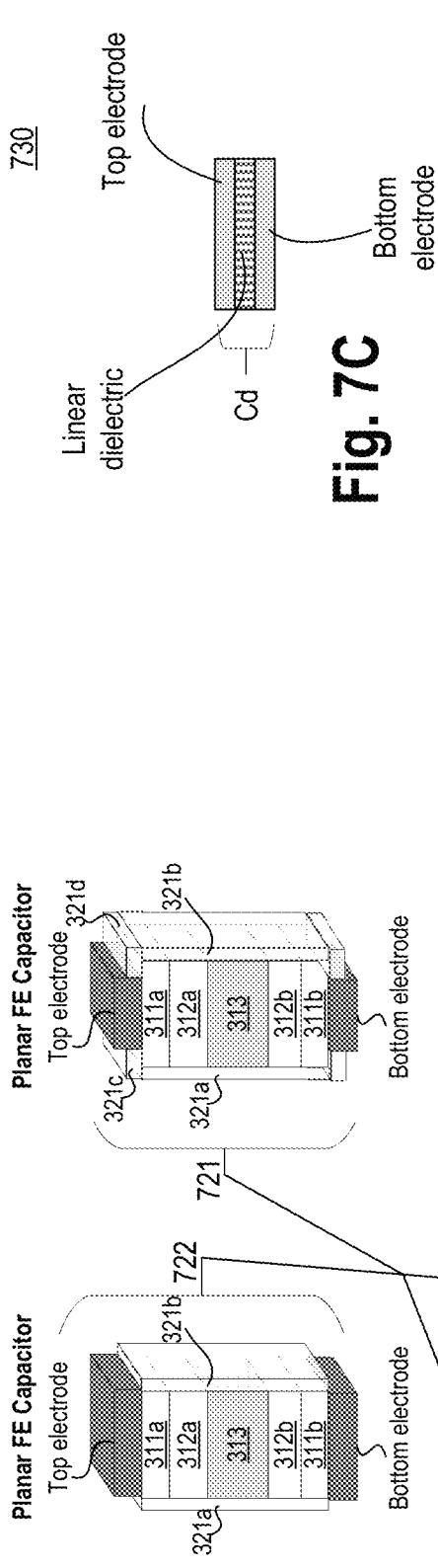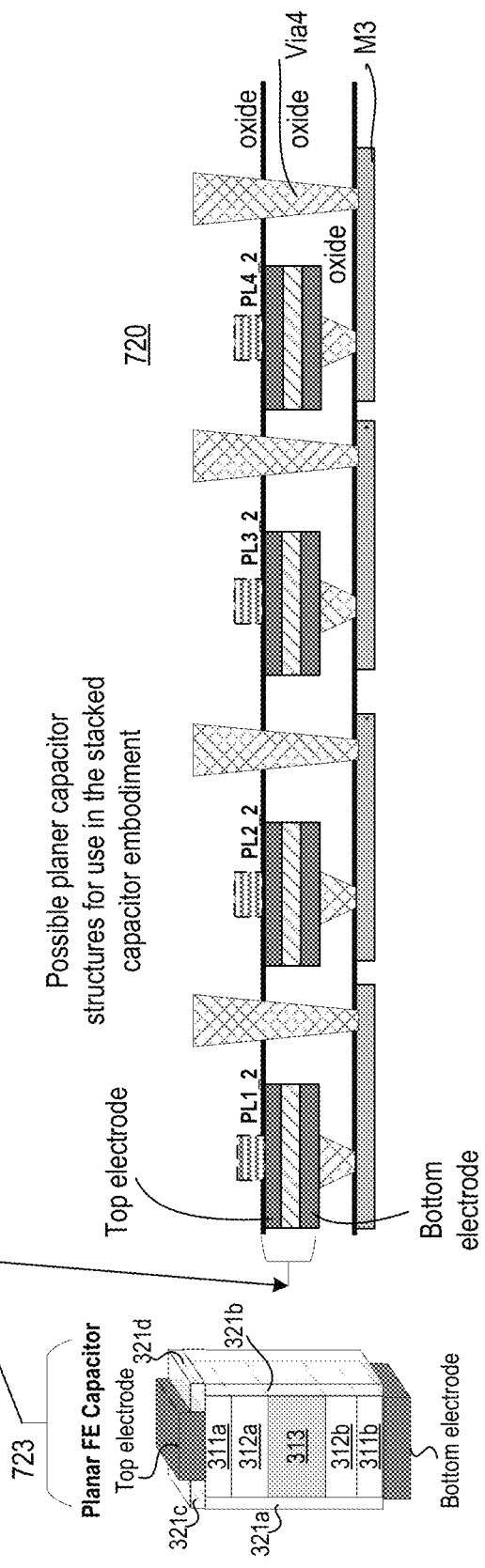
Fig. 7C
Fig. 7B

US 11,696,450 B1

COMMON MODE COMPENSATION FOR MULTI-ELEMENT NON-LINEAR POLAR MATERIAL BASED GAIN MEMORY BIT-CELL

CLAIM OF PRIORITY

This Application is a Continuation of, and claims the benefit of priority to, U.S. patent application Ser. No. 17/516,293, filed on Nov. 1, 2021, and titled "Common Mode Compensation for Non-Linear Polar Material Based 1T1C Memory Bit-Cell," which is incorporated by reference in its entirety for all purposes.

BACKGROUND

The standard memory used in processors is static random-access memory (SRAM) or dynamic random-access memory (DRAM), and their derivatives. These memories are volatile memories. For example, when power to the memories is turned off, the memories lose their stored data. Non-volatile memories are now commonly used in computing platforms to replace magnetic hard disks. Non-volatile memories retain their stored data for prolonged periods (e.g., months, years, or forever) even when power to those memories is turned off. Examples of non-volatile memories are magnetic random-access memory (MRAM), NAND, or NOR flash memories. These memories may not be suitable for low power and compact computing devices because these memories suffer from high write energy, low density, and high-power consumption.

The background description provided here is for the purpose of generally presenting the context of the disclosure. Unless otherwise indicated here, the material described in this section is not prior art to the claims in this application and are not admitted being prior art by inclusion in this section.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 7B illustrates a cross-sectional view and possible structures of the planar non-linear polar material based capacitors used in FIG. 7A, in accordance with some embodiments.

FIG. 7C illustrates a cross-sectional view and possible structure of the planar dielectric capacitor used in FIG. 7A, in accordance with some embodiments.

DETAILED DESCRIPTION

Figure 1:
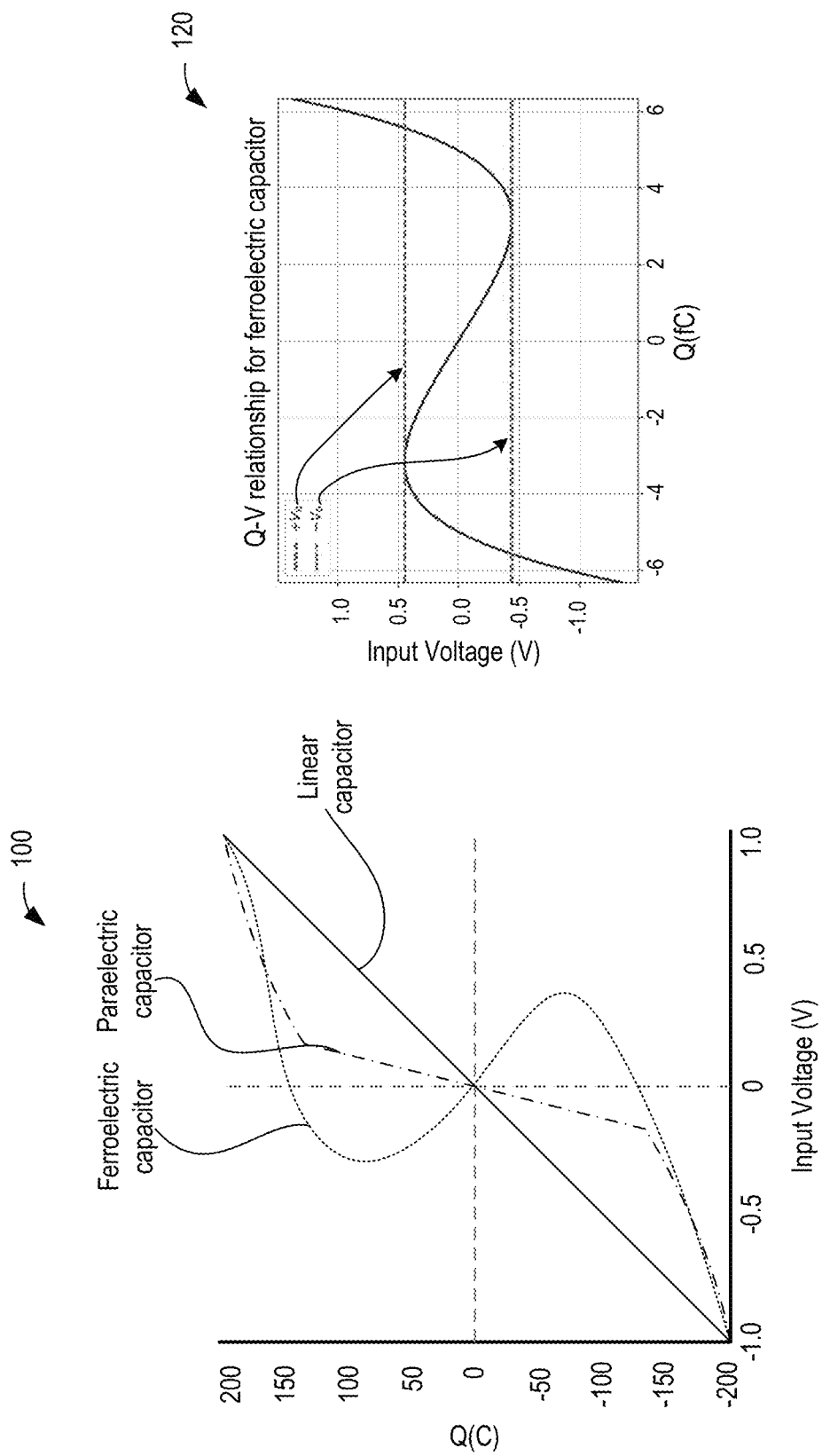
FIG. 1 illustrates a set of plots showing behavior of a ferroelectric capacitor, a paraelectric capacitor, and a linear capacitor.

Memory bit-cells comprising ferroelectric material provide a new class of non-volatile memories. However, such memories suffer from charge degradation over time, for example, during read operations. Such memories also suffer from charge disturbance when neighboring bit-cell cells are accessed. Such disturbance may be a function routing configuration of plate-line(s), relative to bit-lines and word-lines. Further, leakage from transistors coupled to ferroelectric capacitor(s) may further degrade charge on a storage node connected to the capacitor.

When a plate-line coupled to the ferroelectric capacitor is pulsed, the ferroelectric capacitor switches. In this case the equivalent dielectric component of the ferroelectric capacitance also switches. To compensate for the switching of the equivalent dielectric component, an explicit dielectric capacitor is added and controlled by a signal opposite to the signal driven on the plate-line.

The equivalent dielectric component of the ferroelectric capacitor can become a non-negligible factor for pillar capacitor or non-planar capacitor topologies. This may be because as polarization density associated with a ferroelectric capacitor at lower thickness reduces, the lower thickness increases the dielectric component of the ferroelectric capacitor. This in turn indicates that at a sense-line (e.g., a bit-line) while performing a read, a large chunk of common mode signal contribution (where common mode has the same value whether logic 1 or 0 is read) is associated with the switching of the equivalent dielectric component. When operating the memory at different supply voltages, the dielectric component of the ferroelectric capacitor causes a supply voltage dependent signal on the sense-line (e.g., bit-line). Since there is a non-differential topology for sensing, this causes loss of margin, unless reference voltage is not raised to compensate for supply voltage change. For a multi-element gain based memory bit-cell topologies, the same voltage also acts as a disturbance to the other ferroelectric capacitors in the bit-cell, since any movement on the common node shared by the multiple elements creates a field that affects other capacitors of the bit-cell. Minimizing the common mode signal by applying an opposite field in proportion to the equivalent dielectric component of the ferroelectric capacitor would negate loss of read or write margin. The explicit linear dielectric capacitor of some embodiments mitigates the effect of this supply voltage dependent signal.

In some embodiments, the memory bit-cell comprises a first capacitor comprising non-linear polar material coupled to a node. The first capacitor has a first terminal coupled to the node and a second terminal coupled to a first plate-line. In some embodiments, the memory bit-cell comprises a transistor coupled to the node and a bit-line, wherein the transistor is controllable by a word-line, and wherein the first plate-line is parallel to the bit-line. In some embodiments, the memory bit-cell comprises a second capacitor coupled to the node and a second plate-line, wherein the second capacitor comprises a linear dielectric. The second capacitor is used for common mode compensation. In some embodiments, the effective capacitance of the second capacitor is equal (or substantially) to a linear component of the capacitance of the first capacitor. In various embodiments, one or more circuitries are provided to apply a voltage on the second plate-line. The voltage on the second plate-line is opposite to a voltage applied to the first capacitor via the first plate-line to compensate for dielectric capacitor dependent charge. In some embodiments, the second plate-line has a voltage complementary to a voltage on the first plate-line. In some embodiments, the first capacitor is a pillar capacitor. In some embodiments, the first capacitor and the second capacitor are vertically stacked. As such, the x-y footprint of the bit-cell does not change. The express dielectric capacitor (also referred to as the compensation capacitor) can also be included in other memory bit-cell configurations such as 1TnC and multi-element gain based memory bit-cell.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction, and may be implemented with any suitable type of signal scheme.

It is pointed out that those elements of the figures having the same reference numbers (or names) as the elements of any other figure can operate or function in any manner like that described but are not limited to such.

FIG. 1 illustrates a set of plots 100 and 120 showing behavior of a ferroelectric capacitor, a paraelectric capacitor, and a linear capacitor. Plot 100 compares the transfer function for a linear capacitor, a paraelectric (PE) capacitor (a non-linear capacitor) and a ferroelectric (FE) capacitor (a non-linear capacitor). Here, x-axis is input voltage or voltage across the capacitor, while the y-axis is the charge on the capacitor. The ferroelectric material can be any suitable low voltage FE material that allows the FE material to switch its state by a low voltage (e.g., 100 mV). Threshold in the FE material has a highly non-linear transfer function in the polarization vs. voltage response. The threshold is related to: a) non-linearity of switching transfer function; and b) the squareness of the FE switching. The non-linearity of switching transfer function is the width of the derivative of the polarization vs. voltage plot. The squareness is defined by the ratio of the remnant polarization to the saturation polarization, perfect squareness will show a value of 1. The squareness of the FE switching can be suitably manipulated with chemical substitution. For example, in PbTiO3 a P-E (polarization-electric field) square loop can be modified by La or Nb substitution to create an S-shaped loop. The shape can be systematically tuned to ultimately yield a non-linear dielectric. The squareness of the FE switching can also be changed by the granularity of an FE layer. A perfectly epitaxial, single crystalline FE layer will show higher squareness (e.g., ratio is closer to 1) compared to a poly crystalline FE. This perfect epitaxial can be accomplished using lattice matched bottom and top electrodes. In one example, BiFeO (BFO) can be epitaxially synthesized using a lattice matched SrRuO3 bottom electrode yielding P-E loops that are square. Progressive doping with La will reduce the squareness.

Plot 120 shows the charge and voltage relationship for a ferroelectric capacitor. A capacitor with ferroelectric material (also referred to as a FEC) is a non-linear capacitor with its potential $V_F(Q_F)$ as a cubic function of its charge. Plot 120 illustrates characteristics of an FEC. Plot 120 is a charge-voltage (Q-V) plot for a block of $Pb(Zr_{0.5}Ti_{0.5})O_3$ of area $(100\ nm)^2$ and thickness 30 nm (nanometer). Plot 120 shows local extrema at $+/-V_o$ indicated by the dashed lines. Here, the term $V_c$ is the coercive voltage. In applying a potential V across the FEC, its charge can be unambiguously determined only for $|V|>V_o$. Otherwise, the charge of the FEC is subject to hysteresis effects.

Figure 2:
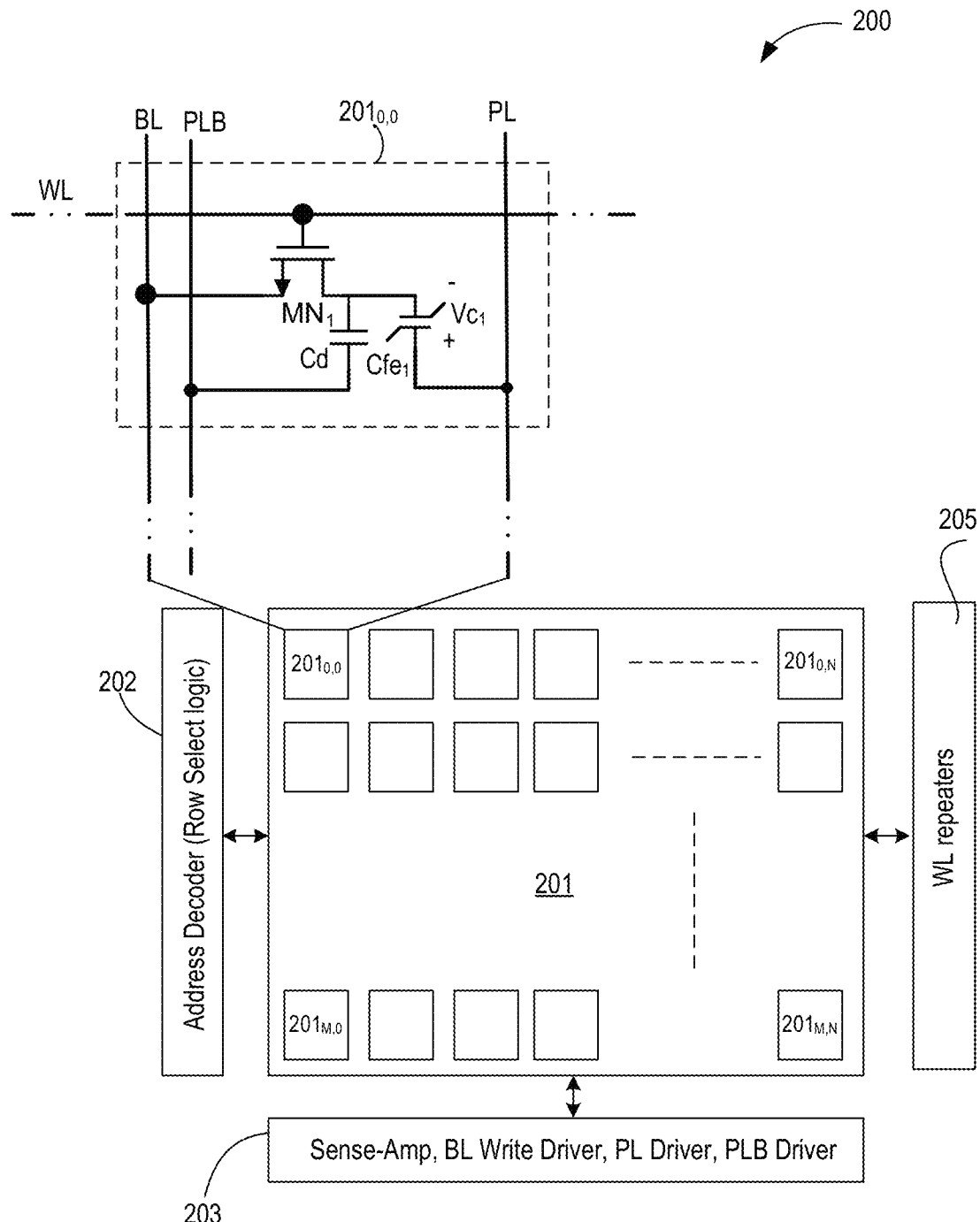
FIG. 2 illustrates an apparatus comprising memory and corresponding logic, wherein the memory comprises non-linear polar material based memory bit-cell, where an individual memory bit-cell includes one transistor and one capacitor (1T1C) and one compensation capacitor, in accordance with some embodiments.

FIG. 2 illustrates apparatus 200 comprising memory and corresponding logic, wherein the memory comprises non-linear polar material based memory bit-cell, where an individual memory bit-cell includes one transistor and one capacitor (1T1C) and one compensation capacitor, in accordance with some embodiments. While various embodiments are illustrated with reference to ferroelectric material and/or ferroelectric capacitor, the embodiments are applicable to other non-linear polar material such as paraelectric material, non-linear dielectric, etc.

Apparatus 200 comprises M×N memory array 201 of bit-cells $201_{0,0}$ through $201_{M,N}$, logic circuitry 202 for address decoding, logic 203 having sense amplifier and write drivers, PL driver, and PLB driver, and WL repeaters 205. In some embodiments, bit-cell $201_{0,0}$ comprises a WL, a first PL, a second PL (herein PLB), which carries a signal inverse of the signal on the first PL, and a BL. In some embodiments, bit-cell $201_{0,0}$ comprises an n-type transistor $MN_1$, and FE capacitive structure $Cfe_1$. The gates of transistor $MN_1$ are coupled to a common WL. In various embodiments, one terminal of the FE capacitive structure $Cfe_1$ is coupled to the first PL. The second terminal of the FE capacitive structure is coupled to source or drain terminal of the transistor $MN_1$. In various embodiments, BL is coupled to the source or drain terminal of first transistor $MN_1$. In some embodiments, the PL is parallel to the BL and orthogonal to the WL. In some embodiments, the FE capacitor is a planar capacitor. In some embodiments, the FE capacitor is a pillar or non-planar capacitor.

Logic 202 comprises address decoders for selecting a row of bit-cells and/or a particular bit-cell from M×N array 201, where M and N are integers of same or different values. In some embodiments, logic 202 includes word-line drivers. In some embodiments, logic 203 comprises sense-amplifiers for reading the values from the selected bit-cell. Since the PL is parallel to the BL, in some embodiments, PL drivers (e.g., PL driver and PLB drivers) and BL drivers are part of logic 203. In other embodiments, PL drivers and BL drivers may be placed across logic 203 on the other side of memory array 201. In various embodiments, write drivers are used to write a particular value to a selected bit-cell. Here, a schematic of FE bit-cell $201_{0,0}$ is illustrated. The same embodiments apply to other bit-cells of the M×N array. As the PL and PLB are parallel to the bit-line, the WL drivers can be placed orthogonal to the region where the plate-line drivers and bit-line drivers are placed. In some embodiments, WL repeaters 205 are added to buffer the word-line signals along different memory arrays. In some embodiments, apparatus 200 comprises a wear-leveling logic (also referred to as refresh logic) to refresh the contents of the memory bit-cells periodically or on a need-by-need basis.

In some embodiments, memory bit-cell 201 (e.g., $201_{0,0}$) comprises a second capacitor Cd coupled to the source or drain of $MN_1$ and the second plate-line PLB. In some embodiments, the second capacitor Cd comprises a linear dielectric. In some embodiments, the second capacitor Cd is used for common mode compensation. In some embodiments, the effective capacitance of the second capacitor Cd is equal (or substantially equal) to a linear component of the capacitance of the first capacitor Cfe1.

In various embodiments, one or more circuitries are provided to apply a voltage on the second plate-line PLB. The voltage on the second plate-line PLB is opposite to a voltage applied to the first capacitor Cfe1 via the first plate-line PL to compensate for dielectric capacitor dependent charge. In some embodiments, the second plate-line PLB has a voltage complementary to a voltage on the first plate-line PL. In some embodiments, the first capacitor is a pillar capacitor. In some embodiments, the second capacitor Cd is a pillar capacitor. In some embodiments, the first capacitor Cfe and the second capacitor Cd are vertically stacked. As such, the x-y footprint of the bit-cell does not change compared to bit-cell 201. The express dielectric capacitor Cd (also referred to as the compensation capacitor) can also be included in other memory bit-cell configurations such as 1TnC and multi-element gain based memory bit-cell.

While the embodiment of FIG. 2 is illustrated with reference to PL and PLB being parallel to BL, the common mode compensation scheme using dielectric capacitor Cd is also applicable to bit-cells with PL and PLB parallel to the WL. Likewise, while the embodiments are described with reference to pillar capacitors, both the first and second capacitors can be planar capacitors, in accordance with some embodiments.

Figure 3A:
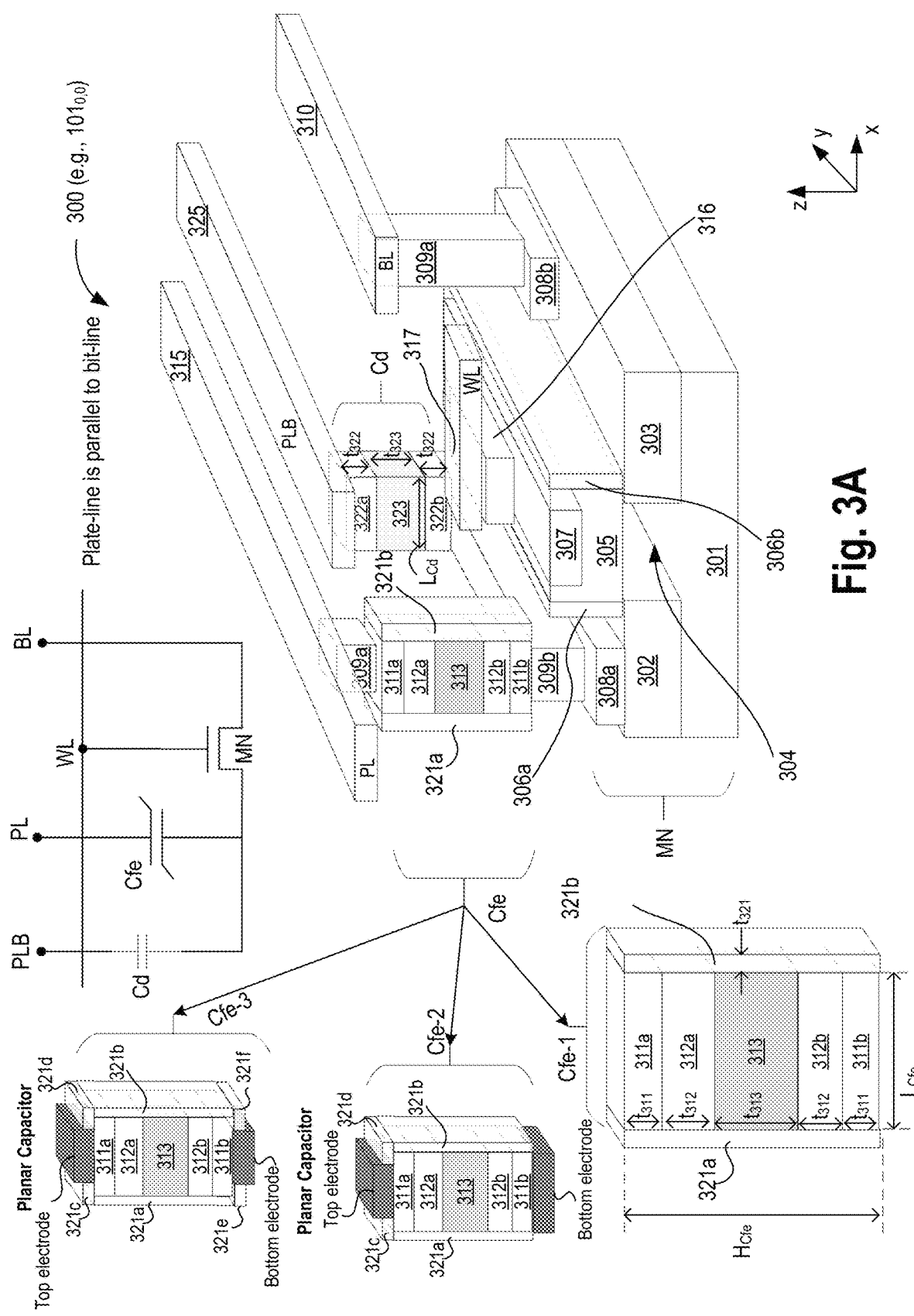
FIG. 3A illustrates a three-dimensional (3D) view of a 1T1C bit-cell with common mode compensation, where the transistor is a planar transistor and where the capacitor is a planar capacitor, in accordance with some embodiments.

FIG. 3A illustrates a three-dimensional (3D) view of a 1T1C bit-cell 300 with common mode compensation, where the transistor is a planar transistor and where the capacitor is a planar capacitor, in accordance with some embodiments. In some embodiments, memory bit-cell 300 includes a planar transistor MN (e.g., transistor $MN_1$) having substrate 301, source region 302, drain region 303, channel region 304, gate comprising gate dielectric 305, gate spacers 306a and 306b; gate metal 307, source contact 308a, and drain contact 308b. In some embodiments, substrate 301 includes a suitable semiconductor material such as: single crystal silicon, polycrystalline silicon and silicon on insulator (SOI). In some embodiments, substrate 301 includes other semiconductor materials such as: Si, Ge, SiGe, or a suitable group III-V or group III-N compound. In some embodiments, substrate 301 may also include semiconductor materials, metals, dopants, and other materials commonly found in semiconductor substrates.

In some embodiments, source region 302 and drain region 303 are formed within substrate 301 adjacent to the gate stack of the transistor. In various embodiments, source region 302 and drain region 303 are generally formed using either an etching/deposition process or an implantation/diffusion process. In some embodiments, in the etching and deposition process, substrate 301 may first be etched to form recesses at the locations of the source 302 and drain 303 regions. An epitaxial deposition process may then be carried out to fill the recesses with material that is used to fabricate the source region 302 and drain region 303. In the implantation/diffusion process, dopants such as boron, aluminum, antimony, phosphorous, or arsenic may be ion-implanted into the substrate to form the source region 302 and drain region 303. An annealing process that activates the dopants and causes them to diffuse further into substrate 301 typically follows the ion-implantation process. In some embodiments, one or more layers of metal and/or metal alloys are used to form source region 302 and drain region 303. In some embodiments, source region 302 and drain region 303 are formed using one or more alternate semiconductor materials such as germanium or a suitable group III-V compound. In some embodiments, source region 302 and drain region 303 are fabricated using a silicon alloy such as silicon germanium or silicon carbide. In some embodiments, the epitaxially deposited silicon alloy is doped in-situ with dopants such as boron, arsenic, or phosphorous. In some embodiments, semiconductor material for channel region 304 may have the same material as substrate 301, in accordance with some embodiments. In some embodiments, channel region 304 includes one of: Si, SiGe, Ge, or GaAs.

In some embodiments, gate dielectric layer 305 may include one layer or a stack of layers. The one or more layers may include high-k dielectric material, silicon oxide, and/or silicon dioxide ($SiO_2$). The high-k dielectric material may include elements such as: zinc, niobium, scandium, lean yttrium, hafnium, silicon, strontium, oxygen, barium, titanium, zirconium, tantalum, aluminum, and lanthanum. Examples of high-k materials that may be used in the gate dielectric layer include: lead zinc niobate, hafnium oxide, lead scandium tantalum oxide, hafnium silicon oxide, yttrium oxide, aluminum oxide, lanthanum oxide, barium strontium titanium oxide, lanthanum aluminum oxide, titanium oxide, zirconium oxide, tantalum oxide, and zirconium silicon oxide. In some embodiments, when a high-k material is used, an annealing process is used on the gate dielectric layer 305 to improve its quality.

In some embodiments, a pair of spacer layers (sidewall spacers) 306a/b are formed on opposing sides of the gate stack that brackets the gate stack. The pair of spacer layers 306a/b are formed from a material such as: silicon oxynitride, silicon nitride, silicon nitride doped with carbon, or silicon carbide. Processes for forming sidewall spacers are well-known in the art and generally include deposition and etching process operations. In some embodiments, a plurality of spacer pairs may be used. For example, two pairs, three pairs, or four pairs of sidewall spacers may be formed on opposing sides of the gate stack.

In some embodiments, depending on whether the transistor is to be a p-type or an n-type transistor, gate metal layer 307 may comprise at least one P-type work-function metal or N-type work-function metal. In some embodiments, gate metal layer 307 may comprise a stack of two or more metal layers. In some embodiments, the two or more metal layers are work-function metal layers and at least one metal layer is a conductive fill layer. In some embodiments, for an n-type transistor, metals that may be used for the gate metal layer 307 include: aluminum carbide, tantalum carbide, zirconium carbide, and/or hafnium carbide. In some embodiments, metal for gate metal layer 307 for n-type transistor include: aluminum, hafnium, zirconium, titanium, tantalum, and their alloys. An n-type metal layer may enable the formation of an n-type gate metal layer 307 with a work function that is between about 3.9 eV and about 4.2 eV. In some embodiments, metal of layer 307 includes one of: TiN, TiSiN, TaN, Cu, Al, Au, W, TiSiN, and/or Co. In some embodiments, metal of layer 307 includes one or more of: Ti, N, Si, Ta, Cu, Al, Au, W, or Co. In some embodiments, for a p-type transistor, metals that are used for gate metal layer 307 include, but are not limited to, ruthenium, palladium, platinum, cobalt, nickel, and conductive metal oxides. An example of conductive oxide includes ruthenium oxide. A p-type metal layer may enable the formation of a p-type gate metal layer 307 with a work function that is between about 4.9 eV and about 5.2 eV.

In some embodiments, drain contact 308b is coupled to via 309a/b, which is coupled to metal layer for BL 310. Metal layer for BL 310 is the bit-line, which extends along the y-axis. In some embodiments, source contact 308a is coupled to via 309b. Any suitable material can be used for drain and source contacts 308a/b and via 309a/b. For example, one or more of Ti, N, Si, Ta, Cu, Al, Au, W, and/or Co can be used for drain and source contacts 308a/b and via 309a/b. In some embodiments, via 309b is coupled to FE capacitor Cfe.

The capacitor Cfe can be any planar capacitor. Three such examples are shown as Cfe-1, Cfe-2, and Cfe-3. In some embodiments, the planar capacitor Cfe-2 incudes encapsulation portions 321c and 321d that are partially adjacent to sidewall barrier seal 321a and 321b, and refractive intermetallic layers 311a. In various embodiments, encapsulation portions 321c and 321d terminate into via 309a. The material for encapsulation portions 321c and 321d is same as those for sidewall barrier seal 321a and 321b. In some embodiments, the planar capacitor Cfe-3 includes encapsulation portions 321e and 321f that are partially adjacent to sidewall barrier seal 321a and 321b, and refractive intermetallic layers 311b. In various embodiments, encapsulation portions 321e and 321f terminate into via 309b. The material for encapsulation portions 321e and 321f is same as those for sidewall barrier seal 321a and 321b.

In some embodiments, the capacitor Cfe comprises a number of layers stacked together to form a planar capacitor. These layers may be extending in an x-plane when the capacitor is a planar capacitor. In some embodiments, the stack of layers includes refractive inter-metallic 311a/b as a barrier material; conductive oxides 312a/b, and FE material 313. In some embodiments, refractive inter-metallic 311a/b are removed and vias 309a/b are in direct contact with conductive oxides 312a/b.

In some embodiments, refractive inter-metallic 311a/b maintains the FE properties of the FE capacitor Cfe. In the absence of refractive inter-metallic 311a/b, the ferroelectric material or the paraelectric material 313 of the capacitor may lose its potency. In some embodiments, refractive inter-metallic 311a/b comprises Ti and Al (e.g., TiAl compound). In some embodiments, refractive inter-metallic 311a/b comprises one or more of Ta, W, and/or Co. For example, refractive inter-metallic 311a/b includes a lattice of Ta, W, and Co. In some embodiments, refractive inter-metallic 311a/b includes one of: Ti—Al such as Ti3Al, TiAl, TiAl3; Ni—Al such as Ni3Al, NiAl3, NiAl; Ni—Ti, Ni—Ga, Ni2MnGa; FeGa, Fe3Ga; borides, carbides, or nitrides. In some embodiments, TiAl material comprises Ti-(45-48) Al-(1-10)M (at. X trace amount %), with M being at least one element from: V, Cr, Mn, Nb, Ta, W, and Mo, and with trace amounts of 0.1-5% of Si, B, and/or Mg. In some embodiments, TiAl is a single-phase alloy γ(TiAl). In some embodiments, TiAl is a two-phase alloy γ(TiAl)+α2(Ti3Al). Single-phase γ alloys contain third alloying elements such as Nb or Ta that promote strengthening and additionally enhance oxidation resistance. The role of the third alloying elements in the two-phase alloys is to raise ductility (V, Cr, Mn), oxidation resistance (Nb, Ta) or combined properties. Additions such as Si, B and Mg can markedly enhance other properties. In some embodiments, barrier layer 311a is coupled to plate-line or powerline (PL) 315. In some embodiments, sidewall barrier seal 321a/b (insulating material) is placed around layers 311a, 312a, 313, 312b, and 311b along while the top and bottom surfaces of 311a and 311b are exposed for coupling to metal layers, vias, or a metallic pedestal.

In some embodiments, PL 315 extends along the y-direction and parallel to the BL 310. PL 315 and BL 310 can also be parallel along an x-direction. Here, y-direction is provided as an example and the parallel orientation can be along the x-direction too. Having the BL and the PL parallel to one another further improves the density of the memory because the memory array footprint is reduced, allowing column multiplexing (muxing), and sharing of sense-amplifier, and PL line driver size reduction, compared to the case when BL and PL are orthogonal to each other. In some embodiments, gate metal 307 is coupled to a gate contact 316, which is coupled to metal line 317. Metal line 317 is used as the word-line (WL). In some embodiments, WL 317 extends orthogonal to BL 310 and PL 315. In some embodiments, WL 317 is also parallel to BL 310 and PL 315. Any suitable metal can be used for BL 310, PL 315, and/or WL 317. For example, Al, Cu, Co, Au, or Ag can be used for BL 310, PL 315, and WL 317.

In various embodiments, FE material 313 can be any suitable low voltage FE material that allows the FE material to switch its state by a low voltage (e.g., 100 mV). In various embodiments, FE material 313 can be any suitable low voltage FE material that allows FE material 313 to switch its state by a low voltage (e.g., 100 mV). Threshold in FE material has a highly non-linear transfer function in the polarization vs. voltage response. The threshold is related to: a) non-linearity of switching transfer function; and b) the squareness of the FE switching. The non-linearity of switching transfer function is the width of the derivative of the polarization vs. voltage plot. The squareness is defined by the ratio of the remnant polarization to the saturation polarization; perfect squareness will show a value of 1.

The squareness of the FE switching can be suitably manipulated with chemical substitution. For example, in PbTiO3 a P-E (polarization-electric field) square loop can be modified by La or Nb substitution to create an S-shaped loop. The shape can be systematically tuned to ultimately yield a non-linear dielectric. The squareness of the FE switching can also be changed by the granularity of an FE layer. A perfectly epitaxial, single crystalline FE layer will show higher squareness (e.g., ratio is closer to 1) compared to a poly crystalline FE. This perfect epitaxial can be accomplished using lattice matched bottom and top electrodes. In one example, BiFeO (BFO) can be epitaxially synthesized using a lattice matched SrRuO3 bottom electrode yielding P-E loops that are square. Progressive doping with La will reduce the squareness.

In some embodiments, FE material 313 comprises a perovskite of the type $ABO_3$, where 'A' and 'B' are two cations of different sizes, and 'O' is oxygen which is an anion that bonds to both the cations. Generally, the size of atoms of A is larger than the size of B atoms. In some embodiments, the perovskite can be doped (e.g., by La or Lanthanides).

In some embodiments, FE material 313 is perovskite, which includes one or more of: La, Sr, Co, Sr, Ru, Y, Ba, Cu, Bi, Ca, and Ni. For example, metallic perovskites such as: $(La,Sr)CoO_3$, $SrRuO_3$, $(La,Sr)MnO_3$, $YBa_2Cu_3O_7$, $Bi_2Sr_2CaCu_2O_8$, $LaNiO_3$, $BaTiO_3$, $KNbO_3$, $NaTaO_3$, etc. may be used for FE material. Perovskites can be suitably doped to achieve a spontaneous distortion in a range of 0.3 to 2%. For example, for chemically substituted lead titanate such as Zr in Ti site; La, Nb in Ti site, the concentration of these substitutes is such that it achieves the spontaneous distortion in the range of 0.3-2%. For chemically substituted BiFeO3, BrCrO3, BuCoO3 class of materials, La or rare earth substitution into the Bi site can tune the spontaneous distortion. In some embodiments, FE material is contacted with a conductive metal oxide that includes one of the conducting perovskite metallic oxides exemplified by: La—Sr—CoO3, SrRuO3, La—Sr—MnO3, YBa2Cu3O7, Bi2Sr2CaCu2O8, and LaNiO3.

In some embodiments, FE material 313 comprises a stack of layers including low voltage FE material between (or sandwiched between) conductive oxides. In various embodiments, when FE material is a perovskite, the conductive oxides are of the type $AA'BB'O_3$. A' is a dopant for atomic site A, it can be an element from the Lanthanides series. B' is a dopant for atomic site B, it can be an element from the transition metal elements, especially Sc, Ti, V, Cr, Mn, Fe, Co, Ni, Cu, Zn. A' may have the same valency of site A, with a different ferroelectric polarizability. In various embodiments, when metallic perovskite is used for FE material 313, conductive oxides can include one or more of: $IrO_2$, $RuO_2$, $PdO_2$, $OsO_2$, or $ReO_3$. In some embodiments, the perovskite is doped with La or Lanthanides. In some embodiments, thin layer (e.g., approximately 10 nm) perovskite template conductors such as SrRuO3 coated on top of IrO2, RuO2, PdO2, PtO2, which have a non-perovskite structure but higher conductivity to provide a seed or template for the growth of pure perovskite ferroelectric at low temperatures, are used as conductive oxides.

In some embodiments, ferroelectric materials are doped with s-orbital material (e.g., materials for first period, second period, and ionic third and fourth periods). In some embodiments, f-orbital materials (e.g., lanthanides) are doped to the ferroelectric material to make paraelectric material. Examples of room temperature paraelectric materials include: SrTiO3, Ba(x)Sr(y)TiO3 (where x is −0.05 or 0.5, and y is 0.95), HfZrO2, Hf—Si—O, La-substituted PbTiO3, PMN-PT based relaxor ferroelectrics.

In some embodiments, FE material 313 comprises one or more of: Hafnium (Hf), Zirconium (Zr), Aluminum (Al), Silicon (Si), their oxides or their alloyed oxides. In some embodiments, FE material includes one or more of: Al(1-x)Sc(x)N, Ga(1-x)Sc(x)N, Al(1-x)Y(x)N or Al(1-x-y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction. In some embodiments, FE material includes one or more of: Bismuth ferrite (BFO), lead zirconate titanate (PZT), BFO with doping material, or PZT with doping material, wherein the doping material is one of Nb or La; and relaxor ferroelectrics such as PMN-PT.

In some embodiments, FE material 313 includes Bismuth ferrite (BFO) with a doping material where in the doping material is one of Lanthanum, or any element from the lanthanide series of the periodic table. In some embodiments, FE material includes lead zirconium titanate (PZT), or PZT with a doping material, wherein the doping material is one of La, Nb. In some embodiments, FE material includes a relaxor ferro-electric includes one of lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), Barium Titanium-Barium Strontium Titanium (BT-BST).

In some embodiments, FE material 313 includes Hafnium oxides of the form, Hf1-x Ex Oy where E can be Al, Ca, Ce, Dy, er, Gd, Ge, La, Sc, Si, Sr, Sn, or Y. In some embodiments, FE material includes Niobate type compounds LiNbO3, LiTaO3, Lithium iron Tantalum Oxy Fluoride, Barium Strontium Niobate, Sodium Barium Niobate, or Potassium strontium niobate.

In some embodiments, FE material 313 comprises multiple layers. For example, alternating layers of [Bi2O2]2+, and pseudo-perovskite blocks (Bi4Ti3O12 and related *Aurivillius* phases), with perovskite layers that are 'n' octahedral layers in thickness can be used. In some embodiments, FE material comprises organic material. For example, Polyvinylidene fluoride or polyvinylidene difluoride (PVDF).

In some embodiments, FE material 313 comprises hexagonal ferroelectrics of the type h-RMnO3, where R is a rare earth element viz. cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y). The ferroelectric phase is characterized by a buckling of the layered MnO5 polyhedra, accompanied by displacements of the Y ions, which lead to a net electric polarization. In some embodiments, hexagonal FE includes one of: YMnO3 or LuFeO3. In various embodiments, when FE material comprises hexagonal ferroelectrics, the conductive oxides are of A2O3 (e.g., In2O3, Fe2O3) and ABO3 type, where 'A' is a rare earth element and B is Mn.

In some embodiments, FE material 313 comprises improper FE material. An improper ferroelectric is a ferroelectric where the primary order parameter is an order mechanism such as strain or buckling of the atomic order. Examples of improper FE material are LuFeO3 class of materials or super lattice of ferroelectric and paraelectric materials PbTiO3 (PTO) and SnTiO3 (STO), respectively, and LaAlO3 (LAO) and STO, respectively. For example, a super lattice of [PTO/STO]n or [LAO/STO]n, where 'n' is between 1 to 100. While various embodiments here are described with reference to ferroelectric material for storing the charge state, the embodiments are also applicable for paraelectric material. For example, the capacitor of various embodiments can be formed using paraelectric material instead of ferroelectric material.

While various embodiments here are described with reference to ferroelectric material for storing the charge state, the embodiments are also applicable for paraelectric material. For example, non-linear paraelectric material of various embodiments can be formed using paraelectric material instead of ferroelectric material. In some embodiments, paraelectric material includes one of: SrTiO3, Ba(x)Sr(y)TiO3 (where x is −0.5, and y is 0.95), HfZrO2, Hf—Si—O, La-substituted PbTiO3, or PMN-PT based relaxor ferroelectrics.

While various embodiments here are described with reference to ferroelectric material for storing the charge state, the embodiments are also applicable for paraelectric material. For example, FE material 313 of various embodiments can be formed using paraelectric material instead of ferroelectric material. In some embodiments, paraelectric material includes one of: SrTiO3, Ba(x)Sr(y)TiO3 (where x is −0.5, and y is 0.95), HfZrO2, Hf—Si—O, La-substituted PbTiO3, or PMN-PT based relaxor ferroelectrics.

The capacitor Cfe can be any planar capacitor. Three such examples are shown as Cfe-1, Cfe-2, and Cfe-3. In some embodiments, the planar capacitor Cfe-2 includes encapsulation portions 321c and 321d that are partially adjacent to sidewall barrier seal 321a and 321b, and refractive inter-metallic layers 311a. In various embodiments, encapsulation portions 321c and 321d terminate into via 309a. The material for encapsulation portions 321c and 321d is same as those for sidewall barrier seal 321a and 321b. In some embodiments, the planar capacitor Cfe-3 includes encapsulation portions 321e and 321f that are partially adjacent to sidewall barrier seal 321a and 321b, and refractive inter-metallic layers 311b. In various embodiments, encapsulation portions 321e and 321f terminate into via 309b. The material for encapsulation portions 321e and 321f is same as those for sidewall barrier seal 321a and 321b.

In some embodiments, thickness $t_{311}$ of refractive inter-metallic layer 311a/b is in a range of 1 nm to 30 nm. In some embodiments, thickness $t_{312}$ of the conductive oxide layers 312a/b is in a range of 1 nm to 30 nm. In some embodiments, thickness $t_{313}$ of the FE material (e.g., perovskite, hexagonal ferroelectric, or improper ferroelectric) 313a/b is in a range of 1 nm to 30 nm. In some embodiments, the lateral thickness $t_{321}$ of the sidewall barrier seal 321a/b (insulating material) is in a range of 0.1 nm to 40 nm. In some embodiments, the lateral thickness $L_{Cfe}$ of the capacitive structure (without sidewall barrier) is in a range of 5 nm to 200 nm. In some embodiments, the height $H_{Cfe}$ of the capacitive structure is in a range of 10 nm to 200 nm. In some embodiments, the FE capacitive structure is without refractive inter-metallic layers 311a/b. In that case, conductive oxides layers 312a/b are in direct contact with the contacts, vias, or metals (e.g., PL, source/drain region contact of transistor MN). In some embodiments, sidewall barrier seal 321a/b is not present. In one such embodiment, the sidewalls of the layers 311a/b, 312a/b, and 313 are in direct contact with ILD (interlayer dielectric) such as SiO2.

In the absence of capacitor Cd, when PL 315 coupled to the capacitor Cfe is pulsed, the capacitor Cfe also switches. In this case the dielectric component of the non-linear polar material based capacitance also switches. In some embodiments, to compensate the switching of the dielectric component, an explicit dielectric capacitor Cd is added and controlled by PLB 325. The signal on PLB 325 is opposite to the signal driven on PL 315, in accordance with various embodiments. In some embodiments, dielectric capacitor Cd comprises a top electrode 322a, dielectric layer 323, and bottom electrode 322b. In some embodiments, top electrode 322a is coupled to PLB 325. In some embodiments, PLB 325 is parallel to PL 315. In this example, top electrode 322a is directly connected to PLB 325. In some embodiments, bottom electrode 322b is coupled to contact 308b. In this example, bottom electrode 322b is directly connected to bottom electrode 322b. Any suitable conductive material may be used for top electrode 322a and bottom electrode 322b. For example, the material or the electrode may include one or more of: Cu, Al, Ag, Au, W, or Co. In some embodiments, additional layers may be formed between top electrode 322a and bottom electrode 322b. For example, conductive oxide layers (such as 311a and 311b) may be formed on the top and bottom of dielectric layer 323. In some embodiments, dielectric layer 323 includes one or more of: SiO2, Al2O3, Li2O, HfSiO4, Sc2O3, SrO, HfO2, ZrO2, Y2O3, Ta2O5, BaO, WO3, MoO3, or TiO2. In some embodiments, the thickness $t_{322}$ of top electrode 322a and bottom electrode is in a range of 1 nm to 30 nm. In some embodiments, the thickness $t_{323}$ of dielectric 323 is in a range of 1 nm to 30 nm. In some embodiments, capacitor Cd is stacked over capacitor Cfe to reduce the x-y footprint of the memory bit-cell.

While capacitor Cd is illustrated as a metal-insulator-metal planar capacitor, it can be replaced with other types of capacitors. For example, in some embodiments, capacitance of Cd is achieved by a transistor (not shown) configured as a capacitor. In one such example, the gate of the transistor is coupled to PLB 325 while the source and drains of that transistor are coupled to contact 308a.

Figure 3B:
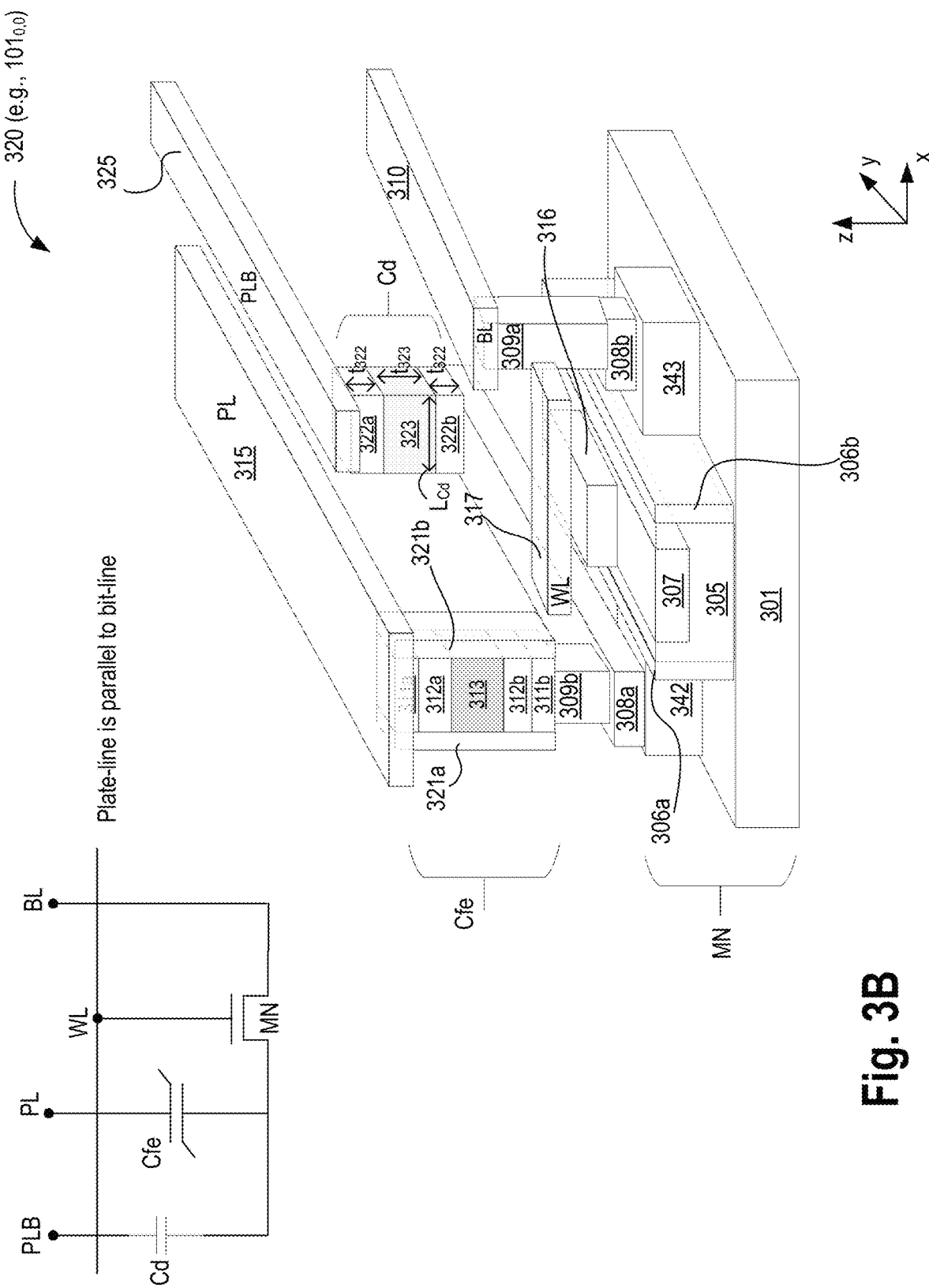
FIG. 3B illustrates a 3D view of a 1T1C bit-cell with common mode compensation, where the transistor is a non-planar transistor and where the capacitor is a planar capacitor, in accordance with some embodiments.

FIG. 3B illustrates a 3D view 320 of a 1T1C bit-cell with common mode compensation, where the transistor is a non-planar transistor and where the capacitor is a planar capacitor, in accordance with some embodiments. FinFET is an example of a non-planar transistor. FinFET comprises a fin that includes source 342 and drain 343 regions. A channel resides between the source and regions 342 and 343. The transistor MN can have multiple fins parallel to one another that are coupled to the same gate stack. The fins pass through the gate stack forming source and drain regions 342 and 343. Other examples of non-planar transistors include nano-wire transistors or nano-sheet transistors.

Figure 4:
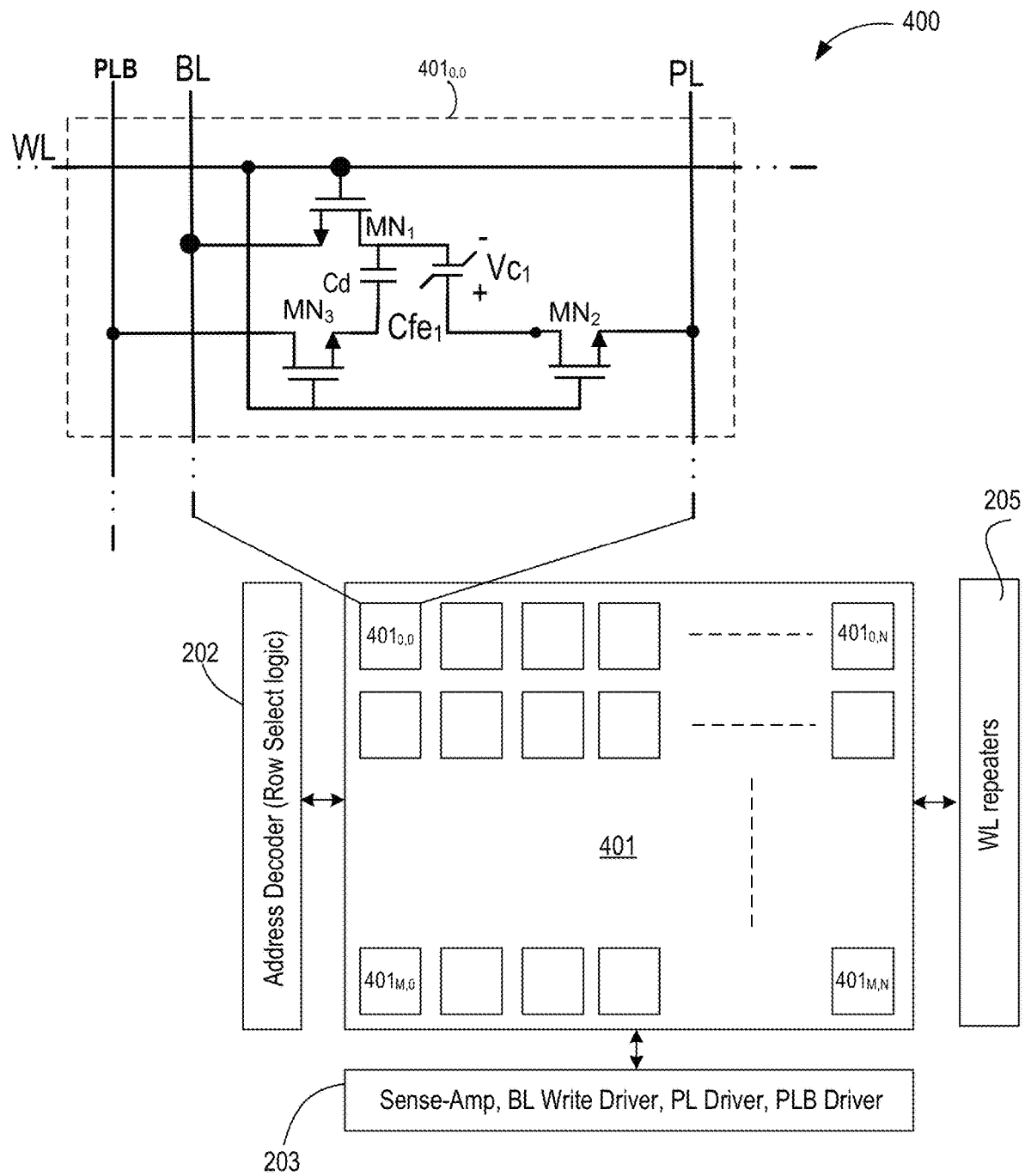
FIG. 4 illustrates an apparatus comprising memory and corresponding logic, wherein the memory comprises non-linear polar material based memory bit-cell, where an individual memory bit-cell includes three transistors and one capacitor (3T1C) and one compensation capacitor, in accordance with some embodiments.

FIG. 4 illustrates apparatus 400 comprising memory and corresponding logic, wherein the memory comprises non-linear polar material based memory bit-cell, where an individual memory bit-cell includes three transistors and one capacitor (3T1C) and one compensation capacitor, in accordance with some embodiments. Apparatus 400 is similar to apparatus 200 of FIG. 2 but for a different kind of memory bit-cell. In some embodiments, each memory bit-cell $401_{0,0}$ in memory array 401 is organized in rows and columns like in apparatus 200. For example, memory bit-cells $401_{0,0}$ through $401_{M,N}$ are organized in an array. In some embodiments, memory bit-cell $401_{0,0}$ comprises three transistors $MN_1$, $MN_2$, and $MN_3$, and one capacitor Cfe1 comprising non-linear polar material. Capacitor Cfe1 can be a planar or non-planar capacitor as described with reference to various embodiments. While the embodiments are described with reference to memory bit-cell $401_{0,0}$, they are applicable to other bit-cells of array 401.

The gate terminals of transistors $MN_1$, $MN_2$, and $MN_3$ are controllable by WL. In some embodiments, BL is coupled to a source or drain terminal of transistor $MN_1$. In some embodiments, PL is coupled to source or drain terminal of $MN_2$. In some embodiments, the drain or source terminal of $MN_2$ is coupled to capacitor Cfe1 having non-linear polar material. In some embodiments, PLB is coupled to source or drain terminal of $MN_3$. In some embodiments, the drain or source terminal of $MN_3$ is coupled to linear capacitor Cd having linear dielectric material.

While the various embodiments are illustrated with reference to n-type transistors, the embodiments are also applicable to p-type transistors or a combination of n-type or p-type transistors. A person skilled in the art would appreciate that when transistors of different conductivity type are used, than what is shown in FIG. 4, then driving logic for BL, PL, PLB, and/or WL may also change for proper read and/or write operations. In various embodiments, PL is parallel to BL. In some embodiments, transistors $MN_1$ and $MN_2$ are fabricated in different layers of a die. For example, transistor $MN_1$ is fabricated on the frontend of the die while transistors $MN_2$ and/or $MN_3$ are fabricated in the backend of the die. On one such embodiment, the capacitor Cfe is fabricated between the frontend and the backend of the die. In one example, capacitor Cfe and Cd are vertically stacked capacitors. As such, a taller bit-cell is formed with same or comparable x-y footprint as the footprint of a 1T1C memory bit-cell.

While the embodiment of FIG. 4 is illustrated with reference to PL and PLB being parallel to BL, the common mode compensation scheme using dielectric capacitor Cd is also applicable to bit-cells with PL and PLB parallel to the WL. Likewise, while the embodiments are described with reference to pillar capacitors, both the first (Cfe) and second (Cd) capacitors can be planar capacitors, in accordance with some embodiments.

Figure 5A:
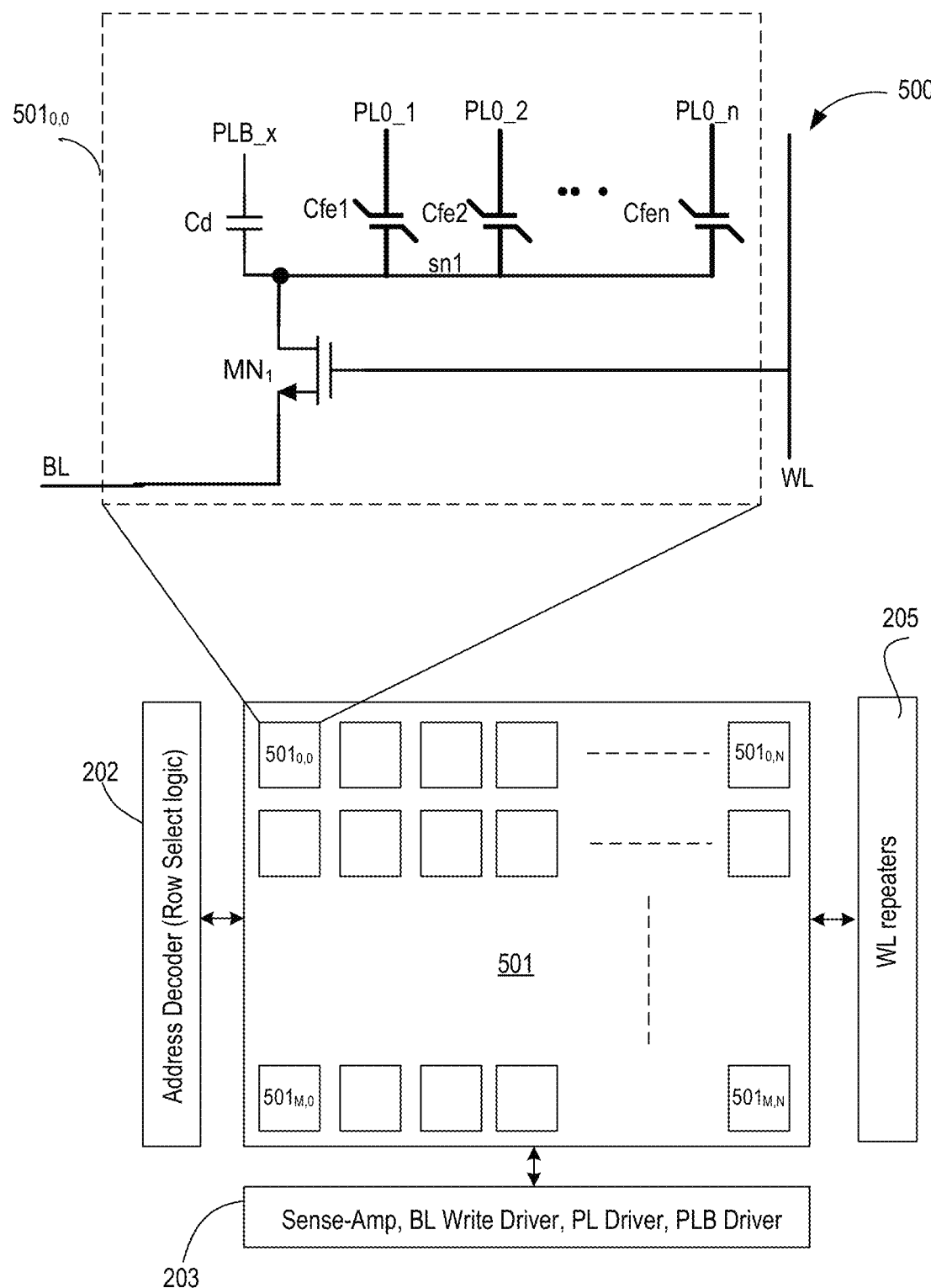
FIG. 5A illustrates an apparatus comprising memory and corresponding logic, wherein the memory comprises non-linear polar material based memory bit-cell, where an individual memory bit-cell includes one transistors and multiple capacitors (1TnC) and one compensation capacitor, in accordance with some embodiments.

FIG. 5A illustrates apparatus 500 comprising memory and corresponding logic, wherein the memory comprises non-linear polar material based memory bit-cell, where an individual memory bit-cell includes one transistors and multiple capacitors (1TnC) and one compensation capacitor, in accordance with some embodiments. Apparatus 500 is similar to apparatus 200 of FIG. 2 but for a different kind of memory bit-cell. In some embodiments, each memory bit-cell in memory array 501 is organized in rows and columns like in apparatus 200. For example, memory bit-cells $501_{0,0}$ through $501_{M,N}$ are organized in an array. In some embodiments, memory bit-cell $501_{0,0}$ comprises one transistor $MN_1$ and a plurality of capacitors Cfe1, Cfe2, through Cfen (where 'n' is a number greater than 1) comprising non-linear polar material (e.g., ferroelectric, paraelectric, or non-linear dielectric). While the embodiments are described with reference to memory bit-cell $501_{0,0}$ they are applicable to other bit-cells of array 501. The capacitors can be a planar or non-planar capacitor as described with reference to various embodiments. In some embodiments, the plurality of capacitors Cfe1, Cfe2, through Cfen are stacked capacitors.

The gate terminal of transistors $MN_1$ is controllable by WL. In some embodiments, BL is coupled to a source or drain terminal of transistor $MN_1$. In some embodiments, an individual PL of a plurality of PLs is coupled to an individual capacitor. For example, capacitor Cfe1 is coupled to plate-line PL0_1, capacitor Cfe2 is coupled to plate_line PL0_2, and capacitor Cfen is coupled to plate_line PL0_$n$. In some embodiments, the plurality of capacitors is coupled to storage node sn1, which is coupled to a drain or source terminal of transistor $MN_1$. For example, a first terminal of capacitor Cfe1 is coupled to PL0_1 and a second terminal of capacitor Cfe1 is coupled to storage node sn1.

In various embodiments, pulse line PLB_x and dielectric capacitor Cd provide common mode compensation. In some embodiments, capacitor Cd is coupled to source or drain terminal of transistor $MN_1$ and to plate-line PLB_x. In various embodiments, one or more circuitries (e.g., driver in logic 203) are provided to apply or drive a voltage on PLB_x. The voltage on PLB_x is opposite to a voltage applied to the selected capacitor (e.g., one of Cfe1, Cfe2, . . . Cfen) via one of the PLs (e.g., one of PL0_1, PL0_2, . . . PL0_$n$) to compensate for dielectric capacitor dependent charge. In some embodiments, PLB_x has a voltage complementary to a voltage on the selected PL (e.g., one of PL0_1, PL0_2, . . . PL0_$n$). In some embodiments, PLBx is complementary to a selected PL for a bit-cell. For example, PLB_x is complementary to PL0_2 (selected in this example) of bit-cell $501_{0,0}$.

While the various embodiments are illustrated with reference to an n-type transistor, the embodiments are also applicable to a p-type transistor or a combination of n-type or p-type transistors. A person skilled in the art would appreciate that when a transistor of a different conductivity type is used, than what is shown in FIG. 5A, then driving logic for BL, PLs, PLB_x, and/or WL may also change for proper read and/or write operations. In various embodiments, PLs are parallel to BL. For example, PL0_1, PL0_2, . . . PL0_$n$ and PLB_x are parallel to BL. In some embodiments, PL0_1, PL0_2, . . . PL0_$n$ and PLB_x are parallel to WL. In some embodiments, transistor $MN_1$ is fabricated on the frontend of the die and capacitors are stacked over the transistor. For example, the capacitors Cfe1 though Cfen and Cd are stacked along the z-direction. The capacitors can be planar or non-planar capacitors. As such, a taller bit-cell is formed with same x-y footprint as the footprint of a 1T1C memory bit-cell. In some embodiments, the x-y footprint is determined by the size of transistor $MN_1$ and its connections to BL, PLB, PLs, WL, and storage node sn1.

In some embodiments, PL (e.g., PL0_1, PL0_2, . . . PL0_$n$) controls which capacitor of the bit-cell is programmed, and the value of programming In some embodiments, BL acts as a sense-line. The voltage on BL (e.g., sense voltage) can create disturbance on other bit-lines during read operation. To mitigate such disturbances, in some embodiments, the 1TnC bit-cell is periodically refreshed (e.g., every 1 second). In some embodiments, periodic refresh is minimized by refreshing in active mode of operation. In standby mode (e.g., low power mode), the 1TnC bit-cell is not refreshed as there is no disturb mechanism during standby. In some embodiments, a wear-leveling logic (not shown) provides one or more endurance mechanisms for the 1TnC memory bit-cells. One of the endurance mechanisms involves refreshing of the data content in the capacitor(s).

Figure 5B:
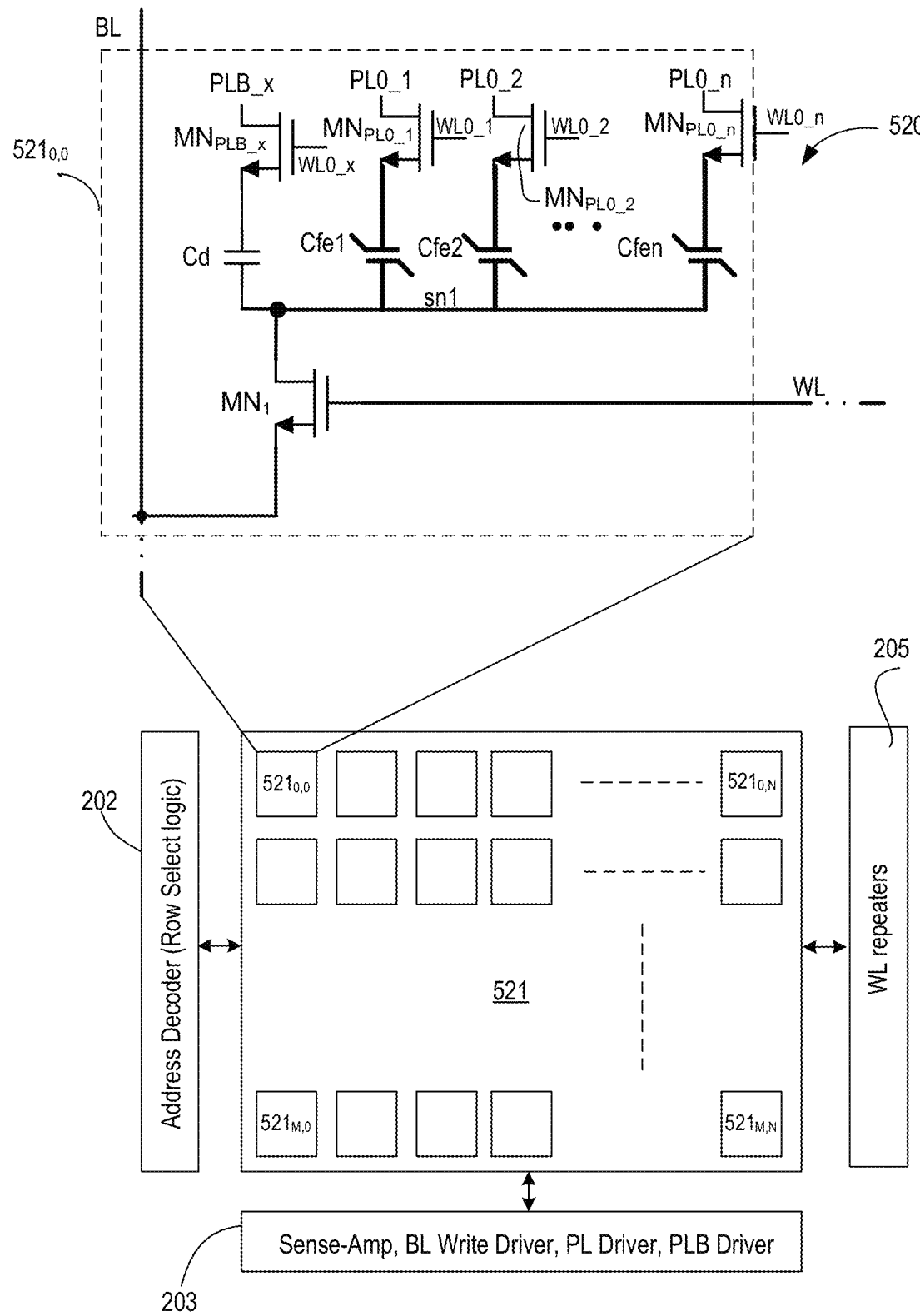
FIG. 5B illustrates an apparatus comprising memory and corresponding logic, wherein the memory comprises non-linear polar material based memory bit-cell, where an individual memory bit-cell includes one transistors and multiple capacitors (1TnC), one compensation capacitor, and individual transistors for each of the multiple capacitors, in accordance with some embodiments.

FIG. 5B illustrates apparatus 520 comprising memory and corresponding logic, wherein the memory comprises non-linear polar material based memory bit-cell, where an individual memory bit-cell includes one transistors and multiple capacitors (1TnC), one compensation capacitor, and individual transistors for each of the multiple capacitors, in accordance with some embodiments. Apparatus 520 is like apparatus 500, but with switches in the path of the plate-lines and hence a different kind of memory bit-cell. These switches are added to remove the charge disturb effect of unselected bit-cells when bit-lines are arranged parallel to the plate-lines. The charge disturb effect here is on the stored state of the capacitors with non-linear polar material. By adding the switches, the plate-lines are no longer directly affecting the charge disturb effect because of the corresponding WLs that controls the switches.

In some embodiments, each memory bit-cell in memory array 521 is organized in rows and columns like in apparatus 520, but with bit-lines running parallel to the plate-lines. For example, memory bit-cells $521_{0,0}$ through $521_{M,N}$ are organized in an array. In some embodiments, n-type transistor $MN_{PLO\_1}$ is coupled to Cfe1 and plate-line PL0_1. In some embodiments, n-type transistor $MN_{PLO\_2}$ is coupled to Cfe2 and plate-line PL0_2. Likewise, in some embodiments, n-type transistor $MN_{PLO\_n}$ is coupled to Cfen and plate-line PL0_$n$. In some embodiments, n-type transistor $MN_{PLB\_x}$ is coupled compensation capacitor Cd and PLB_x. Each transistor (or switch) is controlled separately, in accordance with some embodiments. In some embodiments, transistor $MN_{PLO\_1}$ is controllable by WL0_1, transistor $MN_{PLO\_2}$ is controllable by WL0_2, and so on. Likewise, transistor $MN_{PLO\_n}$ is controllable by WL0_$n$. In some embodiments, transistor $MN_{PLB\_x}$ is controllable by WL0_x. Here, WL0_1 . . . WL0_$n$ are the extensions of an address space. In this case, depending upon which storage element is being programmed or read, the corresponding WL0_1 . . . WL0_$n$ are kept high (e.g., Vdd) whenever the plate-line voltage of 0V or Vdd is applied, while the unselected storage element sees 0V. In some embodiments, PLBx is complementary to a selected PL for a bit-cell. For example, PLB_x is complementary to PL0_2 (selected in this example) of bit-cell $521_{0,0}$.

While the various embodiments are illustrated with reference to an n-type transistors or switches, the embodiments are also applicable to a p-type transistor or a combination of n-type or p-type transistors. A person skilled in the art would appreciate that when a transistor of a different conductivity type is used, than what is shown in FIG. 5B, then driving logic for BL, PLs, PLB_x, and/or WLs may also change for proper read and/or write operations.

In some embodiments, the switches added to the plate-lines are fabricated in different layers of a die. For example, transistor $MN_1$ is fabricated on the frontend of the die while transistors $MN_{PLO\_1}$, $MN_{PLO\_2}$, . . . $MN_{PLO\_n}$, and $MN_{PLB\_x}$ are fabricated in the backend of the die. On one such embodiment, the capacitor Cfe is fabricated between the frontend and the backend of the die. In one example, capacitor Cfe and Cd are vertically stacked capacitors. In some embodiments, each switch and its corresponding coupled capacitor is formed in the backend of the die. In some embodiments, each switch and its corresponding coupled capacitor is stacked vertically. For example, transistor $MN_{PLO\_1}$ and capacitor Cfe1 are stacked vertically in a first vertical stack, and transistor $MN_{PLO\_2}$ and capacitor Cfe2 are stacked vertically in a second vertical stack. These backed transistors or switches can be fabricated using any suitable technology such as IGZO (Indium gallium zinc oxide).

Figure 6A:
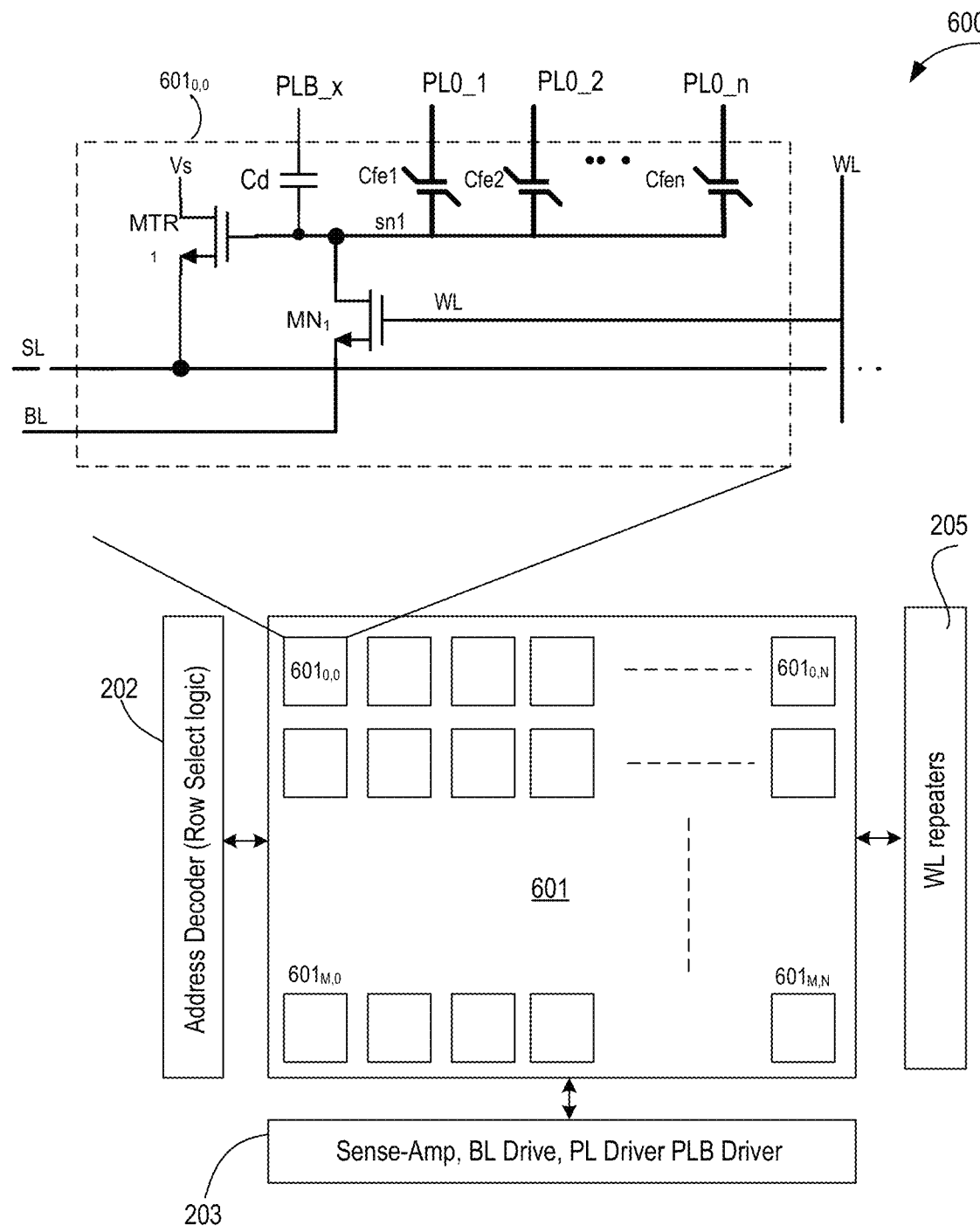
FIG. 6A illustrates an apparatus comprising memory and corresponding logic, wherein the memory comprises non-linear polar material based memory bit-cell, where an individual memory bit-cell includes a multi-element gain memory bit-cell which includes one compensation capacitor, in accordance with some embodiments.

FIG. 6A illustrates apparatus 600 comprising memory and corresponding logic, wherein the memory comprises non-linear polar material based memory bit-cell, where an individual memory bit-cell includes a multi-element gain memory bit-cell which includes one compensation capacitor, in accordance with some embodiments. Apparatus 600 is similar to apparatus 200 of FIG. 2 but for a different kind of memory bit-cell. In some embodiments, each memory bit-cell in memory array 601 is organized in rows and columns like in apparatus 200. For example, memory bit-cells $601_{0,0}$ through $601_{M,N}$ are organized in an array.

In some embodiments, bit-cell $601_{0,0}$ comprises n-type transistor $MN_1$, n-type transistor $MTR_1$, bit-line (BL), word-line (WL), select-line (SL), and 'n' number of ferroelectric (or paraelectric) capacitors Cfe1 through Cfen, dielectric capacitor Cd, 'n; number of plate-lines (e.g., PL0_1 through PL0_n), and PLB_x. In various embodiments, the gate terminal of n-type transistor $MN_1$ is coupled to WL (e.g., WL1). In some embodiments, the drain or source terminal of n-type transistor $MN_1$ is coupled to BL. In various embodiments, first terminals of each of the capacitors Cfe1 through Cfen is coupled to a storage node sn1. The storage node sn1 is coupled to a source or drain terminal of n-type transistor $MN_1$ and to a gate of transistor $MTR_1$. In various embodiments, drain or source terminal of $MTR_1$ is coupled to a bias voltage Vs. In some embodiments, Vs is a programmable voltage that can be generated by any suitable source. Vs voltage helps in biasing the gain transistor in conjunction with the sense-voltage that builds at sn1 node. In some embodiments, the source or drain terminal of transistor $MTR_1$ is coupled to SL (e.g., SL1). In some embodiments, a p-type transistor can be used as well for gain.

In some embodiments, second terminals of each of the capacitors Cfe1 through Cfen is coupled to a corresponding plate-line (PL). For example, the second terminal of Cfe1 is coupled to PL0_1, the second terminal of Cfe2 is coupled to PL0_2, and so on. In some embodiments, capacitor Cd is coupled to source or drain terminal of transistor $MN_1$ and to plate-line PLB_x. In various embodiments, one or more circuitries (driver in logic 203) are provided to apply or drive a voltage on PLB_x. The voltage on PLB_x is opposite to a voltage applied to the selected capacitor (e.g., one of Cfe1, Cfe2, . . . Cfen) via one of the PLs (e.g., one of PL0_1, PL0_2, . . . PL0_n) to compensate for dielectric capacitor dependent charge. In some embodiments, PLB_x has a voltage complementary to a voltage on the selected PL (e.g., one of PL0_1, PL0_2, . . . PL0_n).

In some embodiments, ferroelectric (or paraelectric) capacitors Cfe1 through Cfen are planar capacitors such as those discussed with reference to various embodiments herein. In some embodiments, ferroelectric (or paraelectric) capacitors Cfe1 through Cfen, and dielectric capacitor Cd are pillar capacitors such as those discussed with reference to various embodiments herein. In some embodiments, the ferroelectric (or paraelectric) capacitors Cfe1 through Cfen and dielectric capacitor Cd are vertically stacked allowing for tall bit-cells (e.g., higher in the z-direction) but with x-y footprint two transistors. By folding the capacitors, the diffusion capacitance on the BL reduces for a given array size, which improves reading speed. Further, folding the capacitors lowers the effective routing capacitance on the BL. The larger footprint in the x-y direction of multi-element FE gain bit-cell compared to the footprint in the x-y direction of 1TnC bit-cell, vertical height of the capacitor can be reduced as the capacitors can expand in the x-y direction more than before for a given height. As such, capacitors are folded more effectively. For example, n/2 capacitors per metal or via layer can be packed. In various embodiments, more capacitors can be stacked in multi-element FE gain bit-cell because storage node sn1 is decoupled from the BL. The multi-element FE gain bit-cell reduces the thickness scaling requirement for the pillar capacitor. The polarization density requirements are reduced for multi-element FE gain bit-cell compared to 1TnC bit-cell.

In this example, the x-y footprint is determined by the size of transistor $MN_1$ and its connections to BL, WL, and storage node sn1. In some embodiments, the footprint can still be decided by other factors such as a number of capacitors that connect to the node, and how the capacitors are arranged, e.g., more folding on the same node versus stacking, effective size constraints on those capacitors, and number of capacitors that share the same bit-cell. In some embodiments, PL (e.g., PL0_1, PL0_2, . . . PL_n) controls which cell within the same access transistor gets programmed, and the value of programming In some embodiments, BL acts as a sense-line. The voltage on BL (e.g., sense voltage) can create disturbance on other bit-lines during read operation. To mitigate such disturbances, in some embodiments, multi-element FE gain bit-cell $601_{0,0}$ is periodically refreshed (e.g., every 1 second). In some embodiments, periodic refresh is minimized by refreshing in active mode of operation that can be coupled with advance schemes for wear leveling. In standby mode (e.g., low power mode), multi-element FE gain bit-cell $601_{0,0}$ is not refreshed as there is no disturb mechanism during standby. In some embodiments, multi-element FE gain bit-cell $601_{0,0}$ relies on isolating the read mode from BL or SL capacitance by isolating through access transistor $MN_1$, where $MN_1$ transistor facilitates pre-charging the sn1 node, prior to read operation.

In some embodiments, there is a possibility of disturbance at the storage node sn1 during read operation. In some embodiments, PL is toggled for other capacitors to the average value of the disturbance that will be seen on the sn1 node. i.e., when a read pulse of some polarity is applied at PL line of the capacitor to be read, a non-zero voltage is applied on other PLs of multi-element gain bit-cell $601_{0,0}$ that matches the expected disturbance seen on the shared node. In one such example, PL line driver is configured to support driving different voltage levels on different PLs. In some embodiments, wear-leveling logic (not shown) provides one or more endurance mechanisms for the multi-element gain bit-cells. One of the endurance mechanisms involves refreshing of the data content in the capacitor(s).

While the embodiment of FIG. 6A is illustrated with reference to PLs (e.g., PL0_1, PL0_2, . . . ) and PLB_x being parallel to BL, the common mode compensation scheme using dielectric capacitor Cd is also applicable to bit-cells with PLs (e.g., PL0_1, PL0_2, . . . ) and PLB_x parallel to the WL. Likewise, while the embodiments are described with reference to pillar capacitors, both the first and second capacitors can be planar capacitors, in accordance with some embodiments.

Figure 6B:
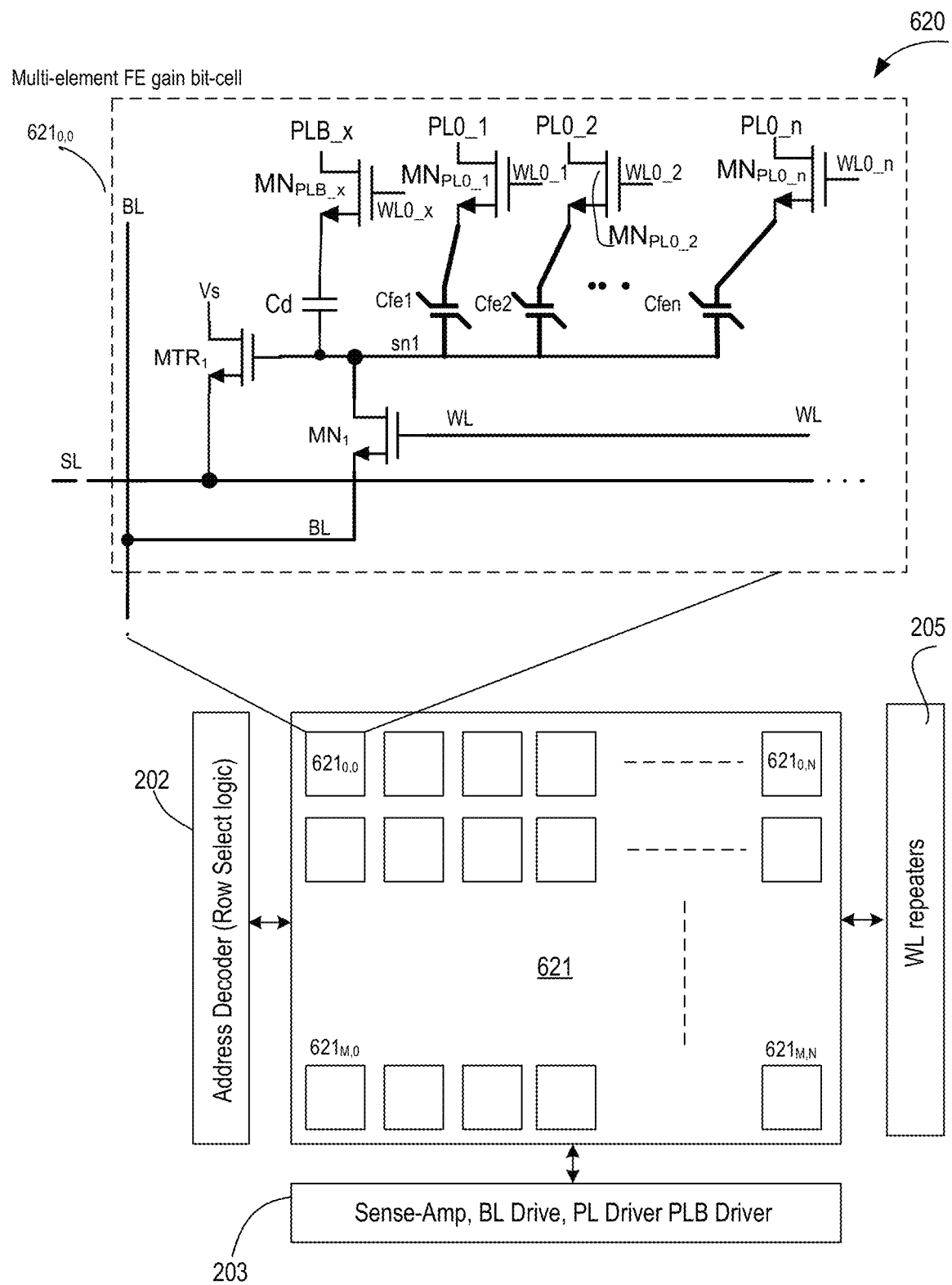
FIG. 6B illustrates an apparatus comprising memory and corresponding logic, wherein the memory comprises non-linear polar material based memory bit-cell, where an individual memory bit-cell includes a multi-element gain memory bit-cell which includes one compensation capacitor and individual transistors for each of the multiple capacitors of the multi-element gain bit-cell, in accordance with some embodiments.

FIG. 6B illustrates apparatus 620 comprising memory and corresponding logic, wherein the memory comprises non-linear polar material based memory bit-cell, where an individual memory bit-cell includes a multi-element gain memory bit-cell which includes one compensation capacitor and individual transistors for each of the multiple capacitors of the multi-element gain bit-cell, in accordance with some embodiments.

Apparatus 620 is like apparatus 600, but with switches in the path of the plate-lines and hence a different kind of memory bit-cell. These switches are added to remove the charge disturb effect of unselected bit-cells when bit-lines are arranged parallel to the plate-lines. The charge disturb effect here is on the stored state of the capacitors with non-linear polar material. By adding the switches, the plate-lines are no longer directly effecting the charge disturb effect because of the corresponding WLs that controls the switches.

In some embodiments, each memory bit-cell in memory array 621 is organized in rows and columns like in apparatus 600, but with bit-lines running parallel to the plate-lines. For example, memory bit-cells $621_{0,0}$ through $621_{M,N}$ are organized in an array. In some embodiments, n-type transistor $MN_{PLO\_1}$ is coupled to Cfe1 and plate-line PL0_1. In some embodiments, n-type transistor $MN_{PLO\_2}$ is coupled to Cfe2 and plate-line PL0_2. Likewise, in some embodiments, n-type transistor $MN_{PLO\_n}$ is coupled to Cfen and plate-line PL0_n. In some embodiments, n-type transistor $MN_{PLB\_x}$ is coupled compensation capacitor Cd and PLB_x. Each transistor (or switch) is controlled separately, in accordance with some embodiments. In some embodiments, transistor $MN_{PLO\_1}$ is controllable by WL0_1, transistor $MN_{PLO\_2}$ is controllable by WL0_2, and so on. Likewise, transistor $MN_{PLO\_n}$ is controllable by WL0_n. In some embodiments, transistor $MN_{PLB\_x}$ is controllable by WL0_x. Here, WL0_1 . . . WL0_n are the extensions of an address space. In this case, depending upon which storage element is being programmed or read, the corresponding WL0_1 . . . WL0_n are kept high (e.g., Vdd) whenever the plate-line voltage of 0V or Vdd is applied, while the unselected storage element sees 0V.

While the various embodiments are illustrated with reference to an n-type transistors or switches, the embodiments are also applicable to a p-type transistor or a combination of n-type or p-type transistors. A person skilled in the art would appreciate that when a transistor of a different conductivity type is used, than what is shown in FIG. 6B, then driving logic for BL, PLs, PLB_x, and/or WLs may also change for proper read and/or write operations.

In some embodiments, the switches added to the plate-lines are fabricated in different layers of a die. For example, transistor $MN_1$ is fabricated on the frontend of the die while transistors $MN_{PLO\_1}$, $MN_{PLO\_2}$, . . . $MN_{PLO\_n}$, and $MN_{PLB\_x}$ are fabricated in the backend of the die. On one such embodiment, the capacitor Cfe is fabricated between the frontend and the backend of the die. In one example, capacitor Cfe and Cd are vertically stacked capacitors. In some embodiments, each switch and its corresponding coupled capacitor is formed in the backend of the die. In some embodiments, each switch and its corresponding coupled capacitor is stacked vertically. For example, transistor $MN_{PLO\_1}$ and capacitor Cfe1 are stacked vertically in a first vertical stack, and transistor $MN_{PLO\_2}$ and capacitor Cfe2 are stacked vertically in a second vertical stack. These backed transistors or switches can be fabricated using any suitable technology such as IGZO (Indium gallium zinc oxide).

Figure 7A:
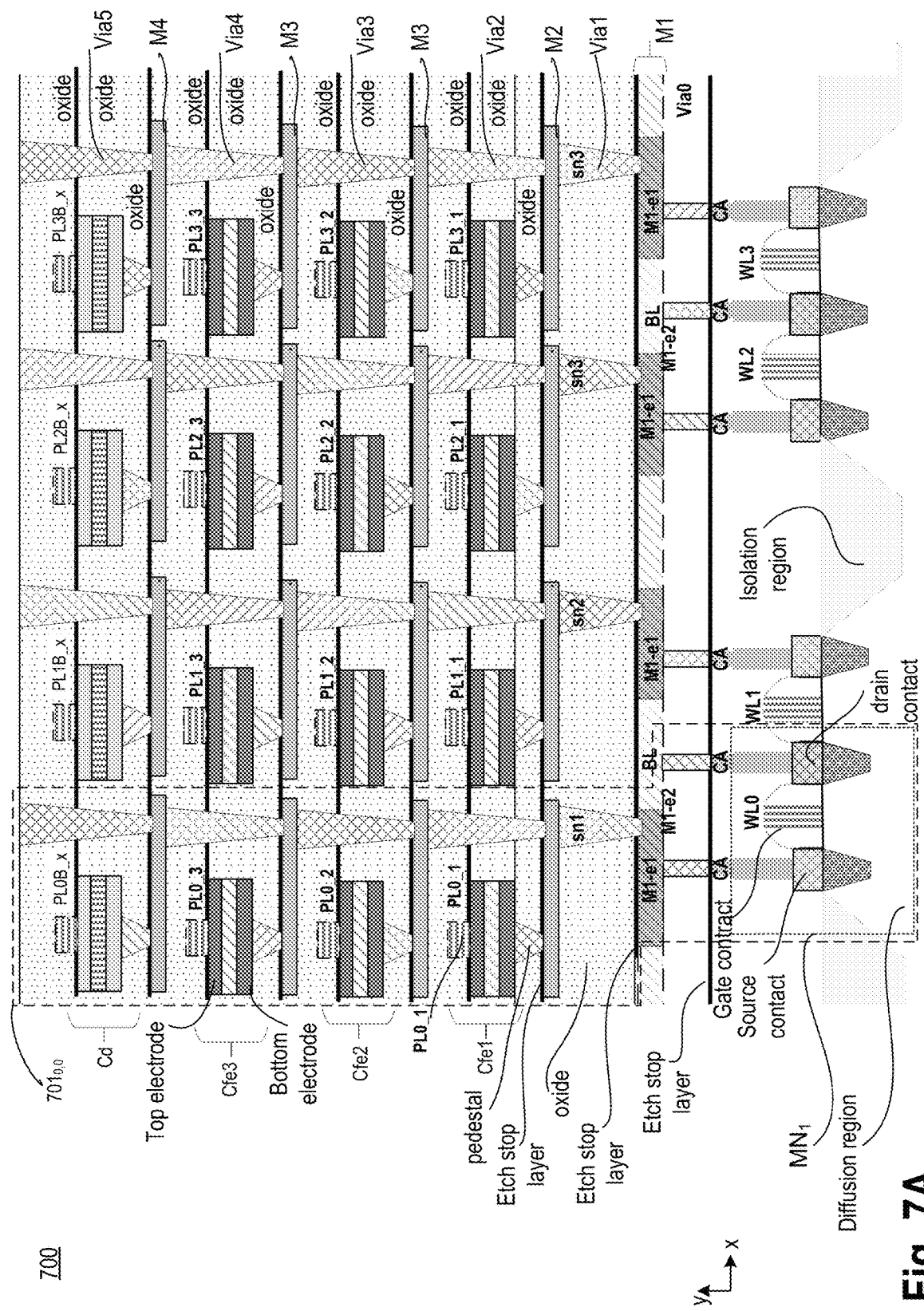
FIG. 7A illustrates a cross-sectional view of 1TnC bit-cells with stacked planar non-linear polar material based capacitors and a planar dielectric capacitor, in accordance with some embodiments.

FIG. 7A illustrates a cross-sectional view 700 of 1TnC bit-cells with stacked planar non-linear polar material based capacitors and a planar dielectric capacitor, in accordance with some embodiments. In this example, four transistors are shown, each controlled by its respective WL on its gate terminal. The source and drain terminals of each transistor is coupled to respective contacts (CA). A pair of transistors are grouped together and separated from other pairs via isolation region. Etch stop layer is used in the fabrication of vias (via0) to connect the source and drain of the transistors to BLs on metal-1 (M) layer. Another etch stop layer is formed over M1 layer to fabricate vias (via1) to couple to respective M1 layers. In some embodiments, metal-2 (M2) is deposited over vias (via1). M2 layer is then polished. In some embodiments, the capacitor can be moved further up in the stack, where the capacitor level processing is done between different layers. In some embodiments, BL can be escaped on a different layer than shown. Here, bit-cell $701_{0,0}$ illustrate one 1TnC bit-cell with dielectric capacitor Cd.

In some embodiments, oxide is deposited over the etch stop layer. Thereafter, dry, or wet etching is performed to form holes for pedestals. The holes are filled with metal and land on the respective M2 layers. Fabrication processes such as interlayer dielectric (ILD) oxide deposition followed by ILD etch (to form holes for the pedestals), deposition of metal into the holes, and subsequent polishing of the surface are used to prepare for post pedestal fabrication.

A number of fabrication processes of deposition, lithography, and etching takes place to form the stack of layers for the planar capacitor. In some embodiments, the planar ferroelectric or paraelectric capacitors are formed in a backend of the die. In some embodiments, deposition of ILD is followed by surface polish. In some embodiments, PL is formed over top electrode of each capacitor. In this case, after polishing the surface, ILD is deposited, in accordance with some embodiments. Thereafter, holes are etched through the ILD to expose the top electrodes of the capacitors, in accordance with some embodiments. The holes are then filled with metal, in accordance with some embodiments. Followed by filling the holes, the top surface is polished, in accordance with some embodiments. As such, the capacitors are connected to PL and storage nodes (through the pedestals), in accordance with some embodiments.

In some embodiments, ILD is deposited over the polished surface. Holes for via are then etched to contact the M2 layer, in accordance with some embodiments. The holes are filled with metal to form vias (via2), in accordance with some embodiments. The top surface is then polished, in accordance with some embodiments. In some embodiments, process of depositing metal over the vias (via2), depositing ILD, etching holes to form pedestals for the next capacitors of the stack, forming the capacitors, and then forming vias that contact the M3 layer are repeated. This process is repeated 'n' times for forming 'n' capacitors in a stack, in accordance with some embodiments. In some embodiments, the dielectric capacitor Cd (shown with a different shaded capacitor) is formed in the stack over the stacks of non-linear polar material based capacitors. One terminal of Cd is coupled to the storage node (e.g., sn1) and the other terminal of Cd is coupled to a complementary PL (e.g., PL0B_x). In some embodiments, the dielectric capacitor Cd is formed in the stack in the middle of the stack of non-linear polar material based capacitors. In some embodiments, the dielectric capacitor Cd is formed as the first capacitor of the stack of non-linear polar material based capacitors.

In some embodiments, the bottom electrode of each capacitor is allowed to directly contact with the metal below. In this embodiment, the height of the stacked capacitors is lowered, and the fabrication process is simplified because the extra steps for forming the pedestals are removed.

In some embodiments, pedestals or vias are formed for both the top and bottom electrodes of the non-linear polar material based capacitor and/or the Cd capacitor. In this embodiment, the height of the stacked capacitors is raised, and the fabrication process adds an additional step of forming a top pedestal or via which contacts with a respective PL. In some embodiments, a similar structure can be used for the multi-element gain memory bit-cell having the dielectric capacitor.

FIG. 7B illustrates a cross-section view 720 and possible structures of the planar non-linear polar material based capacitors 721, 722, or 723 used in FIG. 7A, in accordance with some embodiments.

FIG. 7C illustrates a cross-section view 730 and possible structure of the planar dielectric capacitor Cd used in FIG. 7A, in accordance with some embodiments.

Figure 8:
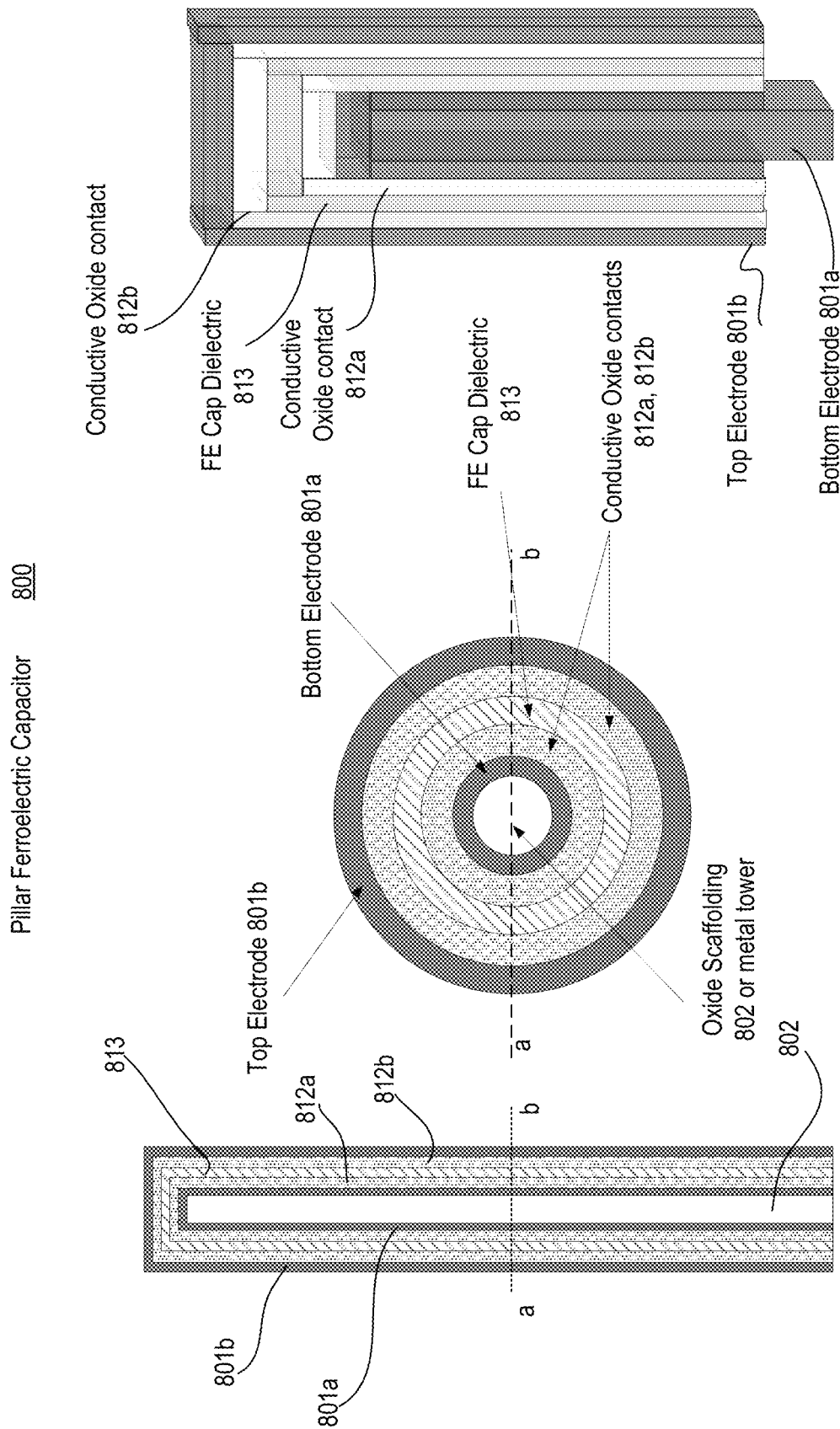
FIG. 8 illustrates a pillar FE capacitor including cross-sectional views and a 3D view, in accordance with some embodiments.

FIG. 8 illustrates a pillar FE capacitor 800 including cross-sectional views and a 3D view, in accordance with some embodiments. In various embodiments, FE pillar capacitor 800 is cylindrical in shape. In some embodiments, FE pillar capacitor 800 is rectangular in shape. Taking the cylindrical shaped case for example, in some embodiments, the layers of FE pillar capacitor 800 from the center going outwards include oxide scaffolding 802, bottom electrode 801a, first conductive oxide 812a, FE material 813, second conductive oxide 812b, and top electrode 801b. A cross-sectional view along the "ab" dashed line is illustrated in the middle of FIG. 8. In some embodiments, bottom electrode 801a is conformally deposited over oxide scaffolding 802 (e.g., SiO2 or any other suitable dielectric). In some embodiments, first conductive oxide 812a is conformally deposited over bottom electrode 801a. In some embodiments, FE material 813 is conformally deposited over first conductive oxide 812a. In some embodiments, second conductive oxide 812b is conformally deposited over FE material 813. In some embodiments, top electrode 801b is conformally deposited over second conductive oxide 812b. In some embodiments, the oxide scaffolding is etched and metal is deposited into it which becomes part of bottom electrode 801a. In some embodiments, a top section of FE pillar capacitor 800 that forms an upside-down 'U' shape is chopped off (e.g., by etching). This allows bottom electrode 801a to be accessible from the top and bottom of FE pillar capacitor 800, where bottom electrode 801a is in the center while top electrode 801b is on an outer circumference of FE pillar capacitor 800.

In some embodiments, wherein bottom electrode 801a (herein first layer) has a first circumference, wherein first conductive oxide 812a (herein second layer) has a second circumference, wherein FE material 813 (herein third layer) has a third circumference, wherein second conductive oxide 812b (herein fourth layer) has a fourth circumference, and wherein the top electrode 801b (herein fifth layer) has a fifth circumference. In some embodiments, the fourth circumference is larger than the third circumference, wherein the third circumference is larger than the second circumference, and wherein the second circumference is larger than the first circumference.

In various embodiments, the choice of materials for FE pillar capacitor 800 are similar to the choice of material for the FE planar capacitor of FIG. 3A. For example, the materials for FE pillar capacitor 800 can be selected from a same group of materials listed for the FE planar capacitor FIG. 3A. In various embodiments, material for bottom electrode 801a corresponds to bottom electrode 309b, material for first conductive oxide 812a corresponds to first conductive oxide 312a, FE material 813 corresponds to FE material 313, material for second conductive oxide 812b corresponds to second conductive oxide 312b, and material for top electrode 801a corresponds to top electrode 309a. In some embodiments, a first refractive inter-metallic layer (not shown) is formed between FE material 813 and first conductive oxide 812a. In some embodiments, a second refractive inter-metallic layer (not shown) is formed between FE material 813 and second conductive oxide 812b. In these cases, the first and second refractive inter-metallic layers are directly adjacent to their respective conductive oxide layers and to FE material 813. Refractive inter-metallic maintains the FE properties of the FE material 813. In the absence of refractive inter-metallic, the ferroelectric material 813 (or the paraelectric material) of pillar capacitor 800 may lose its potency. In some embodiments, refractive inter-metallic comprises Ti and Al (e.g., TiAl compound). In some embodiments, refractive inter-metallic comprises one or more of Ta, W, and/or Co. Material discussed with reference to layers 311a and 311b can be used for the first and second refractive inter-metallic layers here. The thicknesses of the layers of FE pillar capacitor 800 are of the same range as similar layers discussed in FIG. 3A for a planar FE capacitor.

Figure 9A:
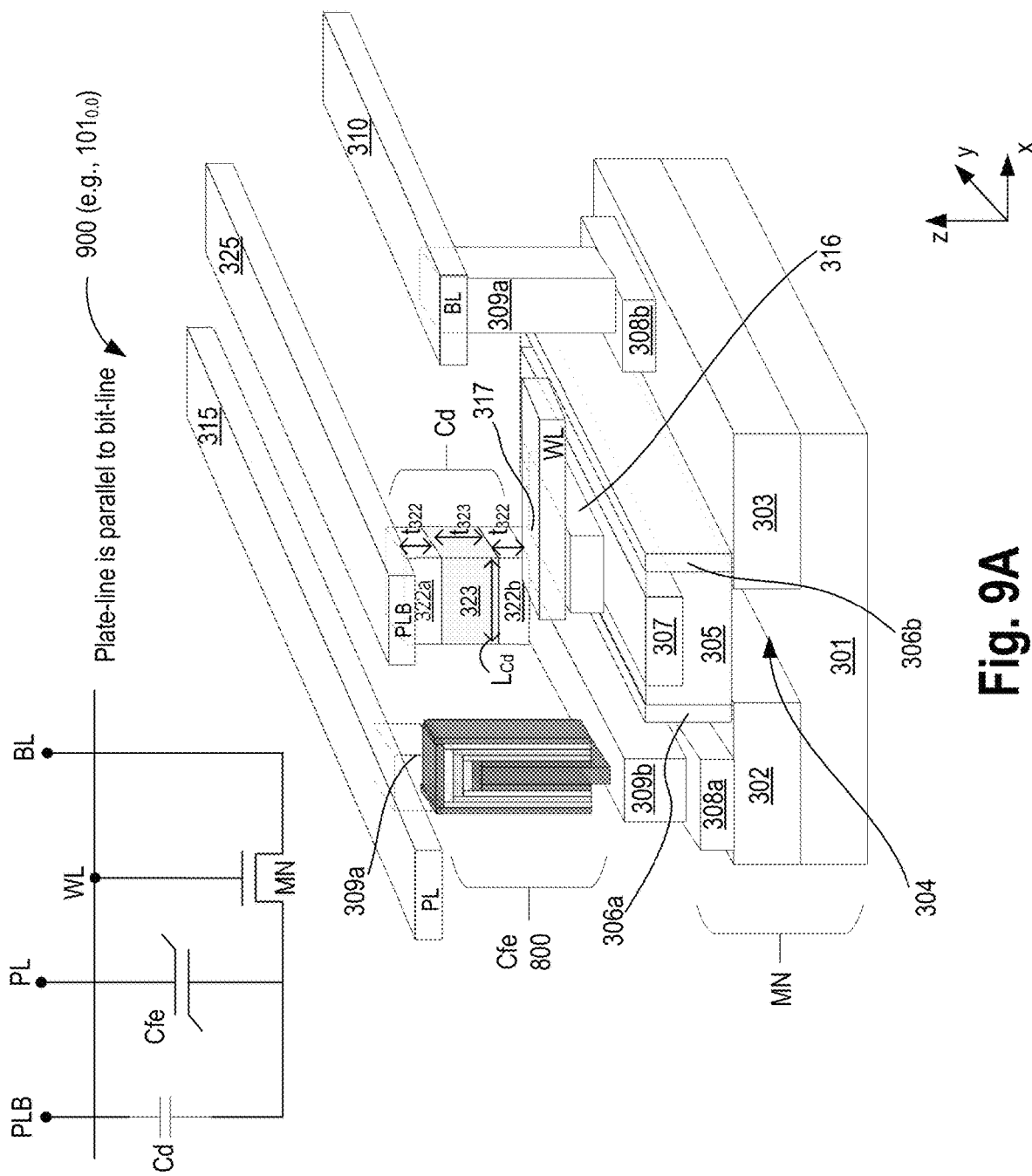
FIG. 9A illustrates a 3D view of a 1T1C bit-cell where the transistor is a planar transistor and where the capacitor is a non-planar capacitor with non-linear polar material, and where the bit-cell includes a compensation capacitor, in accordance with some embodiments.

FIG. 9A illustrates a 3D view of a 1T1C bit-cell 900 where the transistor MN is a planar transistor and where the capacitor is a non-planar capacitor 800 with non-linear polar material, where the bit-cell includes a compensation capacitor Cd, in accordance with some embodiments. The layers and/or structures of bit-cell 900 are described with reference to FIG. 3A and FIG. 8. Here, planar capacitor Cfe of FIG. 3A is replaced with a pillar capacitor 800.

Figure 9B:
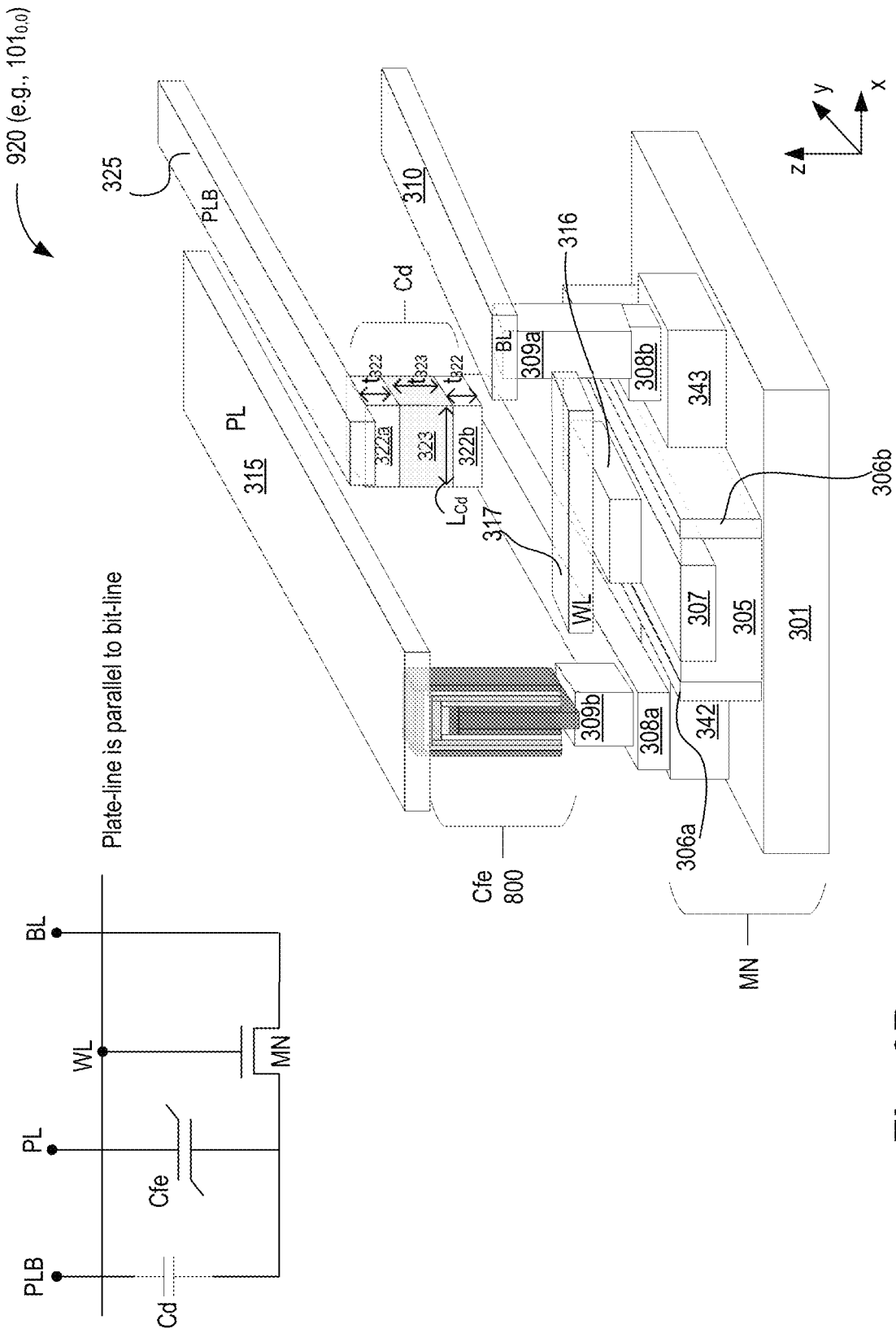
FIG. 9B illustrates a 3D view of a 1T1C bit-cell where the transistor is a non-planar transistor and where the capacitor is a non-planar capacitor with non-linear polar material, and where the bit-cell includes a compensation capacitor, in accordance with some embodiments.

FIG. 9B illustrates a 3D view of a 1T1C bit-cell 920 where the transistor is a non-planar transistor and where the capacitor is a non-planar capacitor 800 with non-linear polar material, where the bit-cell includes a compensation capacitor Cd, in accordance with some embodiments. The layers and/or structures of bit-cell 920 are described with reference to FIG. 3B and FIG. 8. Here, planar capacitor Cfe of FIG. 3B is replaced with a pillar capacitor 800.

Figure 10:
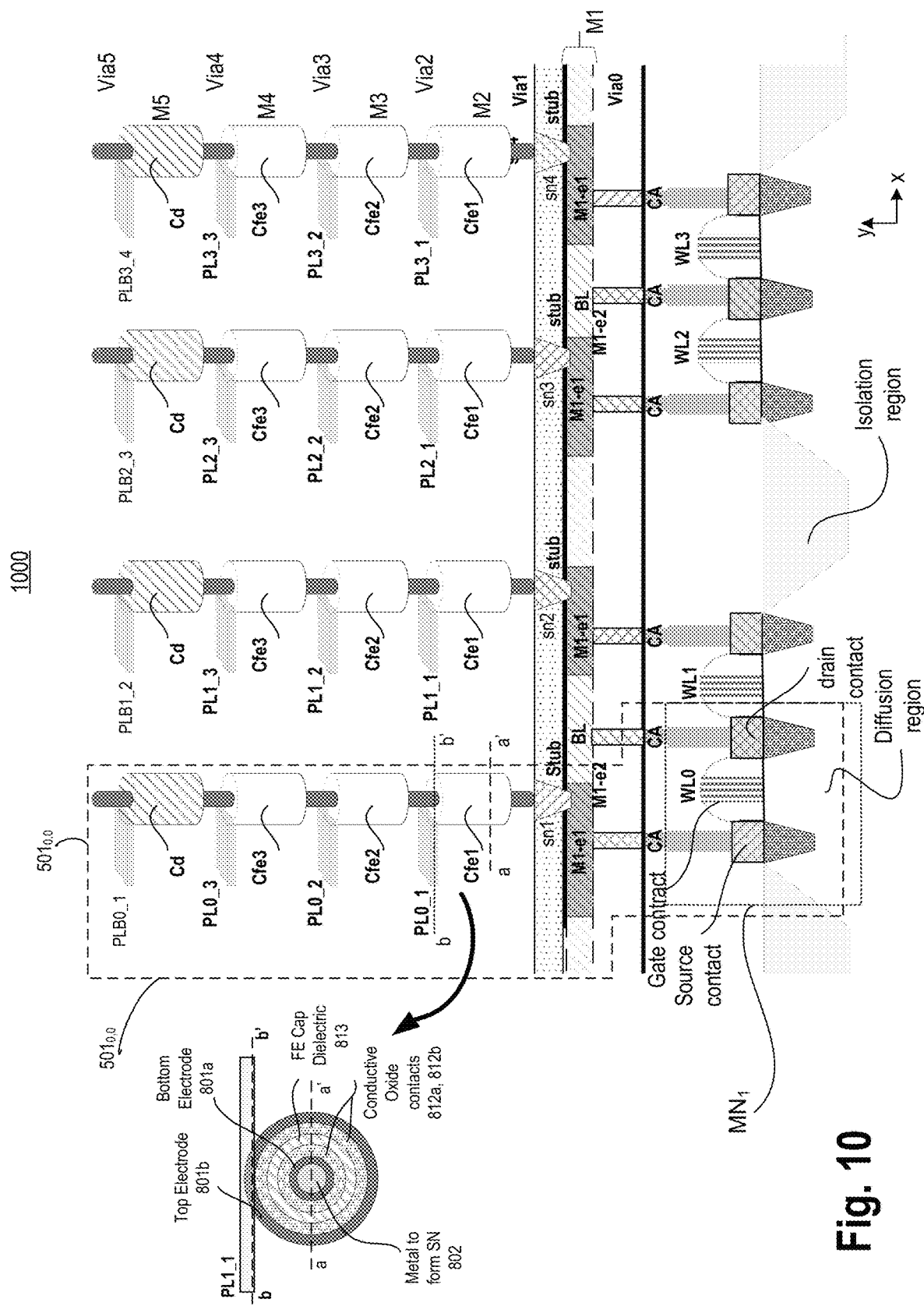
FIG. 10 illustrates a cross-sectional view of 1TnC bit-cells with stacked non-planar non-linear polar material based capacitors and a non-planar dielectric capacitor, in accordance with some embodiments.

FIG. 10 illustrates a cross-sectional view 1000 of 1TnC bit-cells with stacked non-planar non-linear polar material based capacitors and a non-planar dielectric capacitor, in accordance with some embodiments. In this example four 1TnC bit-cells are shown, where 'n' is three, plus a dielectric capacitor. Each group of capacitors for a bit-cell has a column of shared metal passing through the center of the capacitors, where the shared metal is the storage node which is coupled to the stub and then to the source or drain terminal. Top electrode of each of the capacitor is partially adjacent to a respective plate-line. In this instance, the capacitors are formed between regions reserved for Via1 through Via5 (e.g., between M1 through M6 layers). In some embodiments, the dielectric capacitor Cd is formed in the stack over the stacks of non-linear polar material based capacitors (e.g., Cfe1, Cfe2, Cfe3). In some embodiments, the dielectric capacitor Cd is formed in the stack in the middle of the stack of non-linear polar material based capacitors. In some embodiments, the dielectric capacitor Cd is formed in as the first capacitor of the stack of non-linear polar material based capacitors.

Figure 11:
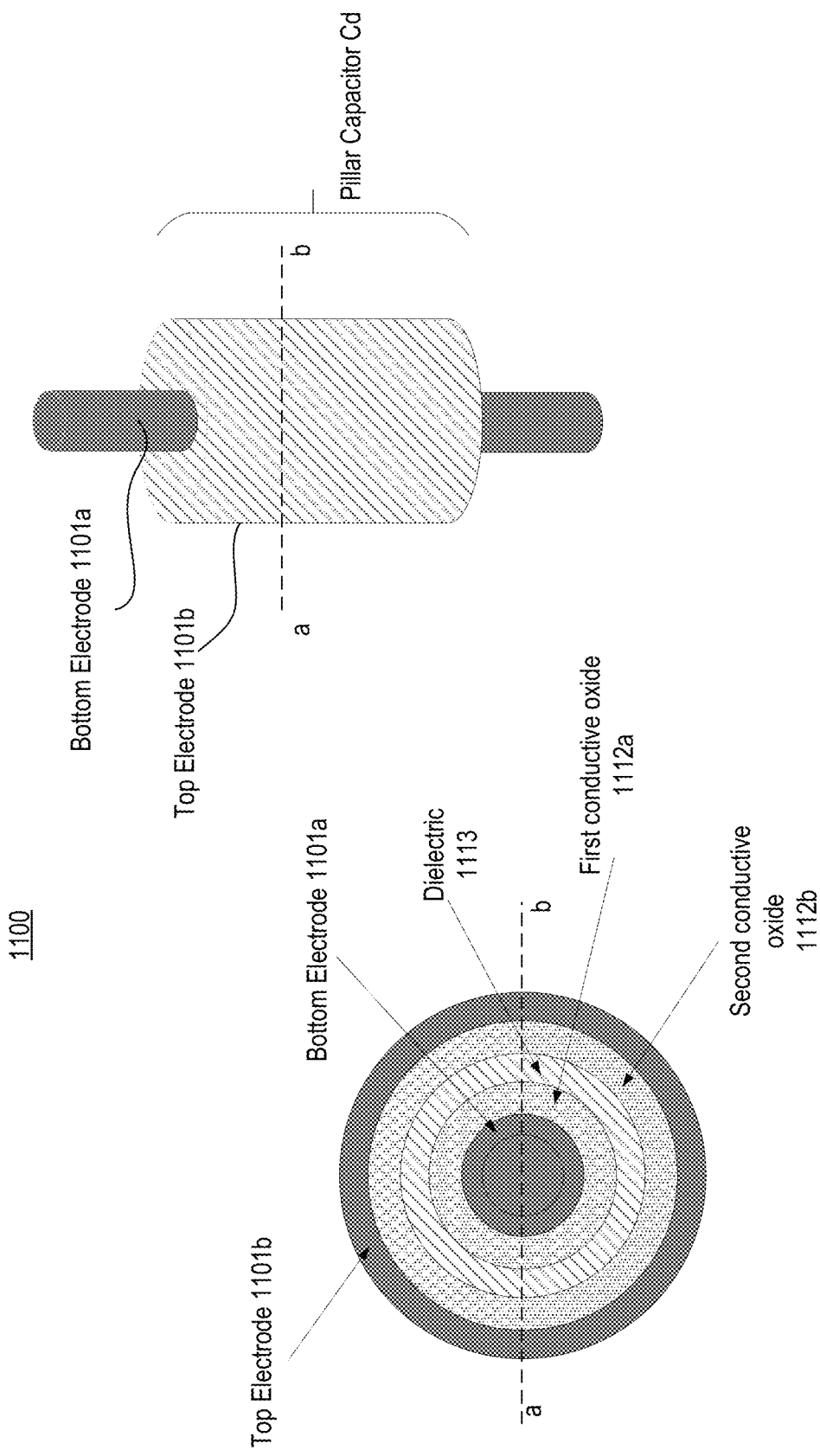
FIG. 11 illustrates a cross-sectional view of a non-planar dielectric capacitor, in accordance with some embodiments.

FIG. 11 illustrates a cross-sectional view of a non-planar dielectric capacitor 1100, in accordance with some embodiments. In some embodiments, non-planar dielectric capacitor 1100 is rectangular in shape. Taking the cylindrical shaped case for example, in some embodiments, the layers of non-planar dielectric capacitor 1100 from the center going outwards include bottom electrode 1101a, first conductive oxide 1112a, linear dielectric material 1113, second conductive oxide 1112b, and top electrode 1101b. A cross-sectional view along the "ab" dashed line is illustrated in the middle of FIG. 11. In some embodiments, conducting oxides are removed and the linear dielectric is directly connected to top electrode 1101b and bottom electrodes 1101a. In some embodiments, linear dielectric material 1113 can include any suitable dielectric, where the thickness of dielectric film is a range of 1 nm to 20 nm. In some embodiments, linear dielectric material 1113 comprises a higher-K dielectric material. In some embodiments, linear dielectrics include one of: SIO2, Al2O3, Li2O, HfSiO4, Sc2O3, SrO, HfO2, ZrO2, Y2O3, Ta2O5, BaO, WO3, MoO3, or TiO2.

In some embodiments, first conductive oxide 1112a is conformally deposited over bottom electrode 1101a. In some embodiments, dielectric material 1113 is conformally deposited over first conductive oxide 1112a. In some embodiments, second conductive oxide 1112b is conformally deposited over dielectric material 1113. In some embodiments, top electrode 1101b is conformally deposited over second conductive oxide 1112b. In some embodiments, bottom electrode 1101a is in the center while top electrode 1101b is on an outer circumference of dielectric capacitor 1100.

In some embodiments, material for bottom electrode 1101a corresponds to bottom electrode 309b, material for first conductive oxide 1112a corresponds to first conductive oxide 312a, material for second conductive oxide 1112b corresponds to second conductive oxide 312b, and material for top electrode 1101b corresponds to top electrode 309a. In some embodiments, a first refractive inter-metallic layer (not shown) is formed between dielectric material 1113 and first conductive oxide 1112a. In some embodiments, a second refractive inter-metallic layer (not shown) is formed between dielectric capacitor material 1113 and second conductive oxide 1112b. In these cases, the first and second refractive inter-metallic layers are directly adjacent to their respective conductive oxide layers and to dielectric capacitor material 1113. In some embodiments, refractive inter-metallic maintains the capacitive properties of the dielectric capacitor material 1113. In some embodiments, refractive inter-metallic comprises Ti and Al (e.g., TiAl compound). In some embodiments, refractive inter-metallic comprises one or more of Ta, W, and/or Co. Material discussed with reference to layers 311a/b can be used for the first and second refractive inter-metallic layers. The thicknesses of the layers of dielectric capacitor 1100 are of the same range as similar layers discussed in FIG. 3A for the planar non-linear polar material based capacitor. In some embodiment, refractive inter-metallic layers are not used for dielectric capacitor Cd.

Figure 12A:
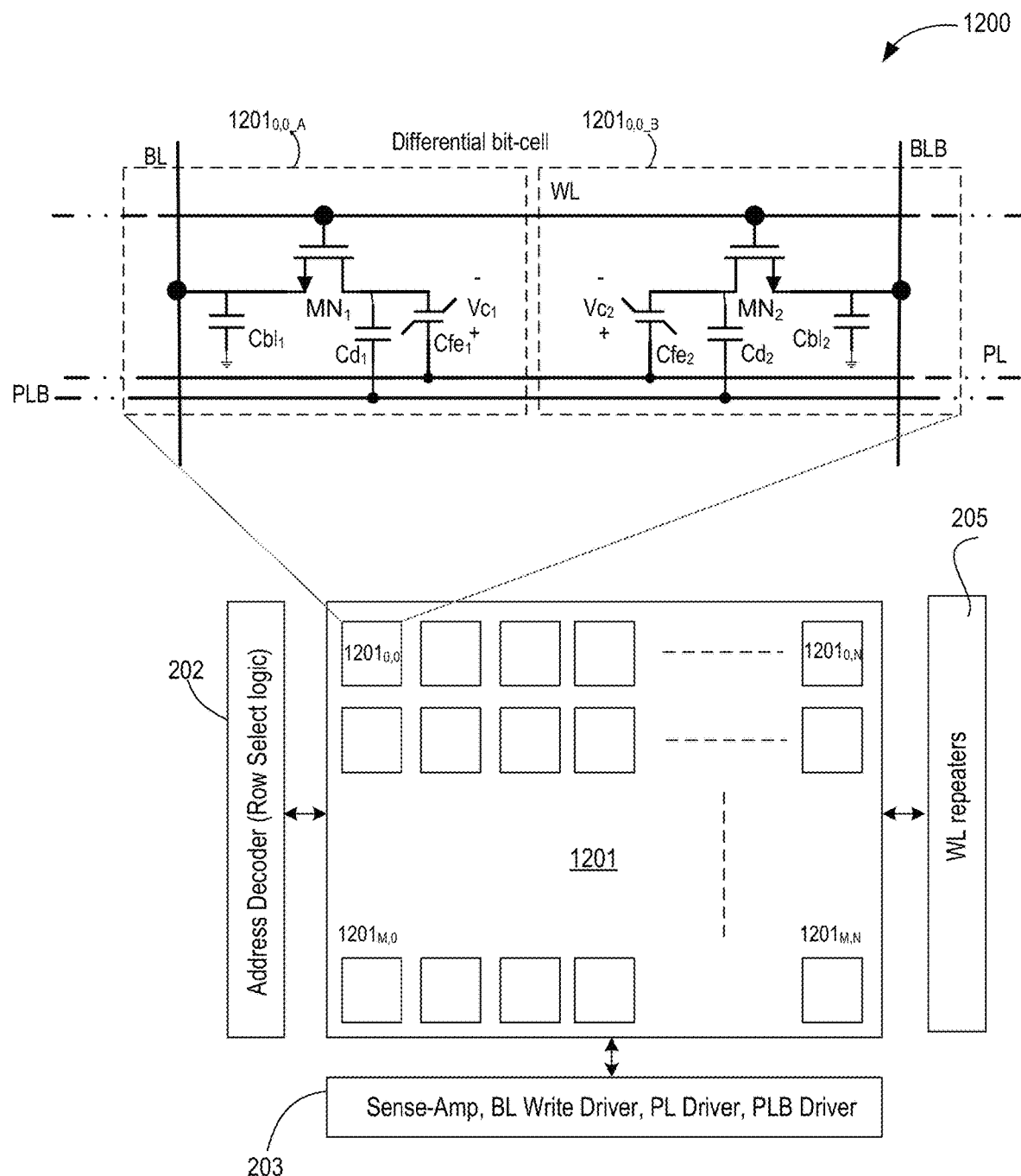
FIG. 12A illustrates an apparatus comprising memory and corresponding logic, wherein the memory comprises non-linear polar material based differential memory bit-cell, where an individual memory bit-cell of the differential memory bit-cell includes 1T1C and one compensation capacitor, in accordance with some embodiments.

FIG. 12A illustrates apparatus 1200 comprising memory and corresponding logic, wherein the memory comprises non-linear polar material based differential memory bit-cell, where an individual memory bit-cell of the differential memory bit-cell includes 1T1C and one compensation capacitor, in accordance with some embodiments. In some cases, single-ended memory bit-cells comprising non-linear polar material may suffer from asymmetry in the switching voltages for positive and negative polarity. This is due to the spatial migration of the atoms from/to the electrode from the ferroelectrics, when the population of 1s and 0s are imbalanced. This makes the use of typical FE capacitors challenging for memory bit-cells because writing 0s or 1s to the FE capacitor may need different energies, which creates an overhead for circuit design.

Some embodiments describe a low power, high-density non-volatile differential memory 1201 with bit-cells that compensate for the asymmetry of typical ferroelectric capacitors. An individual bit-cell includes a compensation capacitor to compensate for common mode. The transistors of the differential memory bit-cell can be planar or non-planar and can be fabricated in the frontend or backend of a die. A bit-cell of the non-volatile differential memory bit-cell comprises first transistor and first non-volatile structure that are controlled to store data of a first value. Another bit-cell of the non-volatile differential memory bit-cell comprises second transistor and second non-volatile structure that are controlled to store data of a second value, wherein the first value is an inverse of the second value. The first and second non-volatile structures comprise low voltage ferroelectric material (e.g., perovskite, hexagonal ferroelectric, or improper ferroelectric) that can switch its state by small voltage change (e.g., 100 mV).

In some embodiments, differential bit-cell $1201_{0,0}$ comprises a word-line (WL), a plate-line (PL), a bit-line (BL), a complementary bit-line (BLB), a complimentary plat-line (PLB), and two half bit-cells $1201_{0,0\_A}$ and $1201_{0,0\_B}$. In some embodiments, first half bit-cell $1201_{0,0\_A}$ comprises an n-type transistor $MN_1$, a FE capacitive structure $Cfe_1$, and a linear dielectric capacitor $Cd_1$. In some embodiments, second half bit-cell $1201_{0,0\_B}$ comprises an n-type transistor $MN_2$, FE capacitive structure $Cfe_2$, and a linear dielectric capacitor $Cd_2$. The gates of transistors $MN_1$ and $MN_2$ share a common WL. In various embodiments, one terminal of first and second FE capacitive structures ($Cfe_1$ and $Cfe_2$) is coupled to common PL. The second terminal of the first and second FE capacitive structures ($Cfe_1$ and $Cfe_2$) is coupled to source or drain terminals of respective transistors. In various embodiments, one terminal of first and second linear dielectric capacitive structures ($Cd_1$ and $Cd_2$) is coupled to a common PLB. The second terminal of the first and second linear dielectric capacitive structures ($Cd_1$ and $Cd_2$) is coupled to source or drain terminals of respective transistors, as shown.

For example, the second terminal of $Cfe_1$ is coupled to the drain or source terminal of transistor $MN_1$, while the second terminal of $Cfe_2$ is coupled to the drain or source terminal of transistor $MN_2$. Likewise, the second terminal of $Cd_1$ is coupled to the drain or source terminal of transistor $MN_1$, while the second terminal of $Cd_2$ is coupled to the drain or source terminal of transistor $MN_2$. In various embodiments, BL is coupled to the source or drain terminal of the first transistor $MN_1$ of the first half-cell $1201_{0,0\_A}$, while BLB is coupled to the source or drain terminal of the second transistor $MN_2$ of the second half-cell $1201_{0,0\_B}$. In some embodiments, a first BL capacitor $CBl_1$ (parasitic capacitor) is coupled to the source or drain terminal of first transistor $MN_1$ and to a reference node (e.g., ground), while a second BL capacitor $CBl_2$ (parasitic capacitor) is coupled to the source or drain terminal of second transistor $MN_2$ and to the reference node such that the FE capacitor is not coupled to the same source or drain terminal. In some embodiments, the effective capacitance of the second capacitor $Cd_1$ is equal (or substantially equal) to a linear component of the capacitance of the first capacitor $Cfe_1$. In some embodiments, the effective capacitance of the second capacitor $Cd_2$ is equal (or substantially equal) to a linear component of the capacitance of the first capacitor $Cfe_2$.

In various embodiments, half bit-cells $1201_{0,0\_A}$ and $1201_{0,0\_B}$ are self-referenced cells due to their proximal location with respect to one another. For example, the static spatial process variations are common mode for $Cfe_1$ and $Cfe_2$ of half bit-cells $1201_{0,0\_A}$ and $1201_{0,0\_B}$, respectively. Here, BL and BLB generate opposite polarity sensing signals. Likewise, PL and PLB provide opposite polarity signals. At first use of the differential memory bit-cell, assume the critical voltages on the FE capacitors $Cfe_1$ and $Cfe_2$ are of the following sequence: +VFe1, +VFe2, −VFe1, −VFe2 critical switching voltages, where +VFe1=+VFe2, −Vfe1=−vfe2 at the first operation of the memory. When the operation of the memory leads to a symmetric switching voltages, +VFe1+DF1, −VFe1+DF1, +VFe2+DF1, −VFe2+DF1, the total switching voltage of half bit-cells $101_{0,0\_A}$ and $101_{0,0\_B}$, remains (+VFe1+DF1)−(−VFe2+DF1)=VFe1+VFe2, allowing for self-compensation of the asymmetry, where DF1 is the offset due to asymmetry. This offset is added to the hysteresis of the behavior of the FE material.

To write data to the differential bit-cell, BL, PL, and BLB generate a signal sequence to write opposite polarity to half bit-cells $1201_{0,0\_A}$ and $1201_{0,0\_B}$. For example, if logic 1 is written to half bit-cells $1201_{0,0\_A}$ then logic 0 is written to half bit-cells $1201_{0,0\_B}$. The signal scheme for sensing the data in the differential bit-cell is similar to a sensing scheme for an SRAM (static random-access memory). While the various embodiments are illustrated using n-type transistors, the differential bit-cell can also be implemented using p-type transistors.

While the embodiment of FIG. 12A is illustrated with reference to PL and PLB being parallel to WL, the common mode compensation scheme using dielectric capacitors $Cd_1$ and $Cd_2$ are also applicable to bit-cells with PL and PLB parallel to the BL and BLB. Likewise, while the embodiments are described with reference to pillar capacitors, both the first ($Cfe_1$ and $Cfe_2$) and second ($Cd_1$ and $Cd_2$) capacitors can be planar capacitors, in accordance with some embodiments.

Figure 12B:
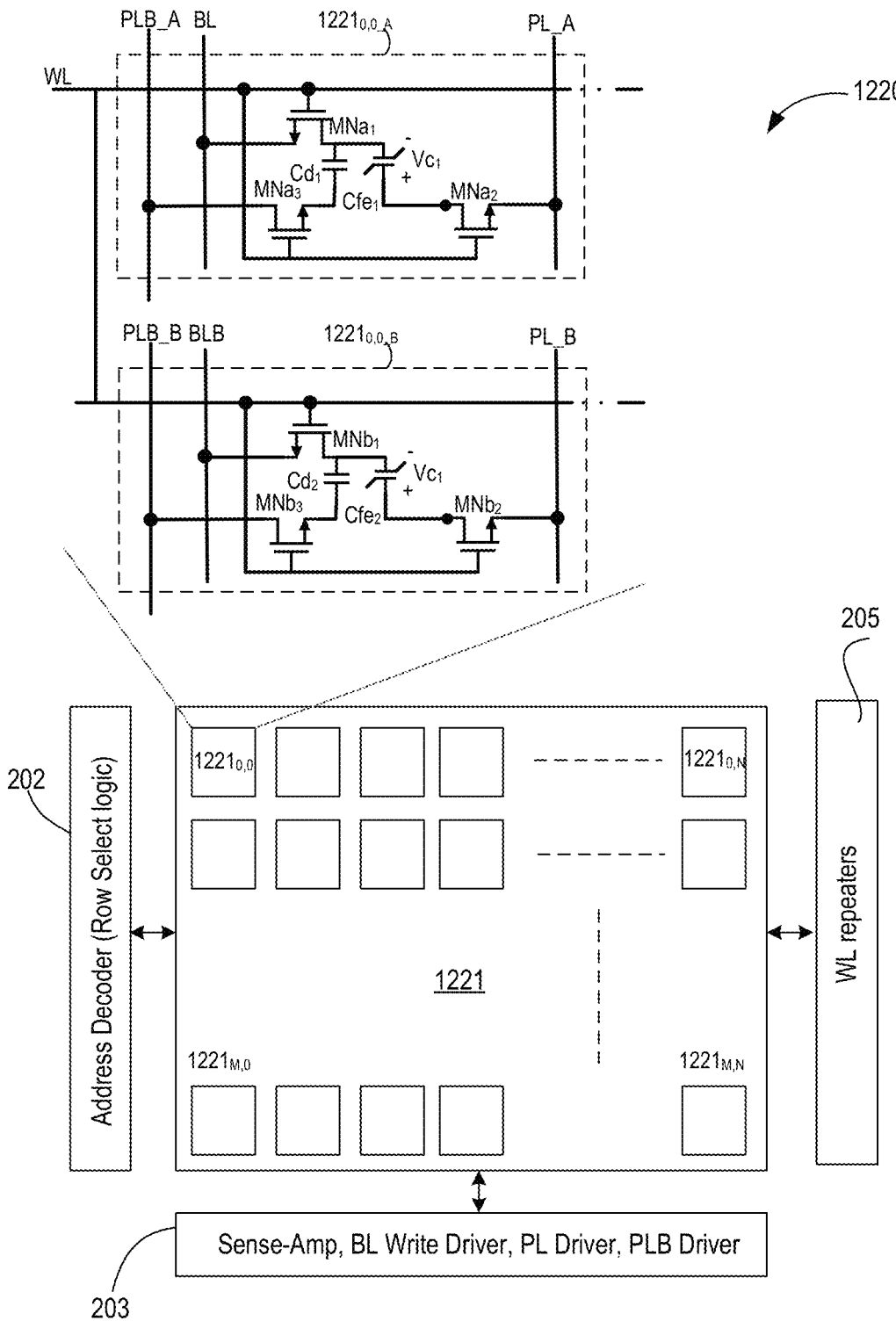
FIG. 12B illustrates an apparatus comprising memory and corresponding logic, wherein the memory comprises non-linear polar material based differential memory bit-cell, where an individual memory bit-cell of the differential memory bit-cell includes three transistors and one capacitor (3T1C) and one compensation capacitor, in accordance with some embodiments.

FIG. 12B illustrates apparatus 1220 comprising memory and corresponding logic, wherein the memory comprises non-linear polar material based differential memory bit-cell, where an individual memory bit-cell of the differential memory bit-cell includes three transistors and one capacitor (3T1C) and one compensation capacitor, in accordance with some embodiments.

In some embodiments, a memory array 1221 comprises rows and columns of differential bit cells $1221_{0,0}$ through $1221_{M,N}$. In some embodiments, differential bit-cell $1221_{0,0}$ comprises a word-line (WL), a first plate-line (PL_A), a bit-line (BL), a complementary bit-line (BLB), a complimentary first plat-line (PLB), a second plate-line (PL_B), a complimentary second plat-line (PLB_B), and two half bit-cells $1221_{0,0\_A}$ and $1221_{0,0\_B}$. Each bit-cell $1221_{0,0\_A}$ and $1221_{0,0\_B}$ includes an implementation of bit-cell $400_{0,0}$.

In some embodiments, first half bit-cell $1221_{0,0\_A}$ comprises an n-type transistor $MNa_1$, a FE capacitive structure $Cfe_1$, and a linear dielectric capacitor $Cd_1$. In some embodiments, second half bit-cell $1221_{0,0\_B}$ comprises an n-type transistor $MNb_1$, FE capacitive structure $Cfe_2$, and a linear dielectric capacitor $Cd_2$. The gates of transistors $MNa_1$ and $MNb_1$ share a common WL. In various embodiments, one terminal of first FE capacitive structure $Cfe_1$ is coupled to PL_A via transistor $MNa_2$. The second terminal of the first FE capacitive structure $Cfe_1$ is coupled to source or drain terminals of transistor $MNa_2$. In various embodiments, one terminal of the second FE capacitive structure $Cfe_2$ is coupled to PL_B via transistor $MNb_2$. The second terminal of the second FE capacitive structure $Cfe_2$ is coupled to source or drain terminals of transistor $MNb_1$.

In various embodiments, one terminal of the first dielectric capacitive structure $Cd_1$ is coupled to PLB_A via transistor $MNa_3$. The second terminal of the first dielectric capacitive structure $Cd_1$ is coupled to source or drain terminals of transistor $MNa_1$. In various embodiments, one terminal of the second dielectric capacitive structure $Cd_2$ is coupled to PLB_B via transistor $MNb_3$. The second terminal of the second dielectric capacitive structure $Cd_2$ is coupled to source or drain terminals of transistor $MNb_1$.

In various embodiments, BL is coupled to the source or drain terminal of the first transistor $MNa_1$ of the first half-cell $1221_{0,0\_A}$, while BLB is coupled to the source or drain terminal of the second transistor $MNb_1$ of the second half-cell $1221_{0,0\_B}$. In some embodiments, the effective capacitance of the second capacitor $Cd_1$ is equal (or substantially equal) to a linear component of the capacitance of the first capacitor $Cfe_1$. In some embodiments, the effective capacitance of the second capacitor $Cd_2$ is equal (or substantially equal) to a linear component of the capacitance of the first capacitor $Cfe_2$.

In various embodiments, half bit-cells $1221_{0,0\_A}$ and $1221_{0,0\_B}$ are self-referenced cells due to their proximal location with respect to one another. For example, the static spatial process variations are common mode for $Cfe_1$ and $Cfe_2$ of half bit-cells $1221_{0,0\_A}$ and $1221_{0,0\_B}$, respectively. Here, BL and BLB generate opposite polarity sensing signals. In some embodiments, BL and BLB are driven complementary signals during write operation but precharged to same signal during read operation.

In some embodiments, PL_A and PLB_A provide opposite polarity signals, and PL_B and PLB_B provide opposite polarity signals relative to one another. In some embodiments, PL_A and PL_B can be driving complimentary signals during write operation while driving same signals during read operation. In some embodiments, PL_A and PL_B can be driving same signals during read and write operations.

In some embodiments, one or more transistors can be formed in a backend of a die. In some embodiments, the dielectric capacitor and the ferroelectric capacitor for each bit-cell can be stacked. The dielectric capacitor and the ferroelectric capacitor can be planar or pillar capacitors.

In some embodiments, the switches added to the plate-lines are fabricated in different layers of a die. For example, transistor $MNa_1$ is fabricated on the frontend of the die while transistors $MNa_2$ and $MNa_3$ are fabricated in the backend of the die. In some embodiments, transistor $MNb_1$ is fabricated on the frontend of the die while transistors $MNb_2$ and $MNb_3$ are fabricated in the backend of the die.

On one such embodiment, the capacitor Cfe is fabricated between the frontend and the backend of the die. In one example, capacitor $Cfe_1$ and $Cd_1$ are vertically stacked capacitors in a first vertical stack, and capacitor $Cfe_2$ and $Cd_2$ are vertically stacked capacitors in a second vertical stack. In some embodiments, each transistor and its corresponding coupled capacitor(s) are formed in the backend of the die. In some embodiments, each transistor and its corresponding coupled capacitor(s) is stacked vertically. For example, transistor $MNa_2$ and capacitor $Cfe_1$ of bit-cell $1221_{0,0\_A}$ are stacked vertically in a first vertical stack structure, and $MNa_3$ and capacitor $Cd_1$ of bit-cell $1221_{0,0\_A}$ are stacked vertically in a second vertical stack structure. In some embodiments, the first vertical stack structure is above the second vertical stack structure. In some embodiments, the first vertical stack structure is on the same set of layers as the second vertical stack structure.

In some embodiments, transistor $MNb_2$ and capacitor $Cfe_2$ of bit-cell $1221_{0,0\_B}$ are stacked vertically in a third vertical stack structure, and $MNb_3$ and capacitor $Cd_1$ of bit-cell $1221_{0,0\_B}$ are stacked vertically in a fourth vertical stack structure. In some embodiments, the third vertical stack structure is above the fourth vertical stack structure. In some embodiments, the third vertical stack structure is on the same set of layers as the fourth vertical stack structure. These backed transistors or switches can be fabricated using any suitable technology such as IGZO (Indium gallium zinc oxide).

Figure 13A:
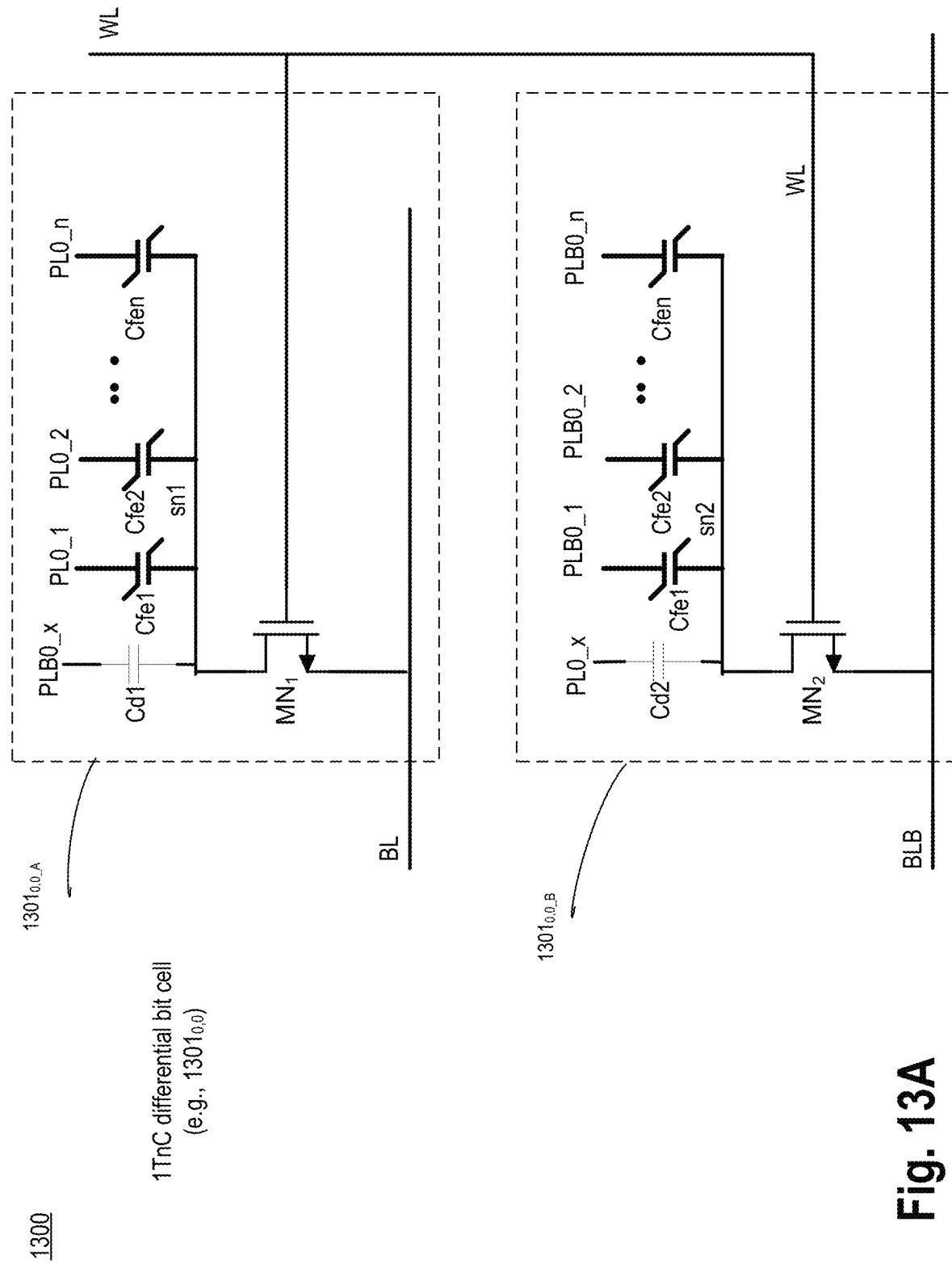
FIG. 13A illustrates an apparatus comprising memory and corresponding logic, wherein the memory comprises non-linear polar material based differential memory bit-cell, where an individual memory bit-cell of the differential memory bit-cell includes 1TnC and one compensation capacitor, in accordance with some embodiments.

FIG. 13A illustrates apparatus 1300 comprising memory and corresponding logic, wherein the memory comprises non-linear polar material based differential memory bit-cell, where an individual memory bit-cell of the differential memory bit-cell includes 1TnC and one compensation capacitor, in accordance with some embodiments.

Bit-cell $1301_{0,0\_A}$ comprises two copies of bit-cell $501_{0,0}$, where one bit-cell is complementary to the other. Here, two bit-cells are shown $1301_{0,0\_A}$ and $1301_{0,0\_B}$, that together form 1TnC differential bit-cell $1301_{0,0}$. Both bit-cells share a common WL, and each bit-cell has its own transistor. In this example, the plate-lines are parallel to the WLs. In some embodiments, the plate-lines (e.g., $PLB_{0\_1}$, $PLB_{0\_2}$, through PLB0_$n$) for bit-cell $1301_{0,0\_B}$ are inverse or complementary of the plate-lines (e.g., PL0_1, PL0_2, through PL0_$n$) for bit-cell $1301_{0,0\_A}$. The same is true for bit-lines, in accordance with some embodiments. For example, the bit-line (BLB) for bit-cell $1301_{0,0\_B}$ is an inverse or complementary of the bit-line (BL) for bit-cell $1301_{0,0\_A}$.

In some embodiments, the plate-lines for bit-cell $1301_{0,0\_A}$ and for bit-cell $1301_{0,0\_B}$ may drive the same signals during read or write operations. In one such example, signal driven on PL0_1 is the same as signal driven on PLB0_1 during a read operation but are complementary to one another during a write operation. Similarly, BL and BLB drive complementary signals during a write operation, and can be driving the same signal during a pre-charge phase of a read operation, in accordance with some embodiments.

In some embodiments, signals driven on the plate-lines for both bit-cells of the differential bit-cell are the same during read and write operations. For example, signal driven on PL0_1 is the same as signal driven on PLB0_1 during read and write operations. In one such example, signals driven on BL and BLB are complementary signals during a write operation, and can be driving the same signal during a pre-charge phase of a read operation, in accordance with some embodiments.

In some embodiments, the linear dielectric based capacitor Cd1 is coupled to storage node sn1 and PLB0_$x$, which is an inverse of the PL (e.g., PL0_1, PL0_2, through PL0_$n$) of the selected capacitor for bit-cell $1301_{0,0\_A}$. In some embodiments, the effective capacitance of the second capacitor Cd1 is equal (or substantially equal) to a linear component of the capacitance of the selected non-linear polar material based capacitor of bit-cell $1301_{0,0\_A}$. In some embodiments, the linear dielectric based capacitor Cd$_2$ is coupled to storage node sn2 and PL0_$x$, which is an inverse of the PLB (e.g., PLB0_1, PLB0_2, through PLB0_$n$) of the selected capacitor for bit cell $1301_{0,0\_B}$. In some embodiments, the effective capacitance of the second capacitor Cd$_2$ is equal (or substantially equal) to a linear component of the capacitance of the selected non-linear polar material based capacitor of bit-cell $1301_{0,0\_B}$.

While the embodiment of FIG. 13A is illustrated with reference to PLs (e.g., PL0_1, PL0_2, . . . PL0_$n$) and PLB0_$x$ and PL0_$x$ being parallel to WL, the common mode compensation scheme using dielectric capacitors Cd1 and Cd$_2$ are also applicable to bit-cells with PLs (e.g., PL0_1, PL0_2, . . . PL0_$n$) and PLB0_$x$ and PL0_$x$ parallel to the BL and BLB. Likewise, while the embodiments are described with reference to pillar capacitors, both the first (Cfe1 and Cfe2) and second (Cd1 and Cd2) capacitors can be planar capacitors, in accordance with some embodiments. In some embodiments, PLB0$x$ is complementary to a selected PL for a same bit-cell. For example, PLB0_$x$ is complementary to PL0_2 (selected in this example) of bit-cell $1301_{0,0\_A}$. In some embodiments, PL0$x$ is complementary to a selected PL for a same bit-cell. For example, PL0_$x$ is complementary to $PLB_{0\_2}$ (selected in this example) of bit-cell $1301_{0,0\_B}$. Depending on the read or write operation, in some embodiments, PL0$x$ is either complementary to PLB0_$x$ or same as PL0_$x$.

Figure 13B:
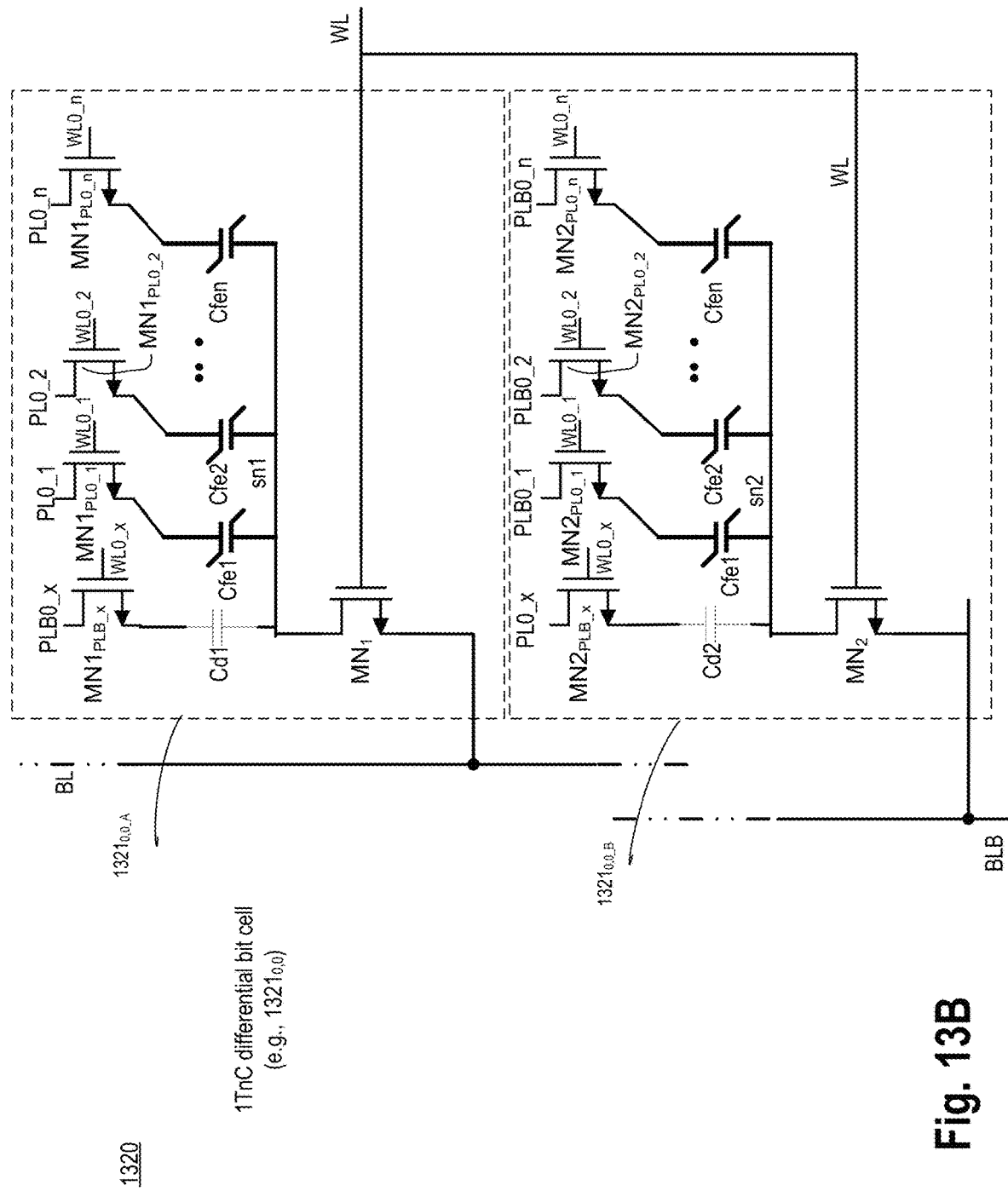
FIG. 13B illustrates an apparatus comprising memory and corresponding logic, wherein the memory comprises non-linear polar material based differential memory bit-cell, where an individual memory bit-cell of the differential memory bit-cell includes 1TnC and one compensation capacitor, and individual transistors for each of the capacitors, in accordance with some embodiments.

FIG. 13B illustrates apparatus 1320 comprising memory and corresponding logic, wherein the memory comprises non-linear polar material based differential memory bit-cell, where an individual memory bit-cell of the differential memory bit-cell includes 1TnC and one compensation capacitor, and individual transistors for each of the capacitors in accordance with some embodiments.

Bit-cell $1321_{0,0\_A}$ comprises two copies of bit-cell $521_{0,0}$, where one bit-cell is complementary to the other. Here, two bit-cells are shown $1321_{0,0\_A}$ and $1321_{0,0\_B}$, that together form 1TnC differential bit-cell $1321_{0,0}$. Both bit-cells share a common WL, and each bit-cell has its own transistor. Apparatus 1320 is like apparatus 1300, but with switches in the path of the plate-lines and hence a different kind of memory bit-cell. These switches are added to remove the charge disturb effect of unselected bit-cells when bit-lines are arranged parallel to the plate-lines. The charge disturb effect here is on the stored state of the capacitors with non-linear polar material. By adding the switches, the plate-lines are no longer directly affecting the charge disturb effect because of the corresponding WLs that controls the switches.

In some embodiments, each memory bit-cell 1321 in a memory array is organized in rows and columns, but with bit-lines running parallel to the plate-lines. For example, memory bit-cells $1321_{0,0}$ through $1321_{M,N}$ (not shown) are organized in an array. In some embodiments, for bit-cell $1321_{0,0\_A}$, n-type transistor $MN1_{PLO\_1}$ is coupled to Cfe1 and plate-line PL0_1. In some embodiments, n-type transistor $MN1_{PLO\_2}$ is coupled to Cfe$_2$ and plate-line PL0_2. Likewise, in some embodiments, n-type transistor $MN1_{PLO\_x}$ is coupled to Cfen and plate-line PLB_$n$. In some embodiments, n-type transistor $MN1_{PLB\_x}$ is coupled compensation capacitor Cd and PL0_$x$. Each transistor (or switch) is controlled separately, in accordance with some embodiments. In some embodiments, transistor $MN_{PLO\_1}$ is controllable by WL0_1, transistor $MN1_{PLO\_2}$ is controllable by WL0_2, and so on. Likewise, transistor $MN1_{PLO\_n}$ is controllable by WL0_$n$. In some embodiments, transistor $MN1_{PLB\_x}$ is controllable by WL0_$x$. Here, WL0_1 . . . WL0_$n$ are the extensions of an address space. In this case, depending upon which storage element is being programmed or read, the corresponding WL0_1 . . . WL0_$n$ are kept high (e.g., Vdd) whenever the plate-line voltage of 0V or Vdd is applied, while the unselected storage element sees 0V.

In some embodiments, for bit-cell $1321_{0,0\_B}$, n-type transistor $MN2_{PLO\_1}$ is coupled to Cfe1 and plate-line PLB0_1. In some embodiments, n-type transistor $MN2_{PLO\_2}$ is coupled to Cfe$_2$ and plate-line PLB0_2. Likewise, in some embodiments, n-type transistor $MN2_{PLO\_n}$ is coupled to Cfen and plate-line PLB0_$n$. In some embodiments, n-type transistor $MN2_{PLB\_x}$ is coupled compensation capacitor Cd and PL0_$x$. Each transistor (or switch) is controlled separately, in accordance with some embodiments. In some embodiments, transistor $MN2_{PLO\_1}$ is controllable by WL0_1, transistor $MN2_{PLO\_2}$ is controllable by WL0_2, and so on. Likewise, transistor $MN2_{PLO\_n}$ is controllable by WL0_$n$. In some embodiments, transistor $MN2_{PLB\_x}$ is controllable by WL0_$x$. Here, WL0_1 . . . WL0_$n$ are the extensions of an address space. In this case, depending upon which storage element is being programmed or read, the corresponding WL0_1 . . . WL0_$n$ are kept high (e.g., Vdd) whenever the plate-line voltage of 0V or Vdd is applied, while the unselected storage element sees 0V.

While the various embodiments are illustrated with reference to an n-type transistors or switches, the embodiments are also applicable to a p-type transistor or a combination of n-type or p-type transistors. A person skilled in the art would appreciate that when a transistor of a different conductivity type is used, than what is shown in FIG. 13B, then driving logic for BL, PLs, PLB_x, and/or WLs may also change for proper read and/or write operations.

In some embodiments, the plate-lines for bit-cell $1321_{0,0\_A}$ and for bit-cell $1321_{0,0\_B}$ may drive the same signals during read or write operations. In one such example, signal driven on PL0_1 is the same as signal driven on PLB0_1 during a read operation but are complementary to one another during a write operation. Similarly, BL and BLB drive complementary signals during a write operation, and can be driving the same signal during a pre-charge phase of a read operation, in accordance with some embodiments.

In some embodiments, signals driven on the plate-lines for both bit-cells of the differential bit-cell are the same during read and write operations. For example, signal driven on PL0_1 is the same as signal driven on PLB0_1 during read and write operations. In one such example, signals driven on BL and BLB are complementary signals during a write operation, and can be driving the same signal during a pre-charge phase of a read operation, in accordance with some embodiments. In some embodiments, PLB0x is complementary to a selected PL for a same bit-cell. For example, PLB0_x is complementary to PL0_2 (selected in this example) of bit-cell $1321_{0,0\_A}$. In some embodiments, PL0x is complementary to a selected PL for a same bit-cell. For example, PL0_x is complementary to PLB0_2 (selected in this example) of bit-cell $1321_{0,0\_B}$. Depending on the read or write operation, in some embodiments, PL0x is either complementary to PLB0_x or same as PL0_x.

In some embodiments, the switches added to the plate-lines are fabricated in different layers of a die. For example, transistor $MN_1$ is fabricated on the frontend of the die while transistors $MN1_{PLO\_1}$, $MN1_{PLO\_2}$, . . . $MN1_{PLO\_n}$, and $MN1_{PLB\_x}$ are fabricated in the backend of the die. In some embodiments, transistor $MN_2$ is fabricated on the frontend of the die while transistors $MN2_{PLO\_1}$, $MN2_{PLO\_2}$, . . . $MN2_{PLO\_n}$, and $MN2_{PLB\_x}$ are fabricated in the backend of the die.

On one such embodiment, the capacitor Cfe is fabricated between the frontend and the backend of the die. In one example, capacitor Cfe and Cd are vertically stacked capacitors. In some embodiments, each switch and its corresponding coupled capacitor is formed in the backend of the die. In some embodiments, each switch and its corresponding coupled capacitor is stacked vertically. For example, transistor $MN1_{PLO\_1}$ and capacitor Cfe1 of bit-cell $1321_{0,0\_A}$ are stacked vertically in a first vertical stack, and transistor $MN1_{PLO\_2}$ and capacitor Cfe2 of bit-cell $1321_{0,0\_A}$ are stacked vertically in a second vertical stack. These backed transistors or switches can be fabricated using any suitable technology such as IGZO (Indium gallium zinc oxide).

Figure 14A:
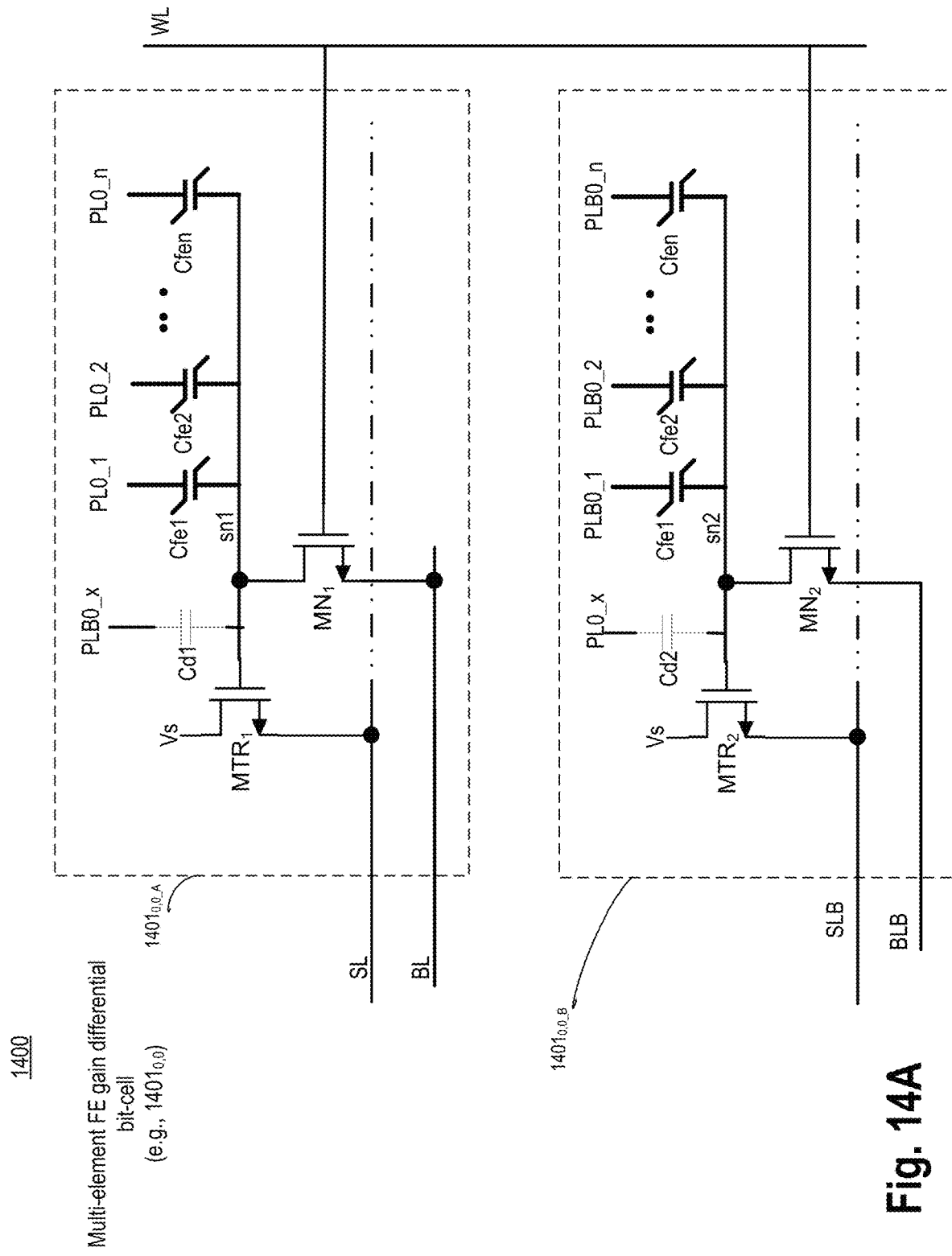
FIG. 14A illustrates an apparatus comprising memory and corresponding logic, wherein the memory comprises non-linear polar material based differential memory bit-cell, where an individual memory bit-cell of the differential memory bit-cell includes multi-element gain cells and one compensation capacitor per cell, in accordance with some embodiments.

FIG. 14A illustrates apparatus 1400 comprising memory and corresponding logic, wherein the memory comprises non-linear polar material based differential memory bit-cell, where an individual memory bit-cell of the differential memory bit-cell includes multi-element gain and one compensation capacitor, in accordance with some embodiments. Bit-cell $1401_{0,0}$ comprises two copies of bit-cell $601_{0,0}$, where one bit-cell is complementary to the other. Here, two bit-cells are shown $1401_{0,0\_A}$ and $1401_{0,0\_B}$, that together form multi-element FE gain differential bit-cell $1401_{0,0}$. Both bit-cells share a common WL, and each bit-cell has its own transistors. In this example, plate-lines PLs are parallel to the word-line WL. In some embodiments, the plate-lines (e.g., PLB0, PLB1, through PLBn) for bit-cell $1401_{0,0\_B}$ are inverse or complementary of the plate-lines (e.g., PL0, PL2, through PLn) for bit-cell $1401_{0,0\_A}$. The same is true for bit-lines and source or select lines. For example, the bit-line (BLB) for bit-cell $1401_{0,0\_B}$ is an inverse or complementary of the bit-line (BL) for bit-cell $1401_{0,0\_A}$, and the select-line (SLB) for bit-cell $1401_{0,0\_B}$ is inverse or complementary of the select-line (SL) for bit-cell $1401_{0,0\_A}$. In various embodiments, SL is connected to transistor $MTR_1$, which has a gate terminal coupled to storage node sn1 and a drain or source terminal coupled to a bias voltage Vs.

In some embodiments, the linear dielectric based capacitor Cd1 is coupled to storage node sn1 and PLB0_x, which is an inverse of the PL (e.g., PL0_1, PL0_2, through PL0_n) of the selected capacitor for bit-cell $1401_{0,0\_A}$. In some embodiments, the effective capacitance of the second capacitor Cd1 is equal (or substantially equal) to a linear component of the capacitance of the selected non-linear polar material based capacitor of bit-cell $1401_{0,0\_A}$. In some embodiments, the linear dielectric based capacitor $Cd_2$ is coupled to storage node sn2 and PLB0_x, which is an inverse of the PL (e.g., PL0_1, PL0_2, through PL0_n) of the selected capacitor for bit cell $1401_{0,0\_B}$. In some embodiments, the effective capacitance of the second capacitor $Cd_2$ is equal (or substantially equal) to a linear component of the capacitance of the selected non-linear polar material based capacitor of bit-cell $1401_{0,0\_B}$. In various embodiments, SLB is connected to transistor $MTR_2$, which has a gate terminal coupled to storage node sn2 and a drain or source terminal coupled to a bias voltage Vs.

While the embodiment of FIG. 14A is illustrated with reference to PLs (e.g., PL0_1, PL0_2, . . . PL0_n) and PLB0_x being parallel to WL, the common mode compensation scheme using dielectric capacitors Cd1 and Cd2 are also applicable to bit-cells with PLs (e.g., PL0_1, PL0_2, . . . PL0_n) and PLB0_x parallel to the BL and BLB. Likewise, while the embodiments are described with reference to pillar capacitors, both the first (Cfe1 and Cfe2) and second (Cd1 and Cd2) capacitors can be planar capacitors, in accordance with some embodiments.

In some embodiments, signals driven on the plate-lines for both bit-cells of the differential bit-cell are same during read and write operations. For example, signal driven on PL0_1 is same as signal driven on PLB0_1 during read and write operations. In one such example, signals driven on BL and BLB are complementary signals during a write operation, and can be driving the same signal during a pre-charge phase of a read operation, in accordance with some embodiments. In some embodiments, SL and SLB have same precharge values but complementary values for sensing.

In some embodiments, PLB0x is complementary to a selected PL for a same bit-cell. For example, PLB0_x is complementary to PL0_2 (selected in this example) of bit-cell $1401_{0,0\_A}$. In some embodiments, PL0x is complementary to a selected PL for a same bit-cell. For example, PL0_x is complementary to $PLB_{0\_2}$ (selected in this example) of bit-cell $1401_{0,0\_B}$. Depending on the read or write operation, in some embodiments, PL0x is either complementary to PLB0_x or same as PL0_x.

Figure 14B:
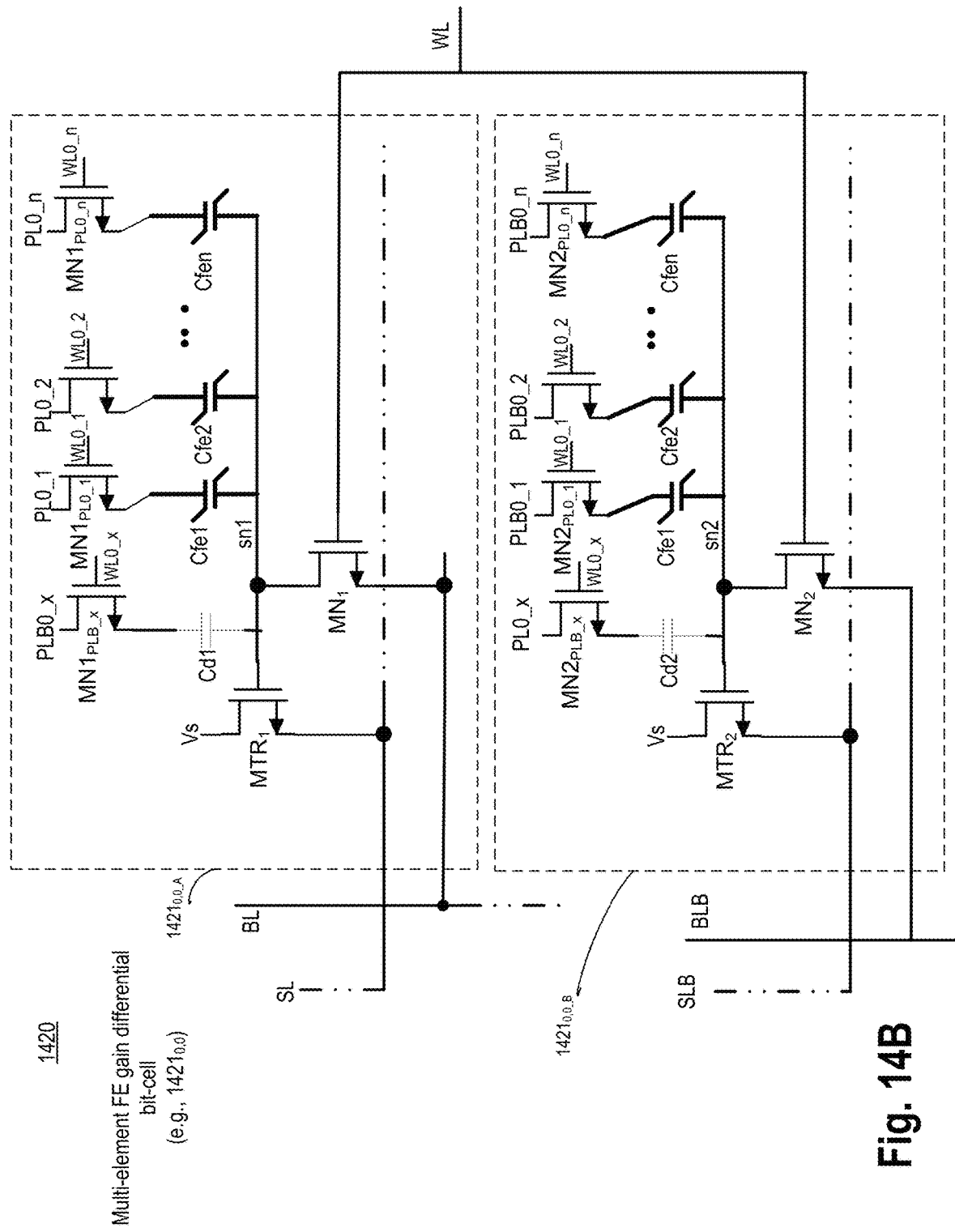
FIG. 14B illustrates an apparatus comprising memory and corresponding logic, wherein the memory comprises non-linear polar material based differential memory bit-cell, where an individual memory bit-cell of the differential memory bit-cell includes multi-element gain cells and one compensation capacitor per cell, and individual transistors for each of the capacitors, in accordance with some embodiments.

FIG. 14B illustrates apparatus 1420 comprising memory and corresponding logic, wherein the memory comprises non-linear polar material based differential memory bit-cell, where an individual memory bit-cell of the differential memory bit-cell includes multi-element gain cells and one compensation capacitor per cell, and individual transistors for each of the capacitors, in accordance with some embodiments.

Bit-cell $1421_{0,0\_A}$ comprises two copies of bit-cell $621_{0,0}$, where one bit-cell is complementary to the other. Here, two bit-cells are shown $1421_{0,0\_A}$ and $1421_{0,0\_B}$, that together form a multi-gain element differential bit-cell $1421_{0,0}$. Both bit-cells share a common WL, and each bit-cell has its own transistor. Apparatus 1420 is like apparatus 1400, but with switches in the path of the plate-lines and hence a different kind of memory bit-cell. These switches are added to remove the charge disturb effect of unselected bit-cells when bit-lines are arranged parallel to the plate-lines. The charge disturb effect here is on the stored state of the capacitors with non-linear polar material. By adding the switches, the plate-lines are no longer directly affecting the charge disturb effect because of the corresponding WLs that control the switches.

In some embodiments, each memory bit-cell 1421 in a memory array is organized in rows and columns, but with bit-lines running parallel to the plate-lines. For example, memory bit-cells $1421_{0,0}$ through $1421_{M,N}$ (not shown) are organized in an array. In some embodiments, for bit-cell $1421_{0,0\_A}$, n-type transistor $MN1_{PLO\_1}$ is coupled to Cfe1 and plate-line PL0_1. In some embodiments, n-type transistor $MN1_{PLO\_2}$ is coupled to Cfe2 and plate-line PL0_2. Likewise, in some embodiments, n-type transistor $MN1_{PLO\_n}$ is coupled to Cfen and plate-line PLB_n. In some embodiments, n-type transistor $MN1_{PLB\_x}$ is coupled to compensation capacitor Cd and PLB0_x. Each transistor (or switch) is controlled separately, in accordance with some embodiments. In some embodiments, transistor $MN_{PLO\_1}$ is controllable by WL0_1, transistor $MN1_{PLO\_2}$ is controllable by WL0_2, and so on. Likewise, transistor $MN1_{PLO\_n}$ is controllable by WL0_n. In some embodiments, transistor $MN1_{PLB\_x}$ is controllable by WL0_x. Here, WL0_1 ... WL0_n are the extensions of an address space. In this case, depending upon which storage element is being programmed or read, the corresponding WL0_1 ... WL0_n are kept high (e.g., Vdd) whenever the plate-line voltage of 0V or Vdd is applied, while the unselected storage element sees 0V.

In some embodiments, for bit-cell $1421_{0,0\_B}$, n-type transistor $MN2_{PLO\_1}$ is coupled to Cfe1 and plate-line PLB0_1. In some embodiments, n-type transistor $MN2_{PLO\_2}$ is coupled to Cfe2 and plate-line PLB0_2. Likewise, in some embodiments, n-type transistor $MN2_{PLO\_n}$ is coupled to Cfen and plate-line PLB0_n. In some embodiments, n-type transistor $MN2_{PLB\_x}$ is coupled to compensation capacitor Cd and PL0_x. Each transistor (or switch) is controlled separately, in accordance with some embodiments. In some embodiments, transistor $MN2_{PLO\_1}$ is controllable by WL0_1, transistor $MN2_{PLO\_2}$ is controllable by WL0_2, and so on. Likewise, transistor $MN2_{PLO\_n}$ is controllable by WL0_n. In some embodiments, transistor $MN2_{PLB\_x}$ is controllable by WL0_x. Here, WL0_1 ... WL0_n are the extensions of an address space. In this case, depending upon which storage element is being programmed or read, the corresponding WL0_1 ... WL0_n are kept high (e.g., Vdd) whenever the plate-line voltage of 0V or Vdd is applied, while the unselected storage element sees 0V.

While the various embodiments are illustrated with reference to an n-type transistors or switches, the embodiments are also applicable to a p-type transistor or a combination of n-type or p-type transistors. A person skilled in the art would appreciate that when a transistor of a different conductivity type is used, than what is shown in FIG. 14B, then driving logic for BL, PLs, PLB_x, and/or WLs may also change for proper read and/or write operations.

In some embodiments, the plate-lines for bit-cell $1421_{0,0\_A}$ and for bit-cell $1421_{0,0\_B}$ may drive the same signals during read or write operations. In one such example, signal driven on PL0_1 is the same as signal driven on PLB0_1 during a read operation but are complementary to one another during a write operation. Similarly, BL and BLB drive complementary signals during a write operation, and can be driving the same signal during a pre-charge phase of a read operation, in accordance with some embodiments.

In some embodiments, signals driven on the plate-lines for both bit-cells of the differential bit-cell are the same during read and write operations. For example, signal driven on PL0_1 is the same as signal driven on PLB0_1 during read and write operations. In one such example, signals driven on BL and BLB are complementary signals during a write operation, and can be driving the same signal during a pre-charge phase of a read operation, in accordance with some embodiments. In some embodiments, PLB0x is complementary to a selected PL for a same bit-cell. For example, PLB0_x is complementary to PL0_2 (selected in this example) of bit-cell $1421_{0,0\_A}$. In some embodiments, PL0x is complementary to a selected PL for a same bit-cell. For example, PL0_x is complementary to PLB0_2 (selected in this example) of bit-cell $1421_{0,0\_B}$. Depending on the read or write operation, in some embodiments, PL0x is either complementary to PLB0_x or same as PL0_x.

In some embodiments, the switches added to the plate-lines are fabricated in different layers of a die. For example, transistor $MN_1$ is fabricated on the frontend of the die while transistors $MN1_{PLO\_1}$, $MN1_{PLO\_2}$, ... $MN1_{PLO\_n}$, and $MN1_{PLB\_x}$ are fabricated in the backend of the die. In some embodiments, transistor $MN_2$ is fabricated on the frontend of the die while transistors $MN2_{PLO\_1}$, $MN2_{PLO\_2}$, $MN2_{PLO\_n}$, and $MN2_{PLB\_x}$ are fabricated in the backend of the die.

On one such embodiment, the capacitor Cfe is fabricated between the frontend and the backend of the die. In one example, capacitor Cfe and Cd are vertically stacked capacitors. In some embodiments, each switch and its corresponding coupled capacitor is formed in the backend of the die. In some embodiments, each switch and its corresponding coupled capacitor is stacked vertically. For example, transistor $MN1_{PLO\_1}$ and capacitor Cfe1 of bit-cell $1421_{0,0\_A}$ are stacked vertically in a first vertical stack, and transistor $MN1_{PLO\_2}$ and capacitor Cfe2 of bit-cell $1421_{0,0\_A}$ are stacked vertically in a second vertical stack. These backed transistors or switches can be fabricated using any suitable technology such as IGZO (Indium gallium zinc oxide).

Figure 15:
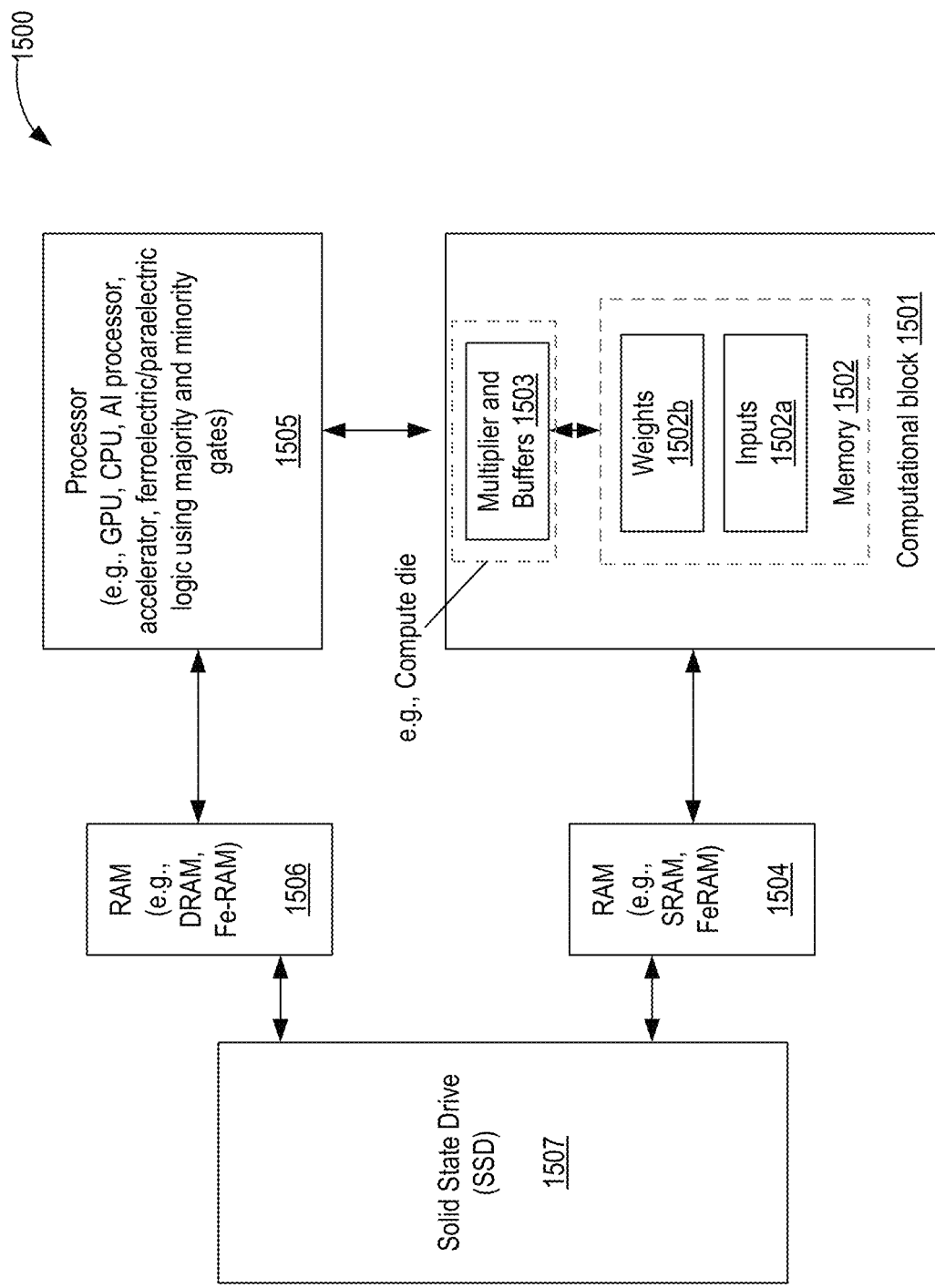
FIG. 15 illustrates a high-level architecture of an artificial intelligence (AI) machine comprising a compute die stacked with a memory die, wherein the compute die includes any one of the memory bit-cells, in accordance with some embodiments.

FIG. 15 illustrates a high-level architecture of an artificial intelligence (AI) machine comprising a compute die stacked with a memory die, wherein the compute die includes any one of the bit-cells, in accordance with some embodiments. AI machine 1500 comprises computational block 1501 or processor having random-access memory (RAM) 1502 and computational logic 1503; first random-access memory 1504 (e.g., static RAM (SRAM), ferroelectric or paraelectric RAM (FeRAM), ferroelectric or paraelectric static random-access memory (FeSRAM)), main processor 1505, second random-access memory 1506 (dynamic RAM (DRAM), FeRAM), and solid-state memory or drive (SSD) 1507. In some embodiments, some or all components of AI machine 1500 are packaged in a single package forming a system-on-chip (SoC). The SoC can be configured as a logic-on-logic configuration, which can be in a 3D configuration or a 2.5D configuration.

In some embodiments, computational block 1501 is packaged in a single package and then coupled to processor 1505 and memories 1504, 1506, and 1507 on a printed circuit board (PCB). In some embodiments, computational block 1501 is configured as a logic-on-logic configuration, which can be in a 3D configuration or a 2.5D configuration. In some embodiments, computational block 1501 comprises a special purpose compute die 1503 or microprocessor. For example, compute die 1503 is a compute chiplet that performs a function of an accelerator or inference. In some embodiments, memory 1502 is DRAM which forms a special memory/cache for the special purpose compute die 1503. The DRAM can be embedded DRAM (eDRAM) such as 1T1C (one transistor and one capacitor) based memories. In some embodiments, RAM 1502 is ferroelectric or paraelectric RAM (Fe-RAM).

In some embodiments, compute die 1503 is specialized for applications such as Artificial Intelligence, graph processing, and algorithms for data processing. In some embodiments, compute die 1503 further has logic computational blocks, for example, for multipliers and buffers, a special data memory block (e.g., buffers) comprising DRAM, FeRAM, or a combination of them. In some embodiments, RAM 1502 has weights and inputs stored to improve the computational efficiency. The interconnects between processor 1505 (also referred to as special purpose processor), first RAM 1504 and compute die 1503 are optimized for high bandwidth and low latency. The architecture of FIG. 15 allows efficient packaging to lower the energy, power, or cost and provides for ultra-high bandwidth between RAM 1502 and compute chiplet 1503 of computational block 1501.

In some embodiments, RAM 1502 is partitioned to store input data (or data to be processed) 1502a and weight factors 1502b. In some embodiments, input data 1502a is stored in a separate memory (e.g., a separate memory die) and weight factors 1502b are stored in a separate memory (e.g., separate memory die).

In some embodiments, computational logic or compute chiplet 1503 comprises matrix multiplier, adder, concatenation logic, buffers, and combinational logic. In various embodiments, compute chiplet 1503 performs multiplication operation on inputs 1502a and weights 1502b. In some embodiments, weights 1502b are fixed weights. For example, processor 1505 (e.g., a graphics processor unit (GPU), field programmable grid array (FPGA) processor, application specific integrated circuit (ASIC) processor, digital signal processor (DSP), an AI processor, a central processing unit (CPU), or any other high-performance processor) computes the weights for a training model. Once the weights are computed, they are stored in memory 1502. In various embodiments, the input data that is to be analyzed using a trained model, is processed by computational block 1501 with computed weights 1502b to generate an output (e.g., a classification result).

In some embodiments, first RAM 1504 is ferroelectric or paraelectric based SRAM. For example, a six transistor (6T) SRAM bit-cells having ferroelectric or paraelectric transistors are used to implement a non-volatile FeSRAM. In some embodiments, SSD 1507 comprises NAND flash cells. In some embodiments, SSD 1507 comprises NOR flash cells. In some embodiments, SSD 1507 comprises multi-threshold NAND flash cells.

In various embodiments, the non-volatility of FeRAM is used to introduce new features such as security, functional safety, and faster reboot time of AI machine 1500. The non-volatile FeRAM is a low power RAM that provides fast access to data and weights. FeRAM 1504 can also serve as a fast storage for computational block 1501 (which can be an inference die or an accelerator), which typically has low capacity and fast access requirements.

In various embodiments, the FeRAM (FeDRAM or FeSRAM) includes ferroelectric or paraelectric material. The ferroelectric or paraelectric (FE) material may be in a transistor gate stack or in a capacitor of the memory. The ferroelectric material can be any suitable low voltage FE material discussed with reference to various embodiments. While embodiments here are described with reference to ferroelectric material, the embodiments are applicable to any of the non-linear polar materials described herein.

Figure 16:
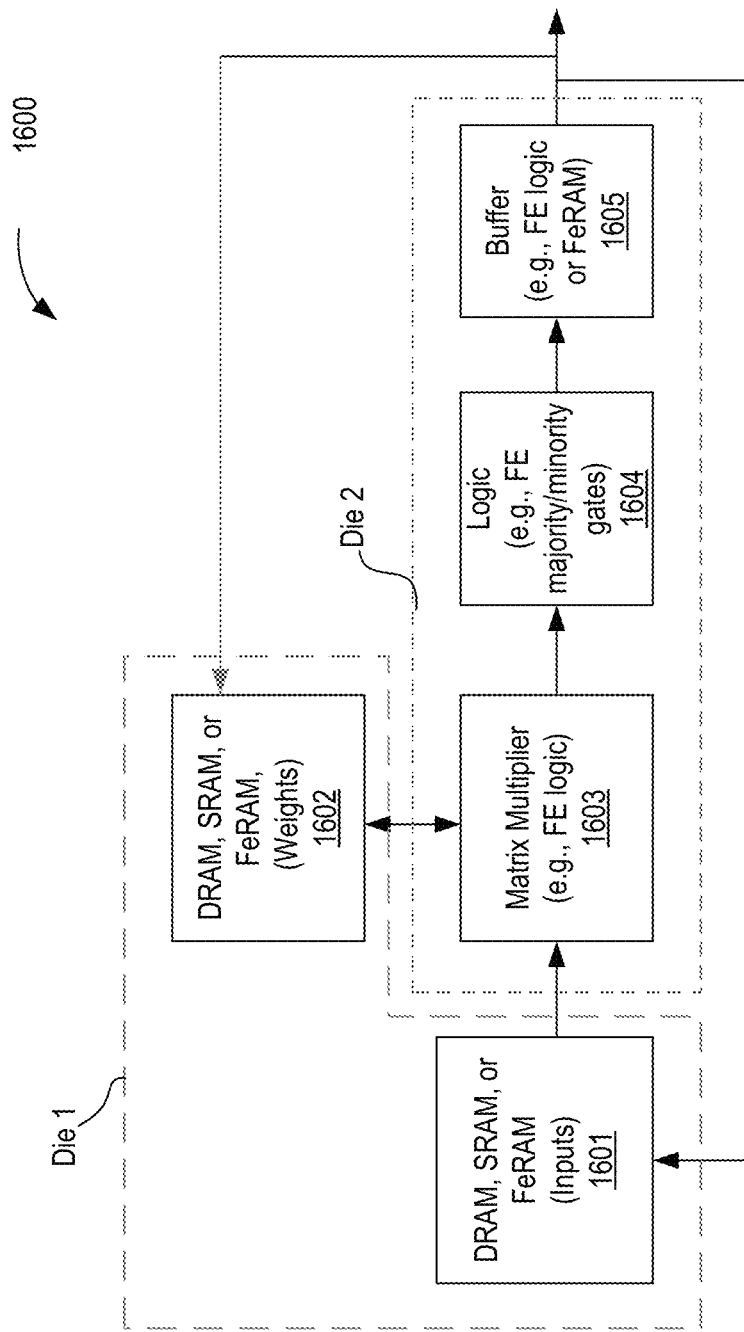
FIG. 16 illustrates an architecture of a computational block comprising a compute die stacked with a memory die, wherein the compute die includes any one of the memory bit-cells, in accordance with some embodiments.

FIG. 16 illustrates an architecture of a computational block 1600 comprising a compute die stacked with a memory die, wherein the compute die includes any one of the memory bit-cells, in accordance with some embodiments. Any of the blocks here can include the bit-cell of various embodiments. The architecture of FIG. 16 illustrates an architecture for a special purpose compute die where RAM memory buffers for inputs and weights are split on die-1 and logic and optional memory buffers are split on die-2.

In some embodiments, memory die (e.g., Die 1) is positioned below a compute die (e.g., Die 2) such that a heat sink or thermal solution is adjacent to the compute die. In some embodiments, the memory die is embedded in an interposer. In some embodiments, the memory die behaves as an interposer in addition to its basic memory function. In some embodiments, the memory die is a high bandwidth memory (HBM) which comprises multiple dies of memories in a stack and a controller to control the read and write functions to the stack of memory dies. In some embodiments, the memory die comprises a first die 1601 to store input data and a second die 1602 to store weight factors. In some embodiments, the memory die is a single die that is partitioned such that first partition 1601 of the memory die is used to store input data and second partition 1602 of the memory die is used to store weights. In some embodiments, the memory die comprises DRAM. In some embodiments, the memory die comprises FE-SRAM or FE-DRAM. In some embodiments, the memory die comprises MRAM. In some embodiments, the memory die comprises SRAM. For example, memory partitions 1601 and 1602, or memory dies 1601 and 1602 include one or more of: DRAM, FE-SRAM, FE-DRAM, SRAM, and/or MRAM. In some embodiments, the input data stored in memory partition or die 1601 is the data to be analyzed by a trained model with fixed weights stored in memory partition or die 1602.

In some embodiments, the compute die comprises ferroelectric or paraelectric logic (e.g., majority, minority, and/or threshold gates) to implement matrix multiplier 1603, logic 1604, and temporary buffer 1605. Matrix multiplier 1603 performs multiplication operation on input data 'X' and weights 'W' to generate an output 'Y'. This output may be further processed by logic 1604. In some embodiments, logic 1604 performs a threshold operation, pooling and drop out operations, and/or concatenation operations to complete the AI logic primitive functions.

In some embodiments, the output of logic 1604 (e.g., processed output 'Y') is temporarily stored in buffer 1605. In some embodiments, buffer 1605 is memory such as one or more of: DRAM, Fe-SRAM, Fe-DRAM, MRAM, resistive RAM (Re-RAM) and/or SRAM. In some embodiments, buffer 1605 is part of the memory die (e.g., Die 1). In some embodiments, buffer 1605 performs the function of a re-timer. In some embodiments, the output of buffer 1605 (e.g., processed output 'Y') is used to modify the weights in memory partition or die 1602. In one such embodiment, computational block 1600 not only operates as an inference circuitry, but also as a training circuitry to train a model. In some embodiments, matrix multiplier 1603 includes an array of multiplier cells, wherein the DRAMs 1601 and 1602 include arrays of memory bit-cells, respectively, wherein each multiplier cell is coupled to a corresponding memory bit-cell of DRAM 1601 and/or DRAM 1602. In some embodiments, computational block 1600 comprises an interconnect fabric coupled to the array of multiplier cells such that each multiplier cell is coupled to the interconnect fabric.

Architecture 1600 provides reduced memory access for the compute die (e.g., die 2) by providing data locality for weights, inputs, and outputs. In one example, data from and to the AI computational blocks (e.g., matrix multiplier 1603) is locally processed within a same packaging unit. Architecture 1600 also segregates the memory and logic operations onto a memory die (e.g., Die 1) and a logic die (e.g., Die 2), respectively, allowing for optimized AI processing. Desegregated dies allow for improved yield of the dies. A high-capacity memory process for Die 1 allows reduction of power of the external interconnects to memory, reduces cost of integration, and results in a smaller footprint.

Figure 17:
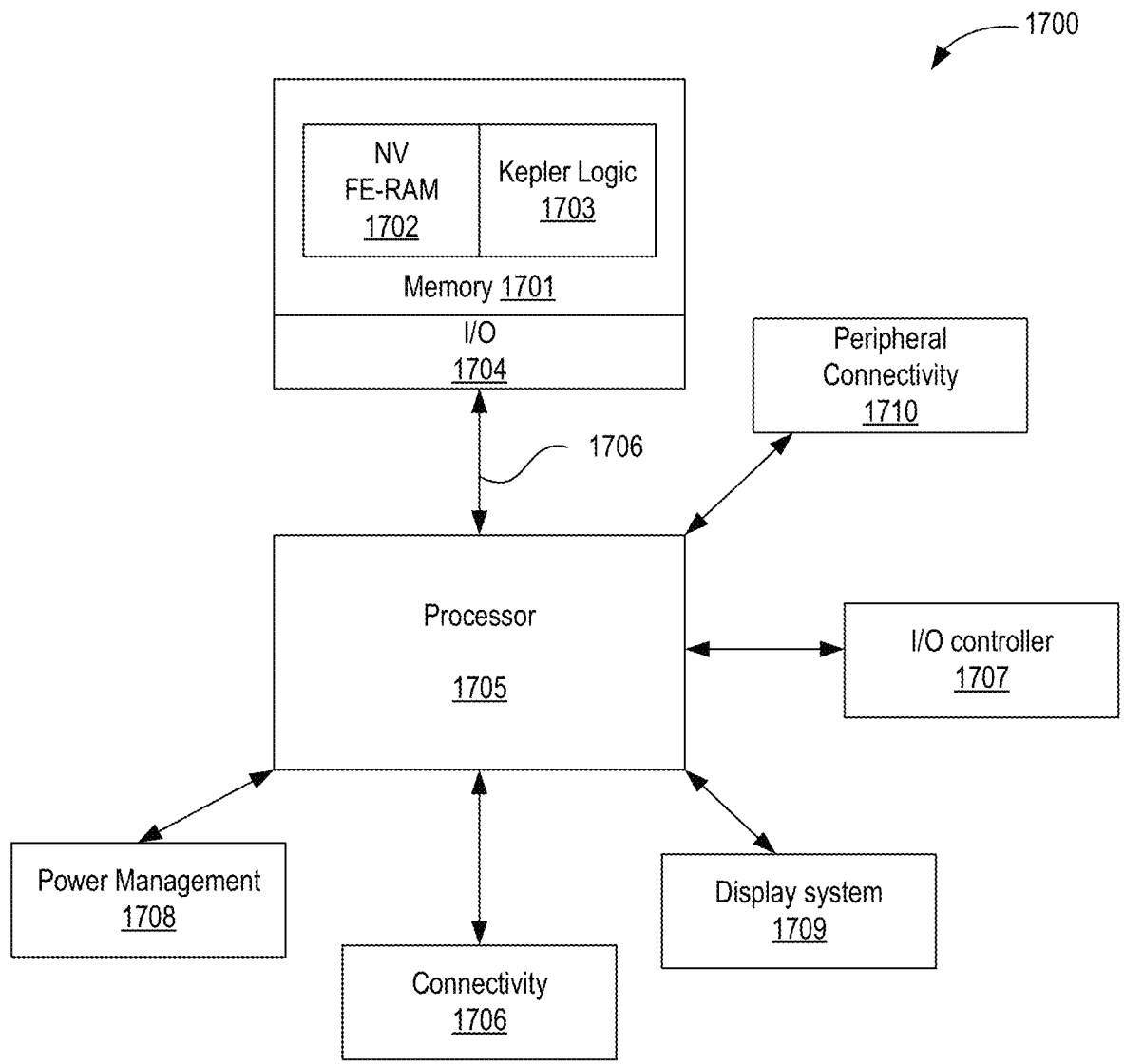
FIG. 17 illustrates a system-on-chip (SOC) that uses any one of the memory bit-cells, in accordance with some embodiments.

FIG. 17 illustrates a system-on-chip (SOC) 1700 that uses any one of the memory bit-cells, in accordance with some embodiments. SoC 1700 comprises memory 1701 having static random-access memory (SRAM) or FE based random-access memory FE-RAM, or any other suitable memory. The memory can be non-volatile (NV) or volatile memory. Memory 1701 may also comprise logic 1703 to control memory 1702. For example, write and read drivers are part of logic 1703. These drivers and other logic are implemented using the majority or threshold gates of various embodiments. The logic can comprise majority or threshold gates and traditional logic (e.g., CMOS based NAND, NOR etc.).

SoC further comprises a memory I/O (input-output) interface 1704. The interface may be a double-data rate (DDR) compliant interface or any other suitable interface to communicate with a processor. Processor 1705 of SoC 1700 can be a single core or multiple core processor. Processor 1705 can be a general-purpose processor (CPU), a digital signal processor (DSP), or an Application Specific Integrated Circuit (ASIC) processor. In some embodiments, processor 1705 is an artificial intelligence (AI) processor (e.g., a dedicated AI processor, a graphics processor configured as an AI processor). In various embodiments, processor 1705 executes instructions that are stored in memory 1701.

AI is a broad area of hardware and software computations where data is analyzed, classified, and then a decision is made regarding the data. For example, a model describing classification of data for a certain property or properties is trained over time with large amounts of data. The process of training a model requires large amounts of data and processing power to analyze the data. When a model is trained, weights or weight factors are modified based on outputs of the model. Once weights for a model are computed to a high confidence level (e.g., 95% or more) by repeatedly analyzing data and modifying weights to get the expected results, the model is deemed "trained." This trained model with fixed weights is then used to make decisions about new data. Training a model and then applying the trained model for new data is hardware intensive activity. In some embodiments, the AI processor has reduced latency of computing the training model and using the training model, which reduces the power consumption of such AI processor systems.

Processor 1705 may be coupled to a number of other chip-lets that can be on the same die as SoC 1700 or on separate dies. These chip-lets include connectivity circuitry 1706, I/O controller 1707, power management 1708, and display system 1709, and peripheral connectivity 1706.

Connectivity 1706 represents hardware devices and software components for communicating with other devices. Connectivity 1706 may support various connectivity circuitries and standards. For example, connectivity 1706 may support GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. In some embodiments, connectivity 1706 may support non-cellular standards such as WiFi.

I/O controller 1707 represents hardware devices and software components related to interaction with a user. I/O controller 1707 is operable to manage hardware that is part of an audio subsystem and/or display subsystem. For example, input through a microphone or other audio device can provide input or commands for one or more applications or functions of SoC 1700. In some embodiments, I/O controller 1707 illustrates a connection point for additional devices that connect to SoC 1700 through which a user might interact with the system. For example, devices that can be attached to the SoC 1700 might include microphone devices, speaker or stereo systems, video systems or other display devices, keyboard or keypad devices, or other I/O devices for use with specific applications such as card readers or other devices.

Power management 1708 represents hardware or software that perform power management operations, e.g., based at least in part on receiving measurements from power measurement circuitries, temperature measurement circuitries, charge level of battery, and/or any other appropriate information that may be used for power management. By using majority and threshold gates of various embodiments, non-volatility is achieved at the output of these logic. Power management 1708 may accordingly put such logic into low power state without the worry of losing data. Power management may select a power state according to Advanced Configuration and Power Interface (ACPI) specification for one or all components of SoC 1700.

Display system 1709 represents hardware (e.g., display devices) and software (e.g., drivers) components that provide a visual and/or tactile display for a user to interact with the processor 1705. In some embodiments, display system 1709 includes a touch screen (or touch pad) device that provides both output and input to a user. Display system 1709 may include a display interface, which includes the particular screen or hardware device used to provide a display to a user. In some embodiments, the display interface includes logic separate from processor 1705 to perform at least some processing related to the display.

Peripheral connectivity 1710 may represent hardware devices and/or software devices for connecting to peripheral devices such as printers, chargers, cameras, etc. In some embodiments, peripheral connectivity 1710 may support communication protocols, e.g., PCIe (Peripheral Component Interconnect Express), USB (Universal Serial Bus), Thunderbolt, High-Definition Multimedia Interface (HDMI), Firewire, etc.

In various embodiments, SoC 1700 includes a coherent cache or memory-side buffer chiplet (not shown) which include ferroelectric or paraelectric memory. The coherent cache or memory-side buffer chiplet can be coupled to processor 1705 and/or memory 1701 according to the various embodiments described herein (e.g., via silicon bridge or vertical stacking).

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus, which comprises the device.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

Here, the term "analog signal" generally refers to any continuous signal for which the time varying feature (variable) of the signal is a representation of some other time varying quantity, i.e., analogous to another time varying signal.

Here, the term "digital signal" generally refers to a physical signal that is a representation of a sequence of discrete values (a quantified discrete-time signal), for example of an arbitrary bit stream, or of a digitized (sampled and analog-to-digital converted) analog signal.

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e., scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

Here, multiple non-silicon semiconductor material layers may be stacked within a single fin structure. The multiple non-silicon semiconductor material layers may include one or more "P-type" layers that are suitable (e.g., offer higher hole mobility than silicon) for P-type transistors. The multiple non-silicon semiconductor material layers may further include one or more "N-type" layers that are suitable (e.g., offer higher electron mobility than silicon) for N-type transistors. The multiple non-silicon semiconductor material layers may further include one or more intervening layers separating the N-type from the P-type layers. The intervening layers may be at least partially sacrificial, for example to allow one or more of a gate, source, or drain to wrap completely around a channel region of one or more of the N-type and P-type transistors. The multiple non-silicon semiconductor material layers may be fabricated, at least in part, with self-aligned techniques such that a stacked CMOS device may include both a high-mobility N-type and P-type transistor with a footprint of a single FET (field effect transistor).

Here, the term "backend" generally refers to a section of a die which is opposite of a "frontend" and where an IC (integrated circuit) package couples to IC die bumps. For example, high-level metal layers (e.g., metal layer 6 and above in a ten-metal stack die) and corresponding vias that are closer to a die package are considered part of the backend of the die. Conversely, the term "frontend" generally refers to a section of the die that includes the active region (e.g., where transistors are fabricated) and low-level metal layers and corresponding vias that are closer to the active region (e.g., metal layer 5 and below in the ten-metal stack die example).

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional elements.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth to describe example embodiments of the disclosure, it should be apparent to one skilled in the art that the disclosure can be practiced without, or with variation of, these specific details. The description is thus to be regarded as illustrative instead of limiting.

The structures of various embodiments described herein can also be described as method of forming those structures, and method of operation of these structures.

Following examples are provided that illustrate the various embodiments. The examples can be combined with other examples. As such, various embodiments can be combined with other embodiments without changing the scope of the invention.

Example 1: An apparatus comprising: a node; a first capacitor comprising non-linear polar material, the first capacitor having a first terminal coupled to the node and a second terminal coupled to a first plate-line; a transistor coupled to the node and a bit-line, wherein the transistor is controllable by a word-line; and a second capacitor coupled to the node and a second plate-line, wherein the second capacitor comprises a linear dielectric.

Example 2: The apparatus of example 1, wherein an effective capacitance of the second capacitor is substantially equal to a linear component of a capacitance of the first capacitor.

Example 3: The apparatus of example 1 comprising one or more circuitries to apply a voltage on the second plate-line, wherein the voltage on the second plate-line is opposite to a voltage applied to the first capacitor via the first plate-line to compensate for dielectric capacitor dependent charge.

Example 4: The apparatus of example 1, wherein the second plate-line has a voltage complementary to a voltage on the first plate-line.

Example 5: The apparatus of example 1, wherein the first capacitor is a pillar capacitor or planar capacitor.

Example 6: The apparatus of example 1, wherein the first capacitor and the second capacitor are vertically stacked.

Example 7: The apparatus of example 1, wherein the first plate-line and the second plate-line are parallel to the bit-line.

Example 8: The apparatus of example 1, wherein the non-linear polar material includes one of: ferroelectric material, paraelectric material, or non-linear dielectric.

Example 9: The apparatus of example 8, wherein the non-linear polar material includes one of: Bismuth ferrite (BFO), BFO with a doping material where in the doping material is one of Lanthanum, or elements from lanthanide series of periodic table; Lead zirconium titanate (PZT), or PZT with a doping material, wherein the doping material is one of La, Nb; a relaxor ferroelectric which includes one of lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), or Barium Titanium-Barium Strontium Titanium (BT-BST); a perovskite which includes one of: $BaTiO_3$, $PbTiO_3$, $KNbO_3$, or $NaTaO_3$; a hexagonal ferroelectric which includes one of: $YMnO_3$, or $LuFeO_3$; hexagonal ferroelectrics of a type h-$RMnO_3$, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); Hafnium (Hf), Zirconium (Zr), Aluminum (Al), Silicon (Si), their oxides or their alloyed oxides; Hafnium oxides as $Hf1-x\ Ex\ Oy$, where E can be Al, Ca, Ce, Dy, er, Gd, Ge, La, Sc, Si, Sr, Sn, or Y; $Al(1-x)Sc(x)N$, $Ga(1-x)Sc(x)N$, $Al(1-x)Y(x)N$ or $Al(1-x-y)Mg(x)Nb(y)N$, y doped $HfO2$, where x includes one of: Al, Ca, Ce, Dy, Er, Gd, Ge, La, Sc, Si, Sr, Sn, or Y, wherein 'x' is a fraction; Niobate type compounds $LiNbO3$, $LiTaO3$, Lithium iron Tantalum Oxy Fluoride, Barium Strontium Niobate, Sodium Barium Niobate, or Potassium strontium niobate; or an improper ferroelectric which includes one of: [PTO/STO]n or [LAO/STO]n, where 'n' is between 1 to 100.

Example 10: The apparatus of example 8, wherein the paraelectric material includes one of: SrTiO3, Ba(x)Sr(y)TiO3 (where x is −0.5, and y is 0.95), HfZrO2, Hf—Si—O, La-substituted PbTiO3, or PMN-PT based relaxor ferroelectrics.

Example 11: The apparatus of example 1, wherein the first capacitor comprises: a first layer comprising a first conducting material, wherein the first layer is coupled to the first terminal of the first capacitor; a second layer comprising a second conducting material, wherein the second layer is around the first layer; a third layer comprising the non-linear polar material, wherein the third layer is around the second layer; a fourth layer comprising the second conducting material, wherein the fourth layer is around the third layer; and a fifth layer comprising the first conducting material, wherein the first plate-line is partially coupled to the fifth layer.

Example 12: The apparatus of example 11, wherein the first layer has a first circumference, wherein the second layer has a second circumference, wherein the third layer has a third circumference, wherein the fourth layer has a fourth circumference, wherein the fifth layer has a fifth circumference, wherein the fourth circumference is larger than the third circumference, wherein the third circumference is larger than the second circumference, and wherein the second circumference is larger than the first circumference.

Example 13: An apparatus comprising: an array of bit-cells organized in rows and columns, wherein an individual bit-cell includes: a storage node; a first capacitor comprising non-linear polar material, the first capacitor having a first terminal coupled to the storage node and a second terminal coupled to a first plate-line; a transistor coupled to the storage node and a bit-line, wherein the transistor is controllable by a word-line; and a second capacitor coupled to the storage node and a second plate-line, wherein the second capacitor comprises a linear dielectric; and a driver circuitry to drive a first voltage on the first plate-line and to drive a second voltage on the second plate-line, wherein the first voltage is an inverse of the second voltage.

Example 14: The apparatus of example 13, wherein an effective capacitance of the second capacitor is substantially equal to a linear component of a capacitance of the first capacitor.

Example 15: The apparatus of example 13, wherein the first capacitor and the second capacitors are pillar capacitors.

Example: 16: The apparatus of example 13, wherein the first capacitor and the second capacitor are vertically stacked.

Example 17: The apparatus of example 13, wherein the non-linear polar material includes one of: ferroelectric material, paraelectric material, or non-linear dielectric.

Example 18: The apparatus of example 13, wherein the word-line is parallel to the first plate-line or the second plate-line.

Example 19: A system comprising: a processor circuitry to execute one or more instructions; a memory to store the one or more instructions; and a communication interface to allow the processor circuitry to communicate with another device, wherein the memory includes an apparatus according to any one of examples 1 to 12.

Example 1a: An apparatus comprising: a node; a first capacitor comprising non-linear polar material, the first capacitor having a first terminal coupled to the node and a second terminal; a first transistor coupled to the node and a bit-line, wherein the first transistor is controllable by a word-line; a second transistor coupled to the second terminal of the first capacitor, wherein the second transistor is coupled to a first plate-line, wherein the second transistor is controllable by the word-line; a third transistor coupled to a second plate-line, wherein the third transistor is controllable by the word-line; and a second capacitor coupled to the node and the third transistor, wherein the second capacitor comprises a linear dielectric.

Example 2a: The apparatus of example 1a, wherein the first plate-line and the second plate-line are parallel to the bit-line.

Example 3a: The apparatus of example 1a, wherein an effective capacitance of the second capacitor is substantially equal to a linear component of a capacitance of the first capacitor.

Example 4a: The apparatus of example 1a comprising one or more circuitries to apply a voltage on the second plate-line, wherein the voltage on the second plate-line is opposite to a voltage applied to the first capacitor via the first plate-line to compensate for dielectric capacitor dependent charge.

Example 5a: The apparatus of example 1a, wherein the second plate-line has a voltage complementary to a voltage on the first plate-line.

Example 6a: The apparatus of example 1a, wherein the first capacitor and the second capacitor are pillar capacitors.

Example 7a: The apparatus of example 1a, wherein the first capacitor and the second capacitor are planar capacitors.

Example 8a: The apparatus of example 1a, wherein the first capacitor and the second capacitor are vertically stacked.

Example 9a: The apparatus of example 1a, wherein the non-linear polar material includes one of: ferroelectric material, paraelectric material, or non-linear dielectric.

Example 10a: An apparatus comprising: an array of bit-cells organized in rows and columns, wherein an individual bit-cell includes: a storage node; a first capacitor comprising non-linear polar material, the first capacitor having a first terminal coupled to the storage node and a second terminal; a first transistor coupled to the storage node and a bit-line, wherein the first transistor is controllable by a word-line; a second transistor coupled to the second terminal of the first capacitor, wherein the second transistor is coupled to a first plate-line, wherein the second transistor is controllable by the word-line; and a second capacitor coupled to the storage node and a second plate-line, wherein the second capacitor comprises a linear dielectric; and a driver circuitry to drive a first voltage on the first plate-line and to drive a second voltage on the second plate-line, wherein the first voltage is an inverse of the second voltage.

Example 11a: The apparatus of example 10a, wherein the individual bit-cell includes: a third transistor coupled to the second plate-line, wherein the third transistor is controllable by the word-line, wherein the third transistor is connected to the second capacitor.

Example 12a: The apparatus of example 10a, wherein an effective capacitance of the second capacitor is substantially equal to a linear component of a capacitance of the first capacitor.

Example 13a: The apparatus of example 10a, wherein the first capacitor and the second capacitor are planar capacitors or pillar capacitors.

Example 14a: The apparatus of example 10a, wherein the first capacitor and the second capacitor are vertically stacked.

Example 15a: The apparatus of example 10a, wherein the non-linear polar material includes one of: ferroelectric material, paraelectric material, or non-linear dielectric.

Example 16a: A system comprising: a processor circuitry to execute one or more instructions; a memory coupled to the processor circuitry; and a communication interface to allow the processor circuitry to communicate with another device, wherein the memory includes a bit-cell which comprises: a node; a first capacitor comprising non-linear polar material, the first capacitor having a first terminal coupled to the node and a second terminal; a first transistor coupled to the node and a bit-line, wherein the first transistor is controllable by a word-line; a second transistor coupled to the second terminal of the first capacitor, wherein the second transistor is coupled to a first plate-line, wherein the second transistor is controllable by the word-line; a third transistor coupled to a second plate-line, wherein the third transistor is controllable by the word-line; and a second capacitor coupled to the node and the third transistor, wherein the second capacitor comprises a linear dielectric.

Example 17a: The system of example 16a, wherein the first plate-line and the second plate-line are parallel to the bit-line.

Example 18a: The system of example 16a, wherein an effective capacitance of the second capacitor is substantially equal to a linear component of a capacitance of the first capacitor.

Example 19a: The system of example 16a, wherein the memory comprises one or more circuitries to apply a voltage on the second plate-line, wherein the voltage on the second plate-line is opposite to a voltage applied to the first capacitor via the first plate-line to compensate for dielectric capacitor dependent charge.

Example 20a: The system of example 16a, wherein the second plate-line has a voltage complementary to a voltage on the first plate-line, wherein the first capacitor and the second capacitor are pillar capacitors or planar capacitors, and wherein the first capacitor and the second capacitor are vertically stacked.

Example 1b: a node; a first capacitor comprising non-linear polar material, the first capacitor having a first terminal coupled to the node and a second terminal coupled to a first plate-line; a second capacitor comprising non-linear polar material, the second capacitor having a first terminal coupled to the node and a second terminal coupled to a second plate-line; a transistor coupled to the node and a bit-line, wherein the transistor is controllable by a word-line; and a third capacitor coupled to the node and a third plate-line, wherein the second capacitor comprises a linear dielectric.

Example 2b: The apparatus of example 1b, wherein the first plate-line, the second plate-line, and the third plate-line are parallel to the word-line.

Example 3b: The apparatus of example 1b, wherein an effective capacitance of the third capacitor is substantially equal to a linear component of a capacitance of the first capacitor or the second capacitor.

Example 4b: The apparatus of example 1b comprising one or more circuitries to apply a voltage on the third plate-line, wherein the voltage on the third plate-line is opposite to a voltage applied to the first capacitor via the first plate-line to compensate for dielectric capacitor dependent charge.

Example 5b: The apparatus of example 1b, wherein the third plate-line has a voltage complementary to a voltage on the first plate-line.

Example 6b: The apparatus of example 1b, wherein the first capacitor, the second capacitor, and the third capacitor are pillar capacitors or planar capacitors.

Example 7b: The apparatus of example 1b, wherein the first capacitor, the second capacitor, and the third capacitor are vertically stacked.

Example 8b: The apparatus of example 1b, wherein the non-linear polar material includes one of: ferroelectric material, paraelectric material, or non-linear dielectric.

Example 9b: An apparatus comprising: an array of bit-cells organized in rows and columns, wherein an individual bit-cell includes: a node; a first capacitor comprising non-linear polar material, the first capacitor having a first terminal coupled to the node and a second terminal coupled to a first plate-line; a second capacitor comprising non-linear polar material, the second capacitor having a first terminal coupled to the node and a second terminal coupled to a second plate-line; a transistor coupled to the node and a bit-line, wherein the transistor is controllable by a word-line; and a third capacitor coupled to the node and a third plate-line, wherein the second capacitor comprises a linear dielectric; and a driver circuitry to drive a first voltage on the first plate-line and to drive a second voltage on the third plate-line, wherein the first voltage is an inverse of the second voltage.

Example 10b: The apparatus of example 9b, wherein the first plate-line, the second plate-line, and the third plate-line are parallel to the word-line or the bit-line.

Example 11b: The apparatus of example 9b, wherein an effective capacitance of the third capacitor is substantially equal to a linear component of a capacitance of the first capacitor.

Example 12b: The apparatus of example 9b, wherein the first capacitor, the second capacitor, and the third capacitor are planar capacitors or pillar capacitors.

Example 13b: The apparatus of example 9b, wherein the first capacitor, the second capacitor, and the third capacitor are vertically stacked.

Example 14b: The apparatus of example 9b, wherein the non-linear polar material includes one of: ferroelectric material, paraelectric material, or non-linear dielectric.

Example 15b: A system comprising: a processor circuitry to execute one or more instructions; a memory coupled to the processor circuitry; and a communication interface to allow the processor circuitry to communicate with another device, wherein the memory includes a bit-cell which comprises an apparatus according to any one of examples 1b to 8b.

Example 17c: A system comprising: a processor circuitry to execute one or more instructions; a memory coupled to the processor circuitry; and a communication interface to allow the processor circuitry to communicate with another device, wherein the memory includes an apparatus according to any one of examples 8b to 14b.

Example 1c: An apparatus comprising: a node; a first capacitor comprising non-linear polar material, the first capacitor having a first terminal coupled to the node and a second terminal coupled to a first plate-line; a second capacitor comprising non-linear polar material, the second capacitor having a first terminal coupled to the node and a second terminal coupled to a second plate-line; a first transistor coupled to the node and a bit-line, wherein the first transistor is controllable by a word-line; a second transistor coupled to the node and a select-line; and a third capacitor coupled to the node and a third plate-line, wherein the third capacitor comprises a linear dielectric.

Example 2c: The apparatus of example 1c, wherein the second transistor is coupled to the node via a gate terminal of the second transistor.

Example 3c: The apparatus of example 1c, wherein the second transistor is coupled to a bias voltage.

Example 4c: The apparatus of example 1c, wherein the first plate-line, the second plate-line, and the third plate-line are parallel to the word-line.

Example 5c: The apparatus of example 1c, wherein an effective capacitance of the third capacitor is substantially equal to a linear component of a capacitance of the first capacitor or the second capacitor.

Example 6c: The apparatus of example 1c comprising one or more circuitries to apply a voltage on the third plate-line, wherein the voltage on the third plate-line is opposite to a voltage applied to the first capacitor via the first plate-line to compensate for dielectric capacitor dependent charge.

Example 7c: The apparatus of example 1c, wherein the third plate-line has a voltage complementary to a voltage on the first plate-line.

Example 8c: The apparatus of example 1c, wherein the first capacitor, the second capacitor, and the third capacitor are pillar capacitors.

Example 9c: The apparatus of example 1c, wherein the first capacitor, the second capacitor, and the third capacitor are planar capacitors.

Example 10c: The apparatus of example 1c, wherein the first capacitor, the second capacitor, and the third capacitor are vertically stacked.

Example 11c: The apparatus of example 1c, wherein the non-linear polar material includes one of: ferroelectric material, paraelectric material, or non-linear dielectric.

Example 12c: An apparatus comprising: an array of bit-cells organized in rows and columns, wherein an individual bit-cell includes: a node; a first capacitor comprising non-linear polar material, the first capacitor having a first terminal coupled to the node and a second terminal coupled to a first plate-line; a second capacitor comprising non-linear polar material, the second capacitor having a first terminal coupled to the node and a second terminal coupled to a second plate-line; a first transistor coupled to the node and a bit-line, wherein the first transistor is controllable by a word-line; a second transistor coupled to the node and a select-line; and a third capacitor coupled to the node and a third plate-line, wherein the third capacitor comprises a linear dielectric; and a driver circuitry to drive a first voltage on the first plate-line and to drive a second voltage on the third plate-line, wherein the first voltage is an inverse of the second voltage.

Example 13c: The apparatus of example 12c, wherein an effective capacitance of the third capacitor is substantially equal to a linear component of a capacitance of the first capacitor.

Example 14c: The apparatus of example 12c, wherein the first capacitor, the second capacitor, and the third capacitor are planar capacitors.

Example 15c: The apparatus of example 12c, wherein the first capacitor, the second capacitor, and the third capacitor are vertically stacked.

Example 16c: The apparatus of example 12c, wherein the non-linear polar material includes one of: ferroelectric material, paraelectric material, or non-linear dielectric.

Example 17c: A system comprising: a processor circuitry to execute one or more instructions; a memory coupled to the processor circuitry; and a communication interface to allow the processor circuitry to communicate with another device, wherein the memory includes a bit-cell which comprises an apparatus according to any one of examples 1c to 11c.

Example 17c: A system comprising: a processor circuitry to execute one or more instructions; a memory coupled to the processor circuitry; and a communication interface to allow the processor circuitry to communicate with another device, wherein the memory includes an apparatus according to any one of examples 12c to 16c.

Example 1d: An apparatus comprising: a first bit-cell comprising a first transistor coupled to a first bit-line and controllable by a word-line, wherein the first transistor is coupled to a first capacitor comprising non-linear polar material, wherein the first transistor is coupled to a second capacitor comprising dielectric material, wherein the first capacitor is coupled to a first plate-line, and wherein the second capacitor is coupled to a second plate-line; and a second bit-cell comprising a second transistor coupled to a second bit-line and controllable by the word-line, wherein the second transistor is coupled to a third capacitor comprising non-linear polar material, wherein the second transistor is coupled to a fourth capacitor comprising dielectric material, wherein the third capacitor is coupled to the first plate-line, and wherein the fourth capacitor is coupled to the second plate-line.

Example 2d: The apparatus of example 1d, wherein the first capacitor and the second capacitor are connected to a first node, which is connected to the first transistor.

Example 3d: The apparatus of example 1d, wherein the third capacitor and the fourth capacitor are connected to a second node, which is connected to the second transistor.

Example 4d: The apparatus of example 1d, wherein the first plate-line and the second plate-line are parallel to the first bit-line or the word-line.

Example 5d: The apparatus of example 1d, wherein an effective capacitance of the second capacitor is substantially equal to a linear component of a capacitance of the first capacitor.

Example 6d: The apparatus of example 1d, wherein an effective capacitance of the fourth capacitor is substantially equal to a linear component of a capacitance of the third capacitor.

Example 7d: The apparatus of example 1d comprising one or more circuitries to apply a voltage on the second plate-line, wherein the voltage on the second plate-line is opposite to a voltage applied to the first capacitor or the third capacitor via the first plate-line to compensate for dielectric capacitor dependent charge.

Example 8d: The apparatus of example 1d, wherein the second plate-line has a voltage complementary to a voltage on the first plate-line.

Example 9d: The apparatus of example 1d, wherein the first capacitor, the second capacitor, the third capacitor, and the fourth capacitor are pillar capacitors or planar capacitors.

Example 10d: The apparatus of example 1d, wherein the first capacitor, the second capacitor, the third capacitor, and the fourth capacitor are vertically stacked.

Example 11d: The apparatus of example 1d, wherein the non-linear polar material includes one of: ferroelectric material, paraelectric material, or non-linear dielectric.

Example 12d: An apparatus comprising: an array of bit-cells organized in rows and columns, wherein an individual bit-cell includes a differential bit-cell, wherein the differential bit-cell includes two capacitors with non-linear polar material, and two capacitors with linear dielectric, wherein the two capacitors with non-linear polar material are coupled to a first plate-line, wherein the two capacitors with linear dielectric are coupled to a second plate-line; and a driver circuitry to drive a first voltage on the first plate-line and to drive a second voltage on the second plate-line, wherein the first voltage is an inverse of the second voltage.

Example 13d: The apparatus of example 12d, wherein an effective capacitance of an individual capacitor of the two capacitors with linear dielectric is substantially equal to a linear component of a capacitance of an individual capacitor of the two capacitors with non-linear polar material.

Example 14d: The apparatus of example 12d, wherein the two capacitors with linear dielectric and the two capacitors with non-linear polar material are planar capacitors or pillar capacitors.

Example 15d: The apparatus of example 12d, wherein the two capacitors with linear dielectric and the two capacitors with non-linear polar material are vertically stacked.

Example 16d: The apparatus of example 12d, wherein the non-linear polar material includes one of: ferroelectric material, paraelectric material, or non-linear dielectric.

Example 17d: The apparatus of example 12d, wherein the first plate-line and the second plate-line are parallel to a bit-line or a word-line.

Example 18d: A system comprising: a processor circuitry to execute one or more instructions; a memory coupled to the processor circuitry; and a communication interface to allow the processor circuitry to communicate with another device, wherein the memory includes a differential bit-cell which comprises an apparatus according to any one of examples 1d to 11d.

Example 19d: A system comprising: a processor circuitry to execute one or more instructions; a memory coupled to the processor circuitry; and a communication interface to allow the processor circuitry to communicate with another device, wherein the memory includes a differential bit-cell which comprises an apparatus according to any one of examples 12d to 17d.

Example 1e: A method comprising: forming a via extending along a y-plane, wherein the y-plane is orthogonal to an x-plane, wherein the via couples to a first metal layer; forming a first capacitor including a non-linear polar material, wherein the first capacitor includes an electrode coupled to the via, wherein the electrode is in a middle of the first capacitor; forming a second capacitor including a linear dielectric material, wherein the electrode passes through a middle of the second capacitor; forming a first plate-line extending along the x-plane or a z-plane, wherein the z-plane is orthogonal to the x-plane and the y-plane, wherein the first plate-line is on an outer portion of the first capacitor; and forming a second plate-line extending along the x-plane or the z-plane, wherein the second plate-line is on an output portion of the second capacitor.

Example 2e: The method of example 1e, wherein forming the first capacitor includes: forming a first layer coupled to the electrode, wherein the first layer comprises metal; forming a second layer around the first layer, wherein the second layer comprises a first conductive oxide; forming a third layer comprising the non-linear polar material, wherein the third layer is around the second layer; forming a fourth layer around the third layer, wherein the fourth layer comprises a second conductive oxide, wherein the fourth layer is around the third layer; and forming a fifth layer around the fourth layer, wherein the fifth layer comprises metal, wherein the first plate-line is adjacent to part of the fifth layer.

Example 3e: The method of example 2e, wherein: the first layer has a first circumference; the second layer has a second circumference; the third layer has a third circumference; the fourth layer has a fourth circumference; and the fifth layer has a fifth circumference, wherein the fifth circumference is larger than the fourth circumference, wherein the fourth circumference is larger than the third circumference, wherein the third circumference is larger than the second circumference, wherein the second circumference is larger than the first circumference.

Example 4e: The method of example 1e, wherein forming the second capacitor includes: forming a first layer coupled to the electrode, wherein the first layer comprises metal; forming a second layer comprising the linear dielectric material, wherein the second layer is around the first layer; and forming a third layer around the second layer, wherein the third layer comprises metal, wherein the second plate-line is adjacent to part of the third layer.

Example 5e: The method of example 4e, wherein: the first layer has a first circumference; the second layer has a second circumference; and the third layer has a third circumference, wherein the third circumference is larger than the second circumference, wherein the second circumference is larger than the first circumference.

Example 6e: The method of example 1e, wherein the non-linear polar material includes one of: ferroelectric material, paraelectric material, or non-linear dielectric.

Example 7e: The method of example 1e, wherein the first plate-line and the second plate-line are parallel to a word-line or a bit-line.

Example 8e: The method of example 1e, wherein an effective capacitance of the second capacitor is substantially equal to a linear component of a capacitance of the first capacitor.

Example 9e: The method of example 1e comprising applying a voltage on the second plate-line, wherein the voltage on the second plate-line is opposite to a voltage applied to the first capacitor via the first plate-line to compensate for dielectric capacitor dependent charge.

Example 10e: The method of example 1e, wherein the second plate-line has a voltage complementary to a voltage on the first plate-line.

Example 11e: A method comprising: fabricating a transistor, the transistor having a source region and a drain region, and a gate; depositing a first etch stop layer over a region above the transistor; fabricating a first via through the first etch stop layer, wherein the first via is coupled to the source region; fabricating a second via through the first etch stop layer, wherein the second via is coupled to the drain region; depositing a first metal layer over the first via, the first metal layer extending along an x-plane; depositing a second etch stop layer over the first metal layer; forming a third via over the first metal layer by etching through the second etch stop layer, the third via in direct connection to the first metal layer, wherein the third via extends along a y-plane, wherein the y-plane is orthogonal to an x-plane; forming a first non-planar stack of materials including a non-linear polar material, wherein the first non-planar stack of materials includes an electrode coupled to the third via, wherein the electrode is in a middle of the first non-planar stack of materials; forming a second non-planar stack of materials including a linear dielectric material, wherein the electrode passes through a middle of the second non-planar stack of materials; forming a first plate-line extending along the x-plane or a z-plane, wherein the z-plane is orthogonal to the x-plane and the y-plane, wherein the first plate-line is on a portion of the first non-planar stack of materials; and forming a second plate-line extending along the x-plane or the z-plane, wherein the second plate-line is on a portion of the second non-planar stack of materials.

Example 12e: The method of example 11e, wherein forming the first non-planar stack of materials includes: forming a first layer coupled to the electrode, wherein the first layer comprises metal; forming a second layer around the first layer, wherein the second layer comprises a first conductive oxide; forming a third layer comprising the non-linear polar material, wherein the third layer is around the second layer; forming a fourth layer around the third layer, wherein the fourth layer comprises a second conductive oxide, wherein the fourth layer is around the third layer; and forming a fifth layer around the fourth layer, wherein the fifth layer comprises metal, wherein the first plate-line is adjacent to part of the fifth layer.

Example 13e: The method of example 12e, wherein: the first layer has a first circumference; the second layer has a second circumference; the third layer has a third circumference; the fourth layer has a fourth circumference; and the fifth layer has a fifth circumference, wherein the fifth circumference is larger than the fourth circumference, wherein the fourth circumference is larger than the third circumference, wherein the third circumference is larger than the second circumference, wherein the second circumference is larger than the first circumference.

Example 14e: The method of example 11e, wherein the first non-planar stack of materials and the second non-planar stack of materials are cylindrical in shape, or wherein the first non-planar stack of materials and the second non-planar stack of materials are square or square-like in shape.

Example 15e: The method of example 11e, wherein an effective capacitance of the second non-planar stack of materials is substantially equal to a linear component of a capacitance of the first non-planar stack of materials.

Example 16e: The method of example 11e comprising applying a voltage on the second plate-line, wherein the voltage on the second plate-line is opposite to a voltage applied to the first non-planar stack of materials via the first plate-line to compensate for dielectric capacitor dependent charge.

Example 17e: The method of example 11e, wherein the second plate-line has a voltage complementary to a voltage on the first plate-line.

Example 18e: A method comprising: forming a memory; storing one or more instructions on the memory; executing, by a processor circuitry, the one or more instructions; and allowing, via a communication interface, the processor circuitry to communicate with another device, wherein forming the memory includes a method according to any one of examples 1e to 10e.

Example 18e: A method comprising: forming a memory; storing one or more instructions on the memory; executing, by a processor circuitry, the one or more instructions; and allowing, via a communication interface, the processor circuitry to communicate with another device, wherein forming the memory includes a method according to any one of examples 11e to 17e.

Example 1f: A method comprising: forming a first metal layer extending along an x-plane; forming a second metal layer extending along the x-plane, wherein the second metal layer is above the first metal layer; forming a first via extending along a y-plane, wherein the y-plane is orthogonal to the x-plane, wherein the first via couples the first metal layer with the second metal layer; forming a second via extending along the y-plane, wherein the second via couples the second metal layer, wherein the second via is above the first via; forming a first pedestal on the first metal layer, wherein the first pedestal is laterally offset from the first via; forming a second pedestal on the second metal layer, wherein the second pedestal is laterally offset from the second via; forming a first plate-line extending along a z-plane, wherein the z-plane is orthogonal to the x-plane and the y-plane; forming a second plate-line extending along the z-plane; forming a first planar stack of materials including a non-linear polar material, wherein the first planar stack of materials has a top electrode and a bottom electrode, wherein the non-linear polar material is between the top electrode and the bottom electrode, wherein the bottom electrode is on the first pedestal, wherein the first plate-line is on the top electrode; and forming a second planar stack of materials including a linear dielectric material, wherein the second planar stack of materials has a top electrode and a bottom electrode, wherein the linear dielectric material is between the top electrode of the second planar stack of materials and the bottom electrode and the second planar stack of materials, wherein the bottom electrode is on the second pedestal, wherein the second plate-line on the top electrode.

Example 2f: The method of example 1, wherein the first plate-line and the second plate-line are parallel to a word-line or a bit-line.

Example 3f: The method of example 1, wherein an effective capacitance of the second planar stack of materials is substantially equal to a linear component of a capacitance of the first planar stack of materials.

Example 4f: The method of example 1 comprising applying a voltage on the second plate-line, wherein the voltage on the second plate-line is opposite to a voltage applied to the first planar stack of materials via the first plate-line to compensate for dielectric capacitor dependent charge.

Example 5f: The method of example 1, wherein the second plate-line has a voltage complementary to a voltage on the first plate-line.

Example 6f: The method of example 1, wherein forming the second planar stack of materials includes: forming a first layer coupled to the bottom electrode, wherein the first layer comprises metal; forming a second layer comprising the linear dielectric material, wherein the second layer on the first layer; and forming a third layer on the second layer, wherein the third layer comprises metal and is coupled to the top electrode of the second planar stack of materials.

Example 7f: The method of example 1, wherein the non-linear polar material includes one of: ferroelectric material, paraelectric material, or non-linear dielectric.

Example 8f: A method comprising: fabricating a transistor, the transistor having a source region and a drain region, and a gate; depositing a first etch stop layer over a region above the transistor; fabricating a first via through the first etch stop layer, wherein the first via is coupled to the source region; fabricating a second via through the first etch stop layer, wherein the second via is coupled to the drain region; depositing a first metal layer over the first via, the first metal layer extending along an x-plane; depositing a second etch stop layer over the first metal layer; forming a third via over the first metal layer by etching through the second etch stop layer, the third via in direct connection to the first metal layer; depositing a second metal layer extending along the x-plane, wherein the second metal layer is above the first metal layer, wherein the second metal layer couples the third via; depositing an interlayer dielectric between the first metal layer and the second metal layer; depositing a third etch stop layer of the second metal layer; etching through the third etch stop layer to form a first pedestal filled with metal, wherein the first pedestal is coupled to the second metal layer; depositing a first plurality of layers to form a first planar capacitor, wherein the first plurality of layers includes non-linear polar material, wherein a first layer of the first plurality of layers is in contact with a top portion of the first pedestal; depositing a fourth etch stop layer over a last layer of the first plurality of layers; etching through the fourth etch stop layer and the third etch stop layer to form a fourth via in direct connection to the second metal layer; depositing a third metal layer over the fourth via, wherein the first plurality of layers is between the second metal layer and the third metal layer; etching through the fourth etch stop layer to form a second pedestal filled with metal, wherein the second pedestal is coupled to the third metal layer; and depositing a second plurality of layers to form a second planar capacitor, wherein the second plurality of layers includes a linear dielectric material, wherein a first layer of the second plurality of layers is in direct contact with a top portion of the second pedestal.

Example 9f: The method of example 8f comprising: depositing a fifth etch stop layer over a last layer of the second plurality of layers; and etching through the fifth etch stop layer and the fourth etch stop layer to form a fifth via in direct connection to the third metal layer, wherein the fifth via is substantially above the fourth via.

Example 10f: The method of example 8f, wherein the last layer of the first plurality of layers is coupled to a first plate-line, wherein a last layer of the second plurality of layers is coupled to a second plate-line, wherein the first plate-line and the second plate-line are parallel to a word-line or a bit-line.

Example 11f: The method of example 8f, wherein an effective capacitance of the second plurality of layers is substantially equal to a linear component of a capacitance of the first plurality of layers.

Example 12f: The method of example 10f comprising applying a voltage on the second plate-line, wherein the voltage on the second plate-line is opposite to a voltage applied to the first plurality of layers via the first plate-line to compensate for dielectric capacitor dependent charge.

Example 13f: The method of example 12, wherein the second plate-line has a voltage complementary to a voltage on the first plate-line.

Example 14f: The method of example 12, wherein forming the second plurality of layers includes: forming the first layer coupled to the top portion of the first pedestal, wherein the first layer comprises metal; forming a second layer comprising the linear dielectric material, wherein the second layer on the first layer; and forming the last layer of the second plurality of layers on the second layer, wherein the last layer comprises metal and is coupled to the second plate-line of the second plurality of layers.

Example 15f: The method of example 8f, wherein the non-linear polar material includes one of: ferroelectric material, paraelectric material, or non-linear dielectric.

Example 16f: A method comprising: forming a memory; storing one or more instructions on the memory; executing, by a processor circuitry, the one or more instructions; and allowing, via a communication interface, the processor circuitry to communicate with another device, wherein forming the memory comprises a method according to any one of examples 1f to 7f.

Example 16f: A method comprising: forming a memory; storing one or more instructions on the memory; executing, by a processor circuitry, the one or more instructions; and allowing, via a communication interface, the processor circuitry to communicate with another device, wherein forming the memory comprises a method according to any one of examples 8f to 15f.

Example 1g: An apparatus comprising: a via extending along a y-plane, wherein the y-plane is orthogonal to an x-plane, wherein the via couples to a first metal layer; a first capacitor including a non-linear polar material, wherein the first capacitor includes an electrode coupled to the via, wherein the electrode is in a middle of the first capacitor; a second capacitor including a linear dielectric material, wherein the electrode passes through a middle of the second capacitor; a first plate-line extending along the x-plane or a z-plane, wherein the z-plane is orthogonal to the x-plane and the y-plane, wherein the first plate-line is on an outer portion of the first capacitor; and a second plate-line extending along the x-plane or the z-plane, wherein the second plate-line is on an output portion of the second capacitor.

Example 2g: The apparatus of example 1g, wherein the first capacitor includes: a first layer coupled to the electrode, wherein the first layer comprises metal; a second layer around the first layer, wherein the second layer comprises a first conductive oxide; a third layer comprising the non-linear polar material, wherein the third layer is around the second layer; a fourth layer around the third layer, wherein the fourth layer comprises a second conductive oxide, wherein the fourth layer is around the third layer; and a fifth layer around the fourth layer, wherein the fifth layer comprises metal, wherein the first plate-line is adjacent to part of the fifth layer.

Example 3g: The apparatus of example 2g, wherein: the first layer has a first circumference; the second layer has a second circumference; the third layer has a third circumference; the fourth layer has a fourth circumference; and the fifth layer has a fifth circumference, wherein the fifth circumference is larger than the fourth circumference, wherein the fourth circumference is larger than the third circumference, wherein the third circumference is larger than the second circumference, wherein the second circumference is larger than the first circumference.

Example 4g: The apparatus of example 1g, wherein the second capacitor includes: a first layer coupled to the electrode, wherein the first layer comprises metal; a second layer comprising the linear dielectric material, wherein the second layer is around the first layer; and a third layer around the second layer, wherein the third layer comprises metal, wherein the second plate-line is adjacent to part of the third layer.

Example 5g: The apparatus of example 4, wherein: the first layer has a first circumference; the second layer has a second circumference; and the third layer has a third circumference, wherein the third circumference is larger than the second circumference, wherein the second circumference is larger than the first circumference.

Example 6g: The apparatus of example 1g, wherein the non-linear polar material includes one of: ferroelectric material, paraelectric material, or non-linear dielectric.

Example 7g: The apparatus of example 1g, wherein the first plate-line and the second plate-line are parallel to a word-line or a bit-line.

Example 8g: The apparatus of example 1g, wherein an effective capacitance of the second capacitor is substantially equal to a linear component of a capacitance of the first capacitor.

Example 9g: The apparatus of example 1g comprising circuitry to apply a voltage on the second plate-line, wherein the voltage on the second plate-line is opposite to a voltage applied to the first capacitor via the first plate-line to compensate for dielectric capacitor dependent charge.

Example 10g: The apparatus of example 1g, wherein the second plate-line has a voltage complementary to a voltage on the first plate-line.

Example 11g: An apparatus comprising: a transistor, the transistor having a source region and a drain region, and a gate; a first via coupled to the source region; a second via coupled to the drain region; a first metal layer over the first via, the first metal layer extending along an x-plane; a third via over the first metal layer, the third via in direct connection to the first metal layer, wherein the third via extends along a y-plane, wherein the y-plane is orthogonal to an x-plane; a first non-planar stack of materials including a non-linear polar material, wherein the first non-planar stack of materials includes an electrode coupled to the third via, wherein the electrode is in a middle of the first non-planar stack of materials; a second non-planar stack of materials including a linear dielectric material, wherein the electrode passes through a middle of the second non-planar stack of materials; a first plate-line extending along the x-plane or a z-plane, wherein the z-plane is orthogonal to the x-plane and the y-plane, wherein the first plate-line is on a portion of the first non-planar stack of materials; and a second plate-line extending along the x-plane or the z-plane, wherein the second plate-line is on a portion of the second non-planar stack of materials.

Example 12g: The apparatus of example 11g, wherein the first non-planar stack of materials includes: a first layer coupled to the electrode, wherein the first layer comprises metal; a second layer around the first layer, wherein the second layer comprises a first conductive oxide; a third layer comprising the non-linear polar material, wherein the third layer is around the second layer; a fourth layer around the third layer, wherein the fourth layer comprises a second conductive oxide, wherein the fourth layer is around the third layer; and a fifth layer around the fourth layer, wherein the fifth layer comprises metal, wherein the first plate-line is adjacent to part of the fifth layer.

Example 13g: The apparatus of example 12g, wherein: the first layer has a first circumference; the second layer has a second circumference; the third layer has a third circumference; the fourth layer has a fourth circumference; and the fifth layer has a fifth circumference, wherein the fifth circumference is larger than the fourth circumference, wherein the fourth circumference is larger than the third circumference, wherein the third circumference is larger than the second circumference, wherein the second circumference is larger than the first circumference.

Example 14g: The apparatus of example 11g, wherein the first non-planar stack of materials and the second non-planar stack of materials are cylindrical in shape, or wherein the first non-planar stack of materials and the second non-planar stack of materials are square or square-like in shape.

Example 15g: The apparatus of example 11g, wherein an effective capacitance of the second non-planar stack of materials is substantially equal to a linear component of a capacitance of the first non-planar stack of materials.

Example 16g: The apparatus of example 11g comprising circuitry to apply a voltage on the second plate-line, wherein the voltage on the second plate-line is opposite to a voltage applied to the first non-planar stack of materials via the first plate-line to compensate for dielectric capacitor dependent charge.

Example 17g: The apparatus of example 11g, wherein the second plate-line has a voltage complementary to a voltage on the first plate-line.

Example 18g: A system comprising: a memory to store one or more instructions on the memory; a processor circuitry to execute the one or more instructions; and a communication interface to allow the processor circuitry to communicate with another device, wherein the memory includes an apparatus according to any one of examples 1g to 10g.

Example 19g: A system comprising: a memory to store one or more instructions on the memory; a processor circuitry to execute the one or more instructions; and a communication interface to allow the processor circuitry to communicate with another device, wherein the memory includes an apparatus according to any one of examples 11g to 17g.

Example 1h: An apparatus comprising: a first metal layer extending along an x-plane; a second metal layer extending along the x-plane, wherein the second metal layer is above the first metal layer; a first via extending along a y-plane, wherein the y-plane is orthogonal to the x-plane, wherein the first via couples the first metal layer with the second metal layer; a second via extending along the y-plane, wherein the second via couples the second metal layer, wherein the second via is above the first via; a first pedestal on the first metal layer, wherein the first pedestal is laterally offset from the first via; a second pedestal on the second metal layer, wherein the second pedestal is laterally offset from the second via; a first plate-line extending along a z-plane, wherein the z-plane is orthogonal to the x-plane and the y-plane; a second plate-line extending along the z-plane; a first planar stack of materials including a non-linear polar material, wherein the first planar stack of materials has a top electrode and a bottom electrode, wherein the non-linear polar material is between the top electrode and the bottom electrode, wherein the bottom electrode is on the first pedestal, wherein the first plate-line is on the top electrode; and a second planar stack of materials including a linear dielectric material, wherein the second planar stack of materials has a top electrode and a bottom electrode, wherein the linear dielectric material is between the top electrode of the second planar stack of materials and the bottom electrode and the second planar stack of materials, wherein the bottom electrode is on the second pedestal, wherein the second plate-line on the top electrode.

Example 2h: The apparatus of example 1h, wherein the first plate-line and the second plate-line are parallel to a word-line or a bit-line.

Example 3h: The apparatus of example 1h, wherein an effective capacitance of the second planar stack of materials is substantially equal to a linear component of a capacitance of the first planar stack of materials.

Example 4h: The apparatus of example 1h comprising circuitry to apply a voltage on the second plate-line, wherein the voltage on the second plate-line is opposite to a voltage applied to the first planar stack of materials via the first plate-line to compensate for dielectric capacitor dependent charge.

Example 5h: The apparatus of example 1h, wherein the second plate-line has a voltage complementary to a voltage on the first plate-line.

Example 6h: The apparatus of example 1h, wherein the second planar stack of materials includes: a first layer coupled to the bottom electrode, wherein the first layer comprises metal; a second layer comprising the linear dielectric material, wherein the second layer on the first layer; and a third layer on the second layer, wherein the third layer comprises metal and is coupled to the top electrode of the second planar stack of materials.

Example 7h: The apparatus of example 1h, wherein the non-linear polar material includes one of: ferroelectric material, paraelectric material, or non-linear dielectric.

Example 8h: A apparatus comprising: a transistor, the transistor having a source region and a drain region, and a gate; a first via is coupled to the source region; a second via is coupled to the drain region; a first metal layer over the first via, the first metal layer extending along an x-plane; a second etch stop layer over the first metal layer; a third via over the first metal layer by etching through the second etch stop layer, the third via in direct connection to the first metal layer; a second metal layer extending along the x-plane, wherein the second metal layer is above the first metal layer, wherein the second metal layer couples the third via; an interlayer dielectric between the first metal layer and the second metal layer; a first pedestal filled with metal, wherein the first pedestal is coupled to the second metal layer; a first plurality of layers to form a first planar capacitor, wherein the first plurality of layers includes non-linear polar material, wherein a first layer of the first plurality of layers is in contact with a top portion of the first pedestal; a fourth via in direct connection to the second metal layer; a third metal layer over the fourth via, wherein the first plurality of layers is between the second metal layer and the third metal layer; a second pedestal filled with metal, wherein the second pedestal is coupled to the third metal layer; and a second plurality of layers to form a second planar capacitor, wherein the second plurality of layers includes a linear dielectric material, wherein a first layer of the second plurality of layers is in direct contact with a top portion of the second pedestal.

Example 9h: The apparatus of example 8h comprising a fifth via in direct connection to the third metal layer, wherein the fifth via is substantially above the fourth via.

Example 10h: The apparatus of example 9h, wherein a last layer of the first plurality of layers is coupled to a first plate-line, wherein a last layer of the second plurality of layers is coupled to a second plate-line, wherein the first plate-line and the second plate-line are parallel to a word-line or a bit-line.

Example 11h: The apparatus of example 8h, wherein an effective capacitance of the second plurality of layers is substantially equal to a linear component of a capacitance of the first plurality of layers.

Example 12h: The apparatus of example 10h comprising circuitry to apply a voltage on the second plate-line, wherein the voltage on the second plate-line is opposite to a voltage applied to the first plurality of layers via the first plate-line to compensate for dielectric capacitor dependent charge.

Example 13h: The apparatus of example 10h, wherein the second plate-line has a voltage complementary to a voltage on the first plate-line.

Example 14h: The apparatus of example 10h, wherein the second plurality of layers includes: the first layer coupled to the top portion of the first pedestal, wherein the first layer comprises metal; a second layer comprising the linear dielectric material, wherein the second layer on the first layer; and the last layer of the second plurality of layers on the second layer, wherein the last layer comprises metal and is coupled to the second plate-line of the second plurality of layers.

Example 15h: The apparatus of example 8h, wherein the non-linear polar material includes one of: ferroelectric material, paraelectric material, or non-linear dielectric.

Example 16h: A system comprising: a memory to store one or more instructions on the memory; a processor circuitry to execute the one or more instructions; and a communication interface to allow the processor circuitry to communicate with another device, wherein the memory includes an apparatus according to examples 1h to 7h.

Example 17h: A system comprising: a memory to store one or more instructions on the memory; a processor circuitry to execute the one or more instructions; and a communication interface to allow the processor circuitry to communicate with another device, wherein the memory includes an apparatus according to examples 8h to 16h.

Example 1i: An apparatus comprising: a first bit-cell comprising a first transistor coupled to a first bit-line and controllable by a word-line, wherein the first transistor is coupled to: a first capacitor comprising a non-linear polar material; a second capacitor comprising the non-linear polar material, and a third capacitor comprising linear a linear dielectric material, wherein the first capacitor is coupled to a first plate-line, wherein the second capacitor is coupled to a second plate-line, wherein the third capacitor is coupled to a third plate-line; and a second bit-cell comprising a second transistor coupled to a second bit-line and controllable by the word-line, wherein the second transistor is coupled to: a fourth capacitor comprising the non-linear polar material, a fifth capacitor comprising the non-linear polar material, and a sixth capacitor comprising the linear dielectric material, wherein the fourth capacitor is coupled to a fourth plate-line, wherein the fifth capacitor is coupled to a fifth plate-line, wherein the sixth capacitor is coupled to a sixth plate-line.

Example 2i: The apparatus of example 1i, wherein the first plate-line and the second plate-line are parallel to the first bit-line or the word-line.

Example 3i: The apparatus of example 1i, wherein an effective capacitance of the third capacitor is substantially equal to a linear component of a capacitance of the first capacitor or the second capacitor.

Example 4i: The apparatus of example 1i, wherein an effective capacitance of the sixth capacitor is substantially equal to a linear component of a capacitance of the fourth capacitor or the fifth capacitor.

Example 5i: The apparatus of example 1i comprising one or more circuitries to apply a voltage on the third plate-line, wherein the voltage on the third plate-line is opposite to a voltage applied to the fourth capacitor via the fourth plate-line to compensate for dielectric capacitor dependent charge.

Example 6i: The apparatus of example 1i, wherein the sixth plate-line has a voltage complementary to a voltage on the first plate-line.

Example 7i: The apparatus of example 1i, wherein the first capacitor, the second capacitor, the third capacitor, the fourth capacitor, the fifth capacitor, and the sixth capacitor are pillar capacitors or planar capacitors.

Example 8i: The apparatus of example 1i, wherein the first capacitor, the second capacitor, and the third capacitor are vertically stacked in a first stack, wherein the fourth capacitor, the fifth capacitor, and the sixth capacitor are vertically stacked in a second stack.

Example 9i: The apparatus of example 1i, wherein the non-linear polar material includes one of: ferroelectric material, paraelectric material, or non-linear dielectric.

Example 10i: An apparatus comprising: an array of bit-cells organized in rows and columns, wherein an individual bit-cell includes a differential bit-cell, wherein the differential bit-cell includes four capacitors with non-linear polar material, and two capacitors with linear dielectric material, wherein the four capacitors with non-linear polar material are coupled to a first individual plate-lines, respectively, wherein the two capacitors with linear dielectric are coupled to second individual plate-lines; and a driver circuitry to drive a first voltage on a first individual plate-line, of the first individual plate-lines, coupled to a first capacitor of the four capacitors, wherein the driver circuitry is to drive a second voltage on a second individual plate-line, of the second individual plate-lines, coupled to a first capacitor of the two capacitors, wherein the first voltage is an inverse of the second voltage.

Example 11i: The apparatus of example 10i, wherein an effective capacitance of an individual first capacitor of the two capacitors with linear dielectric is substantially equal to a linear component of a capacitance of an individual capacitor of the four capacitors with non-linear polar material.

Example 12i: The apparatus of example 10i, wherein the two capacitors with linear dielectric and the four capacitors with non-linear polar material are planar capacitors or pillar capacitors.

Example 13i: The apparatus of example 10i, wherein the two capacitors with linear dielectric and the four capacitors with non-linear polar material are vertically stacked such that a first capacitor of the two capacitors and two first capacitors of the four capacitors are in a first vertical stack, and a second capacitor of the two capacitors and two second capacitors of the four capacitors are in a second vertical stack.

Example 14i: The apparatus of example 10i, wherein the non-linear polar material includes one of: ferroelectric material, paraelectric material, or non-linear dielectric.

Example 16i: The apparatus of example 10i, wherein the first individual plate-line and the second individual plate-line are parallel to a bit-line or a word-line.

Example 17i: A system comprising: a processor circuitry to execute one or more instructions; a memory coupled to the processor circuitry; and a communication interface to allow the processor circuitry to communicate with another device, wherein the memory includes a differential bit-cell which comprises an apparatus according to any one of examples 1i to 9i.

Example 17i: A system comprising: a processor circuitry to execute one or more instructions; a memory coupled to the processor circuitry; and a communication interface to allow the processor circuitry to communicate with another device, wherein the memory includes a differential bit-cell which comprises an apparatus according to any one of examples 10i to 17i.

Example 1j: An apparatus comprising: a first bit-cell comprising: a first transistor coupled to a first bit-line and controllable by a word-line; and a second transistor coupled to a first select-line and the first transistor, wherein the first transistor and the second transistor are coupled to: a first capacitor comprising a non-linear polar material, a second capacitor comprising the non-linear polar material, and a third capacitor comprising linear a linear dielectric material, wherein the first capacitor is coupled to a first plate-line, wherein the second capacitor is coupled to a second plate-line, wherein the third capacitor is coupled to a third plate-line; and a second bit-cell comprising: a third transistor coupled to a second bit-line and controllable by the word-line; a fourth transistor coupled to a second select-line and the third transistor, wherein the third transistor and the fourth transistor are coupled to: a fourth capacitor comprising the non-linear polar material, a fifth capacitor comprising the non-linear polar material, and a sixth capacitor comprising the linear dielectric material, wherein the fourth capacitor is coupled to a fourth plate-line, wherein the fifth capacitor is coupled to a fifth plate-line, wherein the sixth capacitor is coupled to a sixth plate-line.

Example 2j: The apparatus of example 1j, wherein the first plate-line and the second plate-line are parallel to the first bit-line or the word-line.

Example 3j: The apparatus of example 1j, wherein an effective capacitance of the third capacitor is substantially equal to a linear component of a capacitance of the first capacitor or the second capacitor.

Example 4j: The apparatus of example 1j, wherein an effective capacitance of the sixth capacitor is substantially equal to a linear component of a capacitance of the fourth capacitor or the fifth capacitor.

Example 5j: The apparatus of example 1j comprising one or more circuitries to apply a voltage on the third plate-line, wherein the voltage on the third plate-line is opposite to a voltage applied to the first capacitor via the first plate-line to compensate for dielectric capacitor dependent charge.

Example 6j: The apparatus of example 1j, wherein the sixth plate-line has a voltage complementary to a voltage on the fourth plate-line.

Example 7j: The apparatus of example 1j, wherein the first capacitor, the second capacitor, the third capacitor, the fourth capacitor, the fifth capacitor, and the sixth capacitor are pillar capacitors or planar capacitors.

Example 8j: The apparatus of example 1j, wherein the first capacitor, the second capacitor, and the third capacitor are vertically stacked in a first stack, wherein the fourth capacitor, the fifth capacitor, and the sixth capacitor are vertically stacked in a second stack.

Example 9j: The apparatus of example 1j, wherein the non-linear polar material includes one of: ferroelectric material, paraelectric material, or non-linear dielectric.

Example 10j: The apparatus of example 1j, wherein the second transistor is coupled to a first bias, wherein the fourth transistor is coupled to a second bias.

Example 11j: An apparatus comprising: an array of bit-cells organized in rows and columns, wherein an individual bit-cell includes a differential bit-cell, wherein the differential bit-cell includes: a first multi-element gain bit-cell having a first plurality of capacitors with non-linear polar material, and a first capacitor with linear dielectric material; and a second multi-element gain bit-cell having a second plurality of capacitors with non-linear polar material, and a second capacitor with linear dielectric material; and a driver circuitry to drive a first voltage on a first individual plate-line coupled to a capacitor of the first plurality of capacitors, wherein the driver circuitry is to drive a second voltage on a second individual plate-line coupled to the first capacitor, wherein the first voltage is an inverse of the second voltage.

Example 12j: The apparatus of example 11j, wherein the driver circuitry is to drive a third voltage on a third individual plate-line coupled to a capacitor of the second plurality of capacitors, wherein the driver circuitry is to drive a fourth voltage on a fourth individual plate-line coupled to the second capacitor, wherein the third voltage is an inverse of the fourth voltage.

Example 13j: The apparatus of example 12j, wherein the first individual plate-line and the second individual plate-line are parallel to a bit-line or a word-line.

Example 14j: The apparatus of example 11j, wherein the first capacitor and the second capacitor with linear dielectric and the first plurality of capacitors with non-linear polar material and the second plurality of capacitors are planar capacitors or pillar capacitors.

Example 15j: The apparatus of example 11j, wherein the first capacitor with linear dielectric and the first plurality of capacitors with non-linear polar material are vertically stacked in a first vertical stack, and the second capacitor with linear dielectric and the second plurality of capacitors with non-linear polar material are vertically stacked in a second vertical stack.

Example 17j: The apparatus of example 11j, wherein the non-linear polar material includes one of: ferroelectric material, paraelectric material, or non-linear dielectric.

Example 18j: A system comprising: a processor circuitry to execute one or more instructions; a memory coupled to the processor circuitry; and a communication interface to allow the processor circuitry to communicate with another device, wherein the memory includes a differential bit-cell which comprises an apparatus according to any one of examples 1j to 10j.

Example 18j: A system comprising: a processor circuitry to execute one or more instructions; a memory coupled to the processor circuitry; and a communication interface to allow the processor circuitry to communicate with another device, wherein the memory includes a differential bit-cell which comprises an apparatus according to any one of examples 11j to 17j.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
a node;
a first capacitor comprising non-linear polar material, the first capacitor having a first terminal coupled to the node and a second terminal coupled to a first plate-line;
a second capacitor comprising non-linear polar material, the second capacitor having a first terminal coupled to the node and a second terminal coupled to a second plate-line;
a first transistor coupled to the node and a bit-line, wherein the first transistor is controllable by a word-line;
a second transistor coupled to the node and a sense-line; and
a third capacitor coupled to the node and a third plate-line, wherein the third capacitor comprises a linear dielectric.

2. The apparatus of claim 1, wherein the second transistor is coupled to the node via a gate terminal of the second transistor.

3. The apparatus of claim 1, wherein the second transistor is coupled to a bias voltage.

4. The apparatus of claim 1, wherein the first plate-line, the second plate-line, and the third plate-line are parallel to the word-line.

5. The apparatus of claim 1, wherein an effective capacitance of the third capacitor is substantially equal to a linear component of a capacitance of the first capacitor or the second capacitor.

6. The apparatus of claim 1 comprising one or more circuitries to apply a voltage on the third plate-line, wherein the voltage on the third plate-line is opposite to a voltage applied to the first capacitor via the first plate-line to compensate for dielectric capacitor dependent charge.

7. The apparatus of claim 1, wherein the third plate-line has a voltage complementary to a voltage on the first plate-line.

8. The apparatus of claim 1, wherein the first capacitor, the second capacitor, and the third capacitor are pillar capacitors.

9. The apparatus of claim 1, wherein the first capacitor, the second capacitor, and the third capacitor are planar capacitors.

10. The apparatus of claim 1, wherein the first capacitor, the second capacitor, and the third capacitor are vertically stacked.

11. The apparatus of claim 1, wherein the non-linear polar material includes one of: ferroelectric material, paraelectric material, or non-linear dielectric.

12. An apparatus comprising:
an array of bit-cells organized in rows and columns, wherein an individual bit-cell includes:
a node;
a first capacitor comprising non-linear polar material, the first capacitor having a first terminal coupled to the node and a second terminal coupled to a first plate-line;
a second capacitor comprising non-linear polar material, the second capacitor having a first terminal coupled to the node and a second terminal coupled to a second plate-line;
a first transistor coupled to the node and a bit-line, wherein the first transistor is controllable by a word-line;
a second transistor coupled to the node and a sense-line; and
a third capacitor coupled to the node and a third plate-line, wherein the third capacitor comprises a linear dielectric; and
a driver circuitry to drive a first voltage on the first plate-line and to drive a second voltage on the third plate-line, wherein the first voltage is an inverse of the second voltage.

13. The apparatus of claim 12, wherein an effective capacitance of the third capacitor is substantially equal to a linear component of a capacitance of the first capacitor.

14. The apparatus of claim 12, wherein the first capacitor, the second capacitor, and the third capacitor are planar capacitors.

15. The apparatus of claim 12, wherein the first capacitor, the second capacitor, and the third capacitor are vertically stacked.

16. The apparatus of claim 12, wherein the non-linear polar material includes one of: ferroelectric material, paraelectric material, or non-linear dielectric.

17. A system comprising:
a processor circuitry to execute one or more instructions;
a memory coupled to the processor circuitry; and
a communication interface to allow the processor circuitry to communicate with another device, wherein the memory includes a bit-cell which comprises:
a node;
a first capacitor comprising non-linear polar material, the first capacitor having a first terminal coupled to the node and a second terminal coupled to a first plate-line;
a second capacitor comprising non-linear polar material, the second capacitor having a first terminal coupled to the node and a second terminal coupled to a second plate-line;
a first transistor coupled to the node and a bit-line, wherein the first transistor is controllable by a word-line;
a second transistor coupled to the node and a sense-line; and
a third capacitor coupled to the node and a third plate-line, wherein the third capacitor comprises a linear dielectric.

18. The system of claim 17, wherein an effective capacitance of the third capacitor is substantially equal to a linear component of a capacitance of the first capacitor or the second capacitor.

19. The system of claim 17 comprising one or more circuitries to apply a voltage on the third plate-line, wherein the voltage on the third plate-line is opposite to a voltage applied to the first capacitor via the first plate-line to compensate for dielectric capacitor dependent charge.

20. The system of claim 17, wherein the third plate-line has a voltage complementary to a voltage on the first plate-line.

* * * * *